(12) United States Patent
Yeom et al.

(10) Patent No.: US 12,349,404 B2
(45) Date of Patent: Jul. 1, 2025

(54) SEMICONDUCTOR DEVICE AND METHOD OF FABRICATING THE SAME

(71) Applicant: Samsung Electronics Co., Ltd., Suwon-si (KR)

(72) Inventors: Donghyuk Yeom, Seoul (KR); Kwan Heum Lee, Suwon-si (KR); Seonghwa Park, Seoul (KR); Sechan Lim, Boryeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 536 days.

(21) Appl. No.: 17/673,880

(22) Filed: Feb. 17, 2022

(65) Prior Publication Data

US 2023/0019278 A1 Jan. 19, 2023

(30) Foreign Application Priority Data

Jul. 16, 2021 (KR) .................. 10-2021-0093319

(51) Int. Cl.
*H10D 30/67* (2025.01)
*H01L 21/02* (2006.01)
(Continued)

(52) U.S. Cl.
CPC ..... *H10D 30/6713* (2025.01); *H01L 21/0259* (2013.01); *H10D 30/031* (2025.01);
(Continued)

(58) Field of Classification Search
CPC .......... H01L 29/0669; H01L 29/42392; H01L 29/785; H01L 29/0847; H01L 29/1054; H01L 29/161; H01L 29/66439; H01L 29/66795; H01L 29/775; H01L 29/0673; H01L 21/02532; H01L 21/823468; H01L 21/823864; B82Y 10/00; H10D 64/021; H10D 64/675; H10D 64/679; H10D 84/0184; H10D 84/0147; H10D 84/0144; H10D 84/832–836; H10D 62/118–123; H10D 30/019–0194; H10D 30/501–506;
(Continued)

(56) References Cited

U.S. PATENT DOCUMENTS 9,093,557 B2  7/2015  Bouche et al.
9,984,925 B2  5/2018  Jeon et al.
(Continued)

*Primary Examiner* — Dale E Page
*Assistant Examiner* — Douglas Yap
(74) *Attorney, Agent, or Firm* — Muir Patent Law, PLLC

(57) ABSTRACT

Disclosed are a semiconductor device and a method of fabricating the same. The semiconductor device includes an active pattern on a substrate, a device isolation layer provided on the substrate to define the active pattern, a pair of source/drain patterns on the active pattern and a channel pattern therebetween, the channel pattern including semiconductor patterns which are stacked and are spaced apart from each other, a gate electrode crossing the channel pattern, and a gate spacer on a side surface of the gate electrode. The gate spacer located on the device isolation layer includes an upper portion with a first thickness and a lower portion with a second thickness. The second thickness
(Continued)

is larger than the first thickness, and the lower portion of the gate spacer is located at a level lower than the uppermost one of the semiconductor patterns.

20 Claims, 65 Drawing Sheets

(51) Int. Cl.
*H10D 30/01* (2025.01)
*H10D 62/10* (2025.01)
*H10D 64/01* (2025.01)
*H10D 84/01* (2025.01)
*H10D 84/03* (2025.01)
*H10D 84/85* (2025.01)

(52) U.S. Cl.
CPC ..... *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/0184* (2025.01); *H10D 84/038* (2025.01); *H10D 84/85* (2025.01)

(58) Field of Classification Search
CPC ....... H10D 30/0195–0197; H10D 30/507–509
See application file for complete search history.

(56) References Cited

U.S. PATENT DOCUMENTS

| | | | |
|---|---|---|---|
| 10,192,973 B2 | 1/2019 | Park et al. | |
| 10,566,445 B2 | 2/2020 | Bi et al. | |
| 10,679,906 B2 | 6/2020 | Cheng et al. | |
| 10,692,781 B2 | 6/2020 | Kim et al. | |
| 10,978,486 B2 | 4/2021 | Kim et al. | |
| 2014/0217421 A1* | 8/2014 | Zhu | H01L 29/66636 257/77 |
| 2017/0194455 A1* | 7/2017 | Fan | H01L 21/823468 |
| 2019/0027579 A1* | 1/2019 | Tsai | H01L 29/66553 |
| 2019/0067451 A1* | 2/2019 | Ching | H01L 29/66621 |
| 2019/0148511 A1* | 5/2019 | Lin | H01L 29/42364 257/401 |
| 2020/0035679 A1* | 1/2020 | Ko | H01L 29/66553 |
| 2021/0020509 A1 | 1/2021 | Gwak et al. | |
| 2021/0043763 A1* | 2/2021 | Jung | H01L 27/0886 |
| 2021/0305420 A1* | 9/2021 | Frougier | H01L 29/66795 |
| 2021/0408266 A1* | 12/2021 | Sie | H01L 21/823864 |
| 2022/0336625 A1* | 10/2022 | Lin | H01L 29/4991 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0093319, filed on Jul. 16, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

An embodiment of the inventive concept provides a semiconductor device with improved electric and reliability characteristics.

An embodiment of the inventive concept provides a method of fabricating a semiconductor device with improved electric and reliability characteristics.

According to an embodiment of the inventive concept, a semiconductor device may include an active pattern on a substrate, a device isolation layer provided on the substrate to define the active pattern, a pair of source/drain patterns on the active pattern and a channel pattern therebetween, the channel pattern including semiconductor patterns which are stacked and are spaced apart from each other, a gate electrode crossing the channel pattern, and a gate spacer on a side surface of the gate electrode. The gate spacer located on the device isolation layer may include an upper portion with a first thickness and a lower portion with a second thickness. The second thickness may be larger than the first thickness, and the lower portion of the gate spacer may be located at a level lower than the uppermost one of the semiconductor patterns.

According to an embodiment of the inventive concept, a semiconductor device may include a substrate including a PMOSFET region and an NMOSFET region, a first source/drain pattern provided on the PMOSFET region and a first channel pattern connected to the first source/drain pattern, a second source/drain pattern provided on the NMOSFET region and a second channel pattern connected to the second source/drain pattern, each of the first and second channel patterns including semiconductor patterns which are stacked and are spaced apart from each other, a gate electrode crossing the first and second channel patterns, and a gate spacer on a side surface of the gate electrode. The gate spacer may include a first gate spacer on the PMOSFET region and a second gate spacer on the NMOSFET region. A thickness of the first gate spacer on the first source/drain pattern may be larger than a thickness of the second gate spacer on the second source/drain pattern. A thickness of the second gate spacer on the device isolation layer may decrease in a direction from its lower portion toward its upper portion.

According to an embodiment of the inventive concept, a method of fabricating a semiconductor device may include forming a stacking pattern on an active pattern of a substrate, the stacking pattern including sacrificial layers and active layers which are alternately stacked, forming a sacrificial pattern to cross the stacking pattern, forming a gate spacer on a side surface of the sacrificial pattern, selectively increasing a thickness of a lower portion of the gate spacer, the lower portion of the gate spacer being located at a level lower than the uppermost one of the active layers, etching a portion of the stacking pattern using an upper portion of the gate spacer as an etch mask to form a recess, forming a source/drain pattern in the recess, and replacing the sacrificial pattern and the sacrificial layers with a gate electrode.

DETAILED DESCRIPTION

Figure 1:
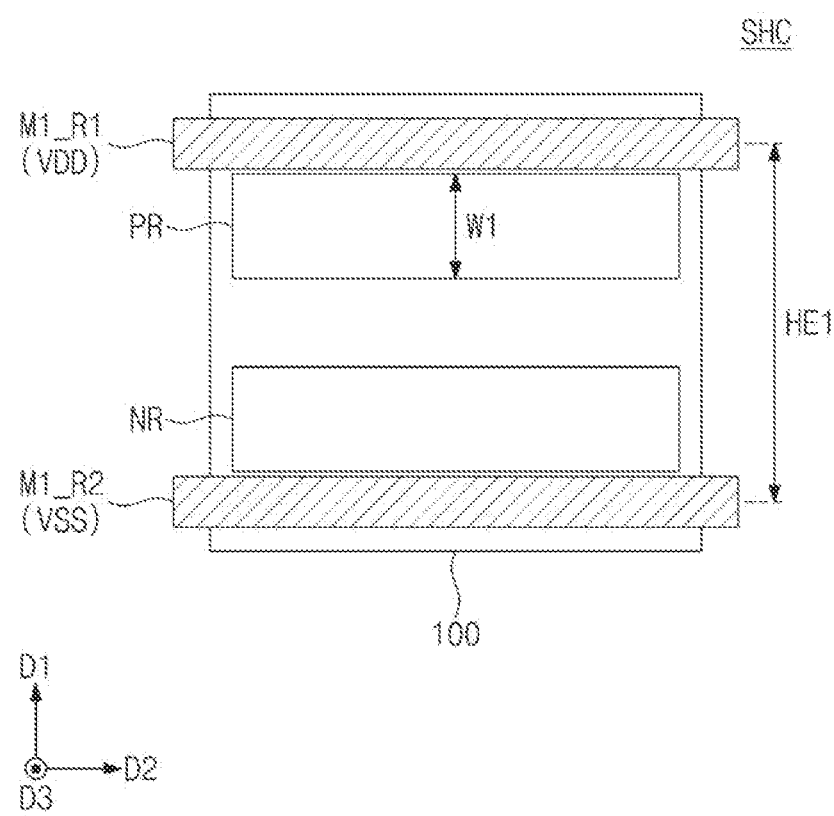
FIGS. 1 to 3 are conceptual diagrams illustrating logic cells in a semiconductor device, according to an example embodiment of the inventive concept.

Example embodiments of the inventive concepts will now be described more fully with reference to the accompanying drawings, in which example embodiments are shown. In the drawings, like numerals refer to like elements throughout.

Figure 2:
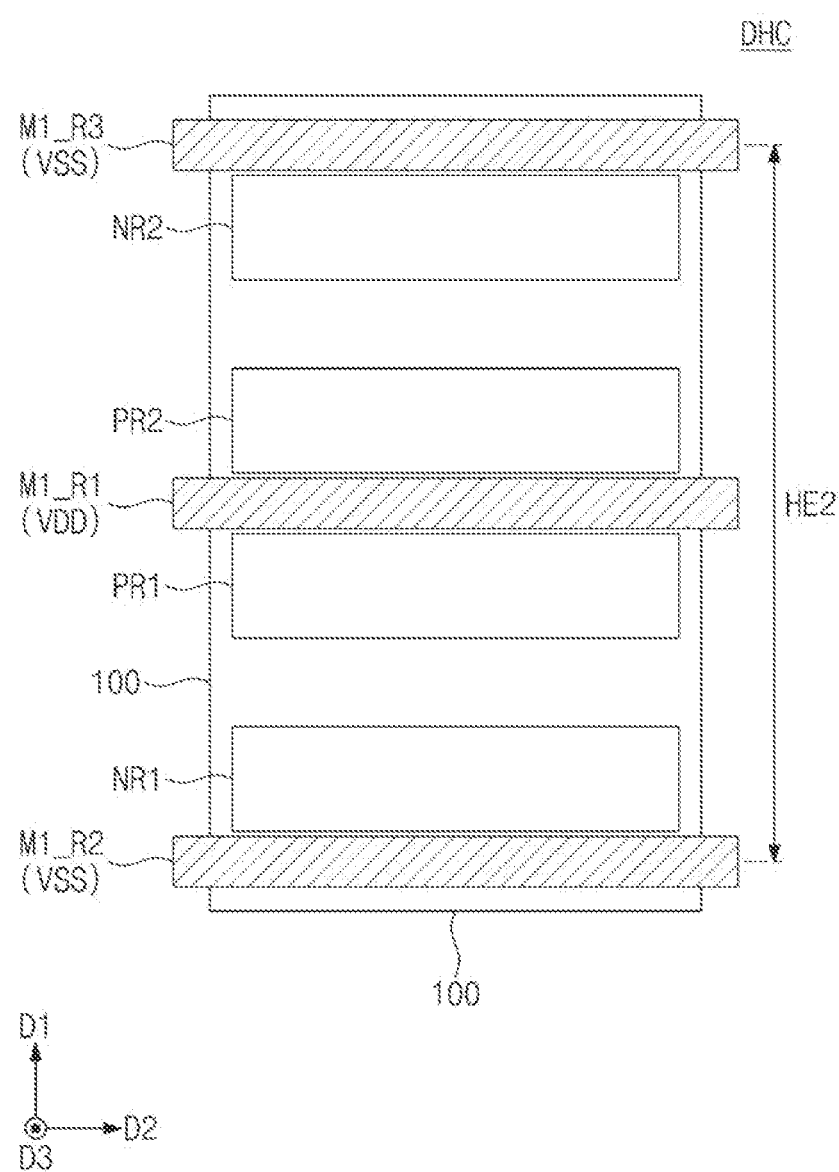
Figure 3:
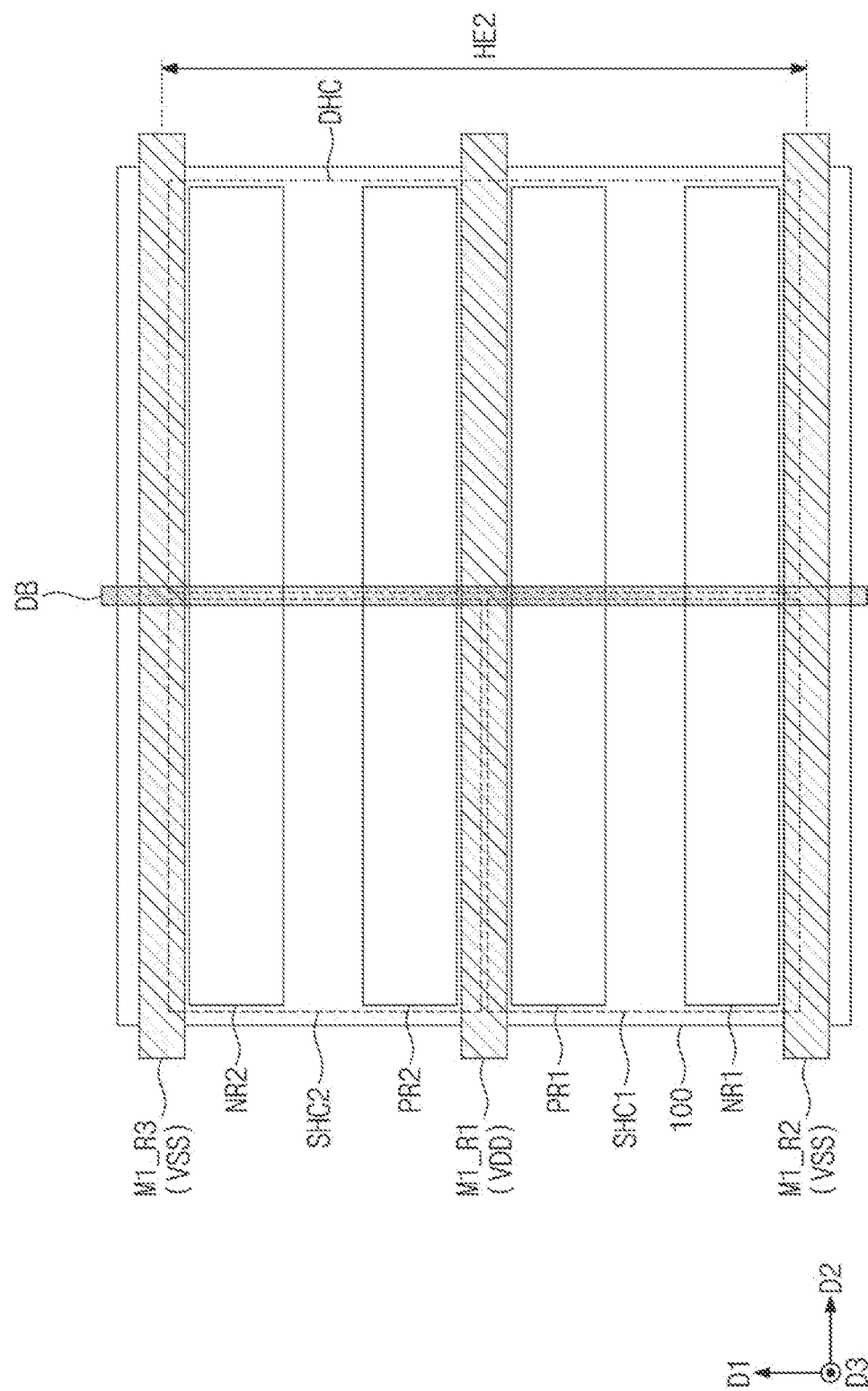

FIGS. 1 to 3 are conceptual diagrams illustrating logic cells of a semiconductor device according to an example embodiment of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one PMOSFET region PR and one NMOSFET region NR. For example, the single height cell SHC may have a CMOS structure provided between the first and second power lines M1_R1 and M1_R2.

Each of the PMOSFET and NMOSFET regions PR and NR may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. For example, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
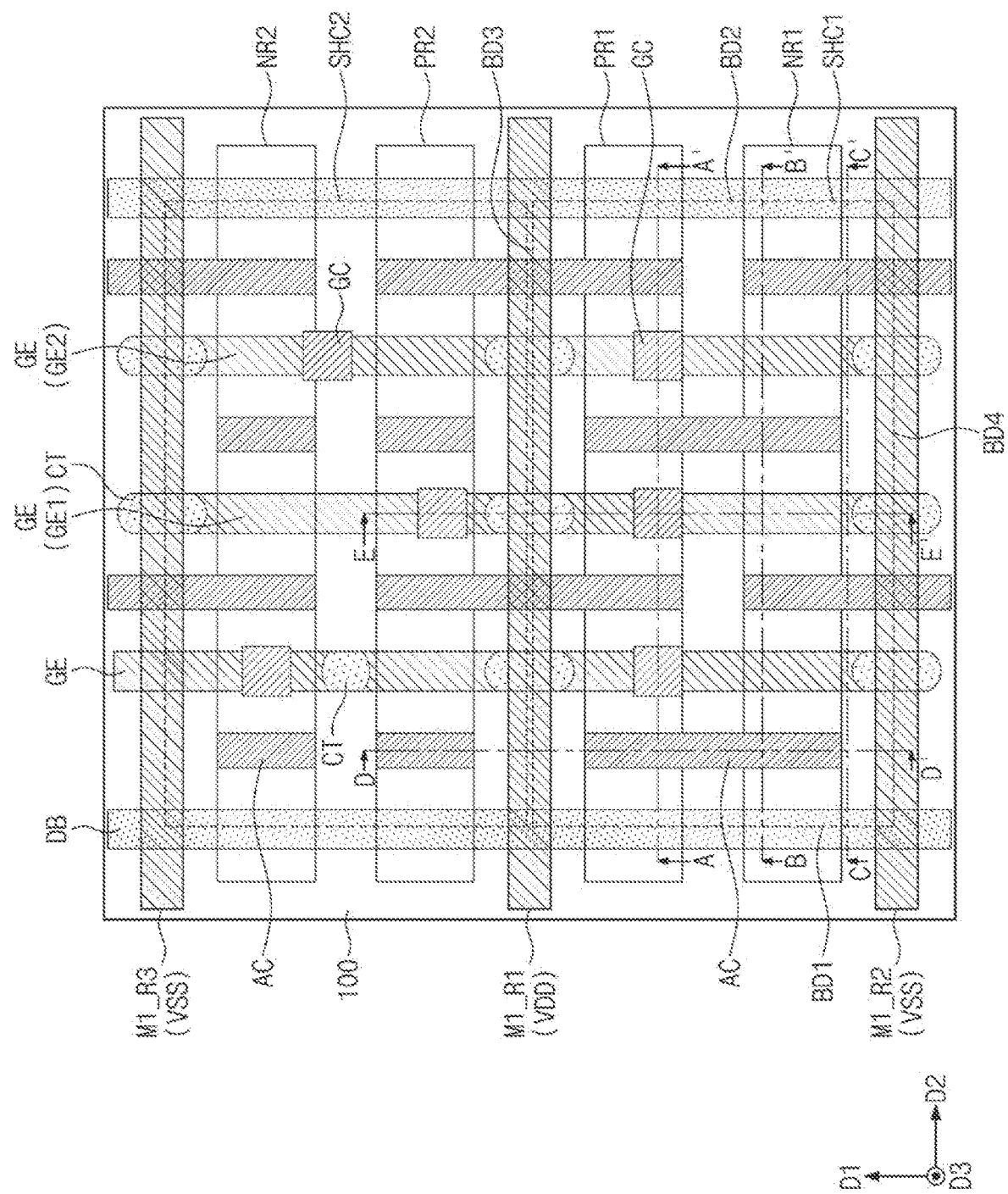
FIG. 4 is a plan view illustrating a semiconductor device, according to an example embodiment of the inventive concept.
Figure 5A:
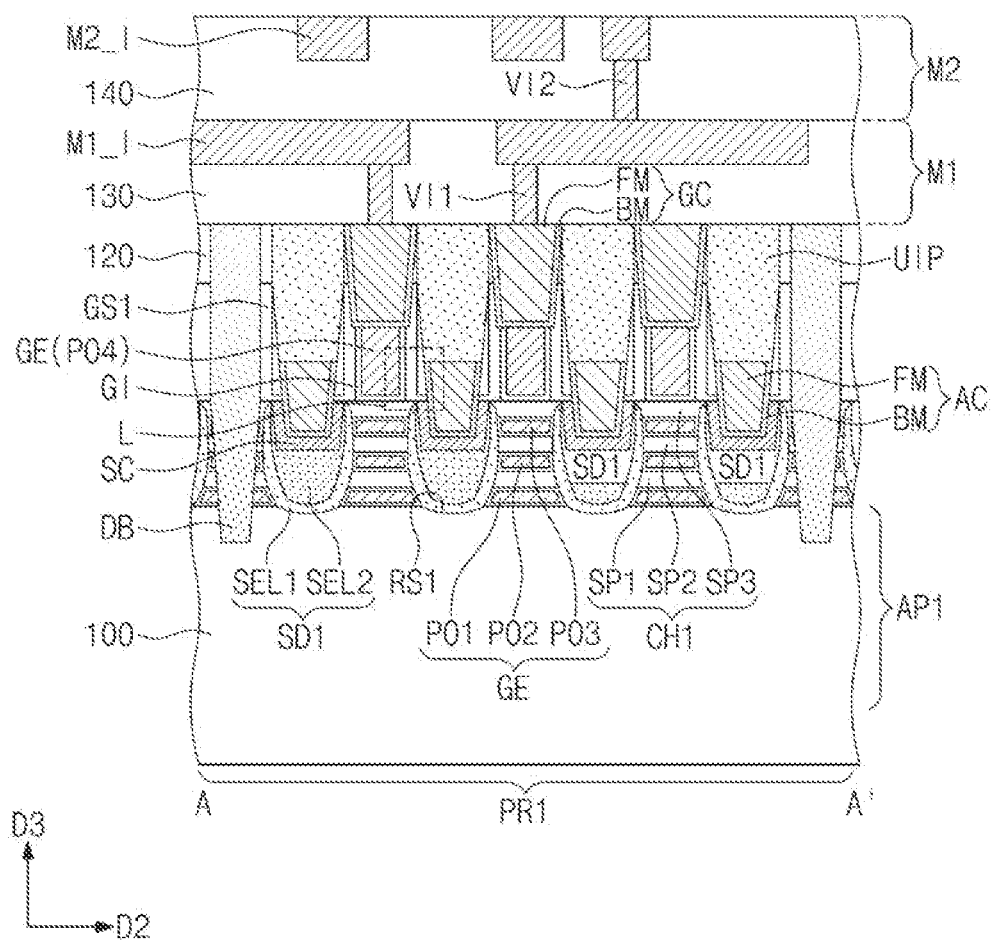
FIGS. 5A to 5E are sectional views taken along lines A-A', B-B', C-C', D-D', and E-E' of FIG. 4, respectively.
Figure 5B:
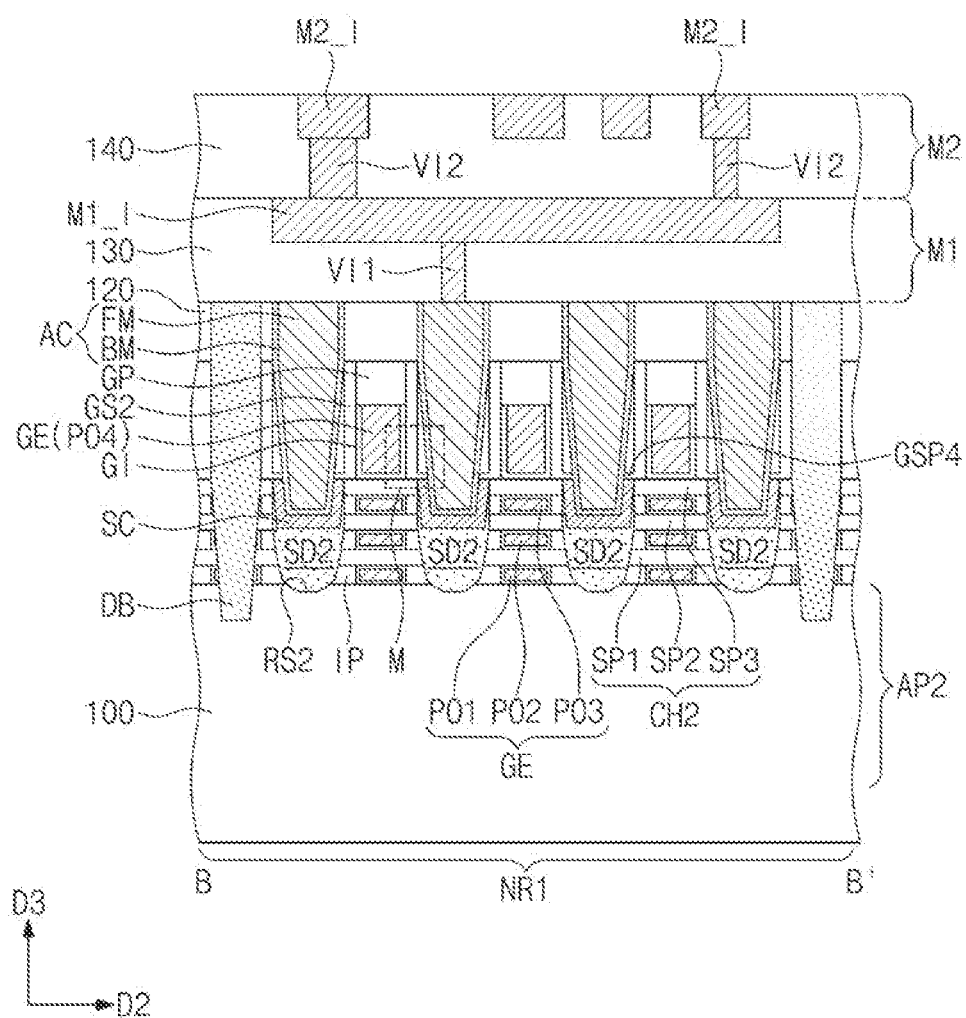
Figure 5C:
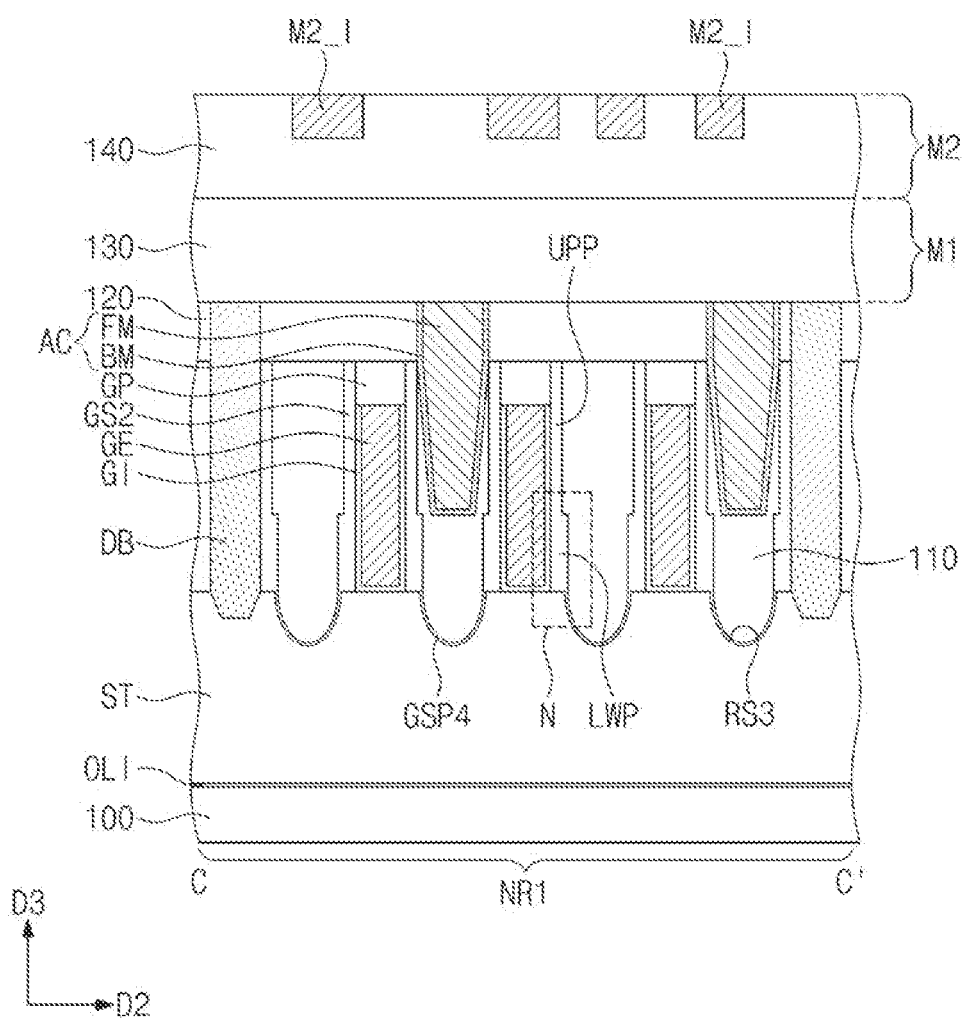

FIG. 4 is a plan view illustrating a semiconductor device according to an example embodiment of the inventive concept. FIGS. 5A to 5E are sectional views taken along lines A-A', B-B', C-C', D-D', and E-E' of FIG. 4, respectively. FIG. 6A is an enlarged sectional view illustrating a portion 1' of FIG. 5A, FIG. 6B is an enlarged sectional view illustrating a portion 'M' of FIG. 5B, and FIG. 6C is an enlarged sectional view illustrating a portion 'N' of FIG. 5C. FIGS. 4 and 5A to 5E illustrate an example of a detailed structure of the first and second single height cells SHC1 and SHC2 of FIG. 3.

Referring to FIGS. 4 and 5A to 5E, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon, germanium, silicon-germanium, a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended lengthwise in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may be extended lengthwise in a second direction D2. Each of the first and second active patterns AP1 and AP2 may be a vertically-protruding portion of the substrate 100. For example, each of the first and second active patterns AP1 and AP2 may protrude from the substrate 100 in the third direction D3.

A device isolation layer ST may be provided to fill the trench TR. A device isolation layer ST may include a silicon oxide layer. The device isolation layer ST may not cover first and second channel patterns CH1 and CH2 to be described below.

A liner layer OLI may be interposed between the first and second active patterns AP1 and AP2 and the device isolation layer ST. The liner layer OLI may directly cover a side surface of each of the first and second active patterns AP1 and AP2, contacting the side surfaces of the first and second active patterns AP1 and AP2. For example, the liner layer OLI may directly cover a side surface of the trench TR. The liner layer OLI may directly cover a bottom of the trench TR. As used herein, the term "contact" refers to a direct connection (i.e., touching) unless the context indicates otherwise.

The liner layer OLI may include at least one of, for example, a silicon oxide layer, a silicon nitride layer, or a combination thereof. In an embodiment, the liner layer OLI may be formed of or may include the same material as the device isolation layer ST and in this case, there may be no observable interface between the liner layer OLI and the device isolation layer ST.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or may include at least one of silicon (Si), germanium (Ge), or silicon-germanium (SiGe). In an embodiment, each of the first to third semiconductor patterns SP1, SP2, and SP3 may be formed of or may include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. For example, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. As an example, a top surface of each of the first and second source/drain patterns SD1 and SD2 may be located at substantially the same level as a top surface of the third semiconductor pattern SP3. Alternatively, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or may include the same semiconductor element (e.g., Si) as the substrate 100.

Each of the first source/drain patterns SD1 may include a first semiconductor layer SEL1 and a second semiconductor layer SEL2, which are sequentially stacked. A sectional shape of the first source/drain pattern SD1 in the second direction D2 will be described in more detail with reference to FIG. 5A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SELL A volume of the second semiconductor layer SEL2 may be larger than a volume of the first semiconductor layer SELL For example, a ratio of the volume of the second semiconductor layer SEL2 to a total volume of the first source/drain pattern SD1 may be greater than a ratio of the volume of the first semiconductor layer SEL1 to the total volume of the first source/drain pattern SD1.

Each of the first and second semiconductor layers SEL1 and SEL2 may be formed of or may include silicon-germanium (SiGe). In detail, the first semiconductor layer SEL1 may be provided to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may easily occur on the bottom of the first recess RS1. Thus, to prevent the stacking fault, the first semiconductor layer SEL1 may be provided to have a relatively large thickness near the bottom of the first recess RS1.

The first semiconductor layer SEL1 may protect the second semiconductor layer SEL2, in a process of replacing sacrificial layers SAL with first to third portions PO1, PO2, and PO3 of a gate electrode GE, which will be described below. For example, the first semiconductor layer SEL1 may prevent the second semiconductor layer SEL2 from being undesirably etched by an etching material, which is used to remove the sacrificial layers SAL.

The gate electrodes GE may be provided to cross the first and second channel patterns CH1 and CH2 and to extend lengthwise in the first direction D1. The gate electrodes GE may be arranged at a first pitch P1 in the second direction D2. Each of the gate electrodes GE may be vertically overlapped with the first and second channel patterns CH1 and CH2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 5E, the gate electrode GE may be provided on a top surface TS, a bottom surface BS, and opposite side surfaces SW1 and SW2 of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

As an example, the first single height cell SHC1 may have a first border BD1 and a second border BD2, which are opposite to each other in the second direction D2. The first and second borders BD1 and BD2 may be extended lengthwise in the first direction D1. The first and second borders BD1 and BD2 may be parallel to one another. The first single height cell SHC1 may have a third border BD3 and a fourth border BD4, which are opposite to each other in the first direction D1. The third and fourth borders BD3 and BD4 may be extended lengthwise in the second direction D2. The third and fourth borders BD3 and BD4 may be parallel to one another.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be disposed to be overlapped with the gate electrodes GE, respectively. The gate cutting patterns CT may be formed of or may include at least one of insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. For example, the gate electrode GE extending in the first direction D1 may be divided into a plurality of the gate electrodes GE by the gate cutting patterns CT.

Referring back to FIG. 4, at least one of the gate cutting patterns CT may be located in a cell, not on a border of the cell. For example, the gate cutting pattern CT may be disposed between the second PMOSFET and NMOSFET regions PR2 and NR2 of the second single height cell SHC2.

Referring back to FIGS. 4 and 5A to 5E, a gate spacer GS may be disposed on each of opposite side surfaces of the fourth portion PO4 of the gate electrode GE. The gate spacer GS may be extended lengthwise along the gate electrode GE and in the first direction D1. A top surface of the gate spacer GS may be higher than the top surface of the gate electrode GE in the third direction D3. The top surface of the gate spacer GS may be coplanar with a top surface of a first interlayer insulating layer 110, which will be described below. The gate spacer GS may be formed of or may include at least one of SiCN, SiCON, or SiN. In an embodiment, the gate spacers GS may be a multi-layered structure, which is formed of or includes at least two different materials selected from SiCN, SiCON, and SiN (e.g., see FIGS. 6A to 6C).

In an embodiment, the gate spacer GS may include a first gate spacer GS1, which is provided on a side surface of the gate electrode GE on the first PMOSFET region PR1, and a second gate spacer GS2, which is provided on a side surface of the gate electrode GE on the first NMOSFET region NR1.

At least one (e.g., third insulating layer GSP3 and fourth insulating layer GSP4 of FIG. 6A) of layers constituting the first gate spacer GS1 may be provided on the first source/drain patterns SD1. At least one (e.g., fourth insulating layer GSP4 of FIG. 6B) of layers constituting the second gate spacer GS2 may be provided on the second source/drain patterns SD2.

Referring back to FIG. 5C, the second gate spacer GS2 may be extended lengthwise along with the gate electrode GE and may be provided on the device isolation layer ST. The second gate spacer GS2 on the device isolation layer ST may include an upper portion UPP and a lower portion LWP. The upper portion UPP of the second gate spacer GS2 may be adjacent to an upper portion of the gate electrode GE, and the lower portion LWP of the second gate spacer GS2 may be adjacent to a lower portion of the gate electrode GE. The lower portion LWP of the second gate spacer GS2 may be in direct contact with the top surface of the device isolation layer ST.

A thickness of the second gate spacer GS2 on the device isolation layer ST may decrease in a direction away from the device isolation layer ST (i.e., in the third direction D3). For example, a thickness of the lower portion LWP of the second gate spacer GS2 may be larger than a thickness of the upper portion UPP of the second gate spacer GS2. The device isolation layer ST between adjacent ones of the gate electrodes GE may include a third recess RS3 formed in its upper portion. At least one (e.g., fourth insulating layer GSP4) of layers constituting the second gate spacer GS2 may cover the third recess RS3.

Referring back to FIGS. 4 and 5A to 5E, a gate capping pattern GP may be provided on the gate electrode GE. The gate capping pattern GP may be extended along the gate electrode GE (e.g., extended lengthwise in the first direction D1). The gate capping pattern GP may be formed of or may include a material having an etch selectivity with respect to first and second interlayer insulating layers 110 and 120, which will be described below. In detail, the gate capping pattern GP may be formed of or may include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and opposite side surfaces SW1 and SW2 of each of the first to third semiconductor patterns SP1, SP2, and SP3. The gate insulating layer GI may cover the top surface of the device isolation layer ST below the gate electrode GE. The gate insulating layer GI may cover a side surface of the gate cutting pattern CT, contacting the side surface of the gate cutting pattern CT (e.g., see FIG. 5E).

In an embodiment, the gate insulating layer GI may include a silicon oxide layer, a silicon oxynitride layer, and/or a high-k dielectric layer. The high-k dielectric layer may be formed of or may include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or may include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 at % to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or may include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or may include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 nm to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of stacked work-function metal layers.

The second metal pattern may be formed of or may include a metallic material whose resistance is lower than the first metal pattern. For example, the second metal pattern may include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

Referring back to FIG. 5B, inner spacers IP may be provided on the first and second NMOSFET regions NR1 and NR2. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. The second interlayer insulating layer 120 may be formed on the first interlayer insulating layer 110 to cover the gate capping pattern GP. The second interlayer insulating layer 120 may contact top surfaces of the gate spacer GS, the gate capping pattern GP, and the first interlayer insulating layer 110. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, the pair of the division structures DB may be provided on the first and second borders BD1 and BD2, respectively, of the first single height cell SHC1. The division structure DB may be extended lengthwise in the first direction D1 to be parallel to the gate electrodes GE. A pitch between the division structure DB and the gate electrode GE adjacent thereto may be equal to the first pitch.

The division structures DB may be provided to penetrate the first and second interlayer insulating layers 110 and 120 and may be extended into the first and second active patterns AP1 and AP2. The division structures DB may be provided to penetrate an upper portion of each of the first and second active patterns AP1 and AP2. For example, bottom surfaces of the division structures DB may be at a lower vertical level than upper surfaces of the first and second active patterns AP1 and AP2. The division structures DB may electrically separate an active region of each of the first and second single height cells SHC1 and SHC2 from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extending lengthwise in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of the side surface of the gate spacer GS. Although not shown, the active contact AC may cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may contact bottom and side surfaces of the active contact AC. The silicide pattern SC may be formed of or may include at least one of metal silicide materials (e.g., titanium silicide, tantalum silicide, tungsten silicide, nickel silicide, and cobalt silicide).

Referring back to FIG. 5D, at least one of the active contacts AC on the first single height cell SHC1 may electrically connect the first source/drain pattern SD1 of the first PMOSFET region PR1 to the second source/drain pattern SD2 of the first NMOSFET region NR1. The active contact AC may be extended from the second source/drain pattern SD2 of the first NMOSFET region NR1 to the first source/drain pattern SD1 of the first PMOSFET region PR1 in the first direction D1. The active contact AC may include a first body portion BP1 on the first source/drain pattern SD1 and a second body portion BP2 on the second source/drain pattern SD2. The first body portion BP1 may be connected to the top surface of the first source/drain pattern SD1 through the silicide pattern SC, and the second body portion BP2 may be connected to the top surface of the second source/drain pattern SD2 through the silicide pattern SC. A first active contact AC1 may further include a protruding portion PRP interposed between the first and second body portions BP1 and BP2. The protruding portion PRP may be provided on the device isolation layer ST between the first PMOSFET region PR1 and the first NMOSFET region NR1.

The protruding portion PRP may be extended from the first body portion BP1 toward the device isolation layer ST along a slanted side surface of the first source/drain pattern SD1. The protruding portion PRP may be extended from the second body portion BP2 toward the device isolation layer ST along a slanted side surface of the second source/drain pattern SD2. The protruding portion PRP may have a bottom surface that is lower than a bottom surface of each of the first and second body portions BP1 and BP2. The bottom surface of the protruding portion PRP may be located at a level higher than the device isolation layer ST. For example, the protruding portion PRP may be spaced apart from the device isolation layer ST with the first interlayer insulating layer 110 interposed therebetween.

In an embodiment, the active contact AC may be connected to the top surface of the first source/drain pattern SD1 through the first body portion BP1 and may also be connected to the slanted side surface of the first source/drain pattern SD1 through the protruding portion PRP. For example, the protruding portion PRP may increase a contact area between the active contact AC and the first source/drain pattern SD1. Thus, a resistance between the active contact AC and the first source/drain pattern SD1 may be reduced. Similarly, the protruding portion PRP may decrease a resistance between the active contact AC and the second source/drain pattern SD2. As a result, it may be possible to improve an operation property (e.g., an operation speed) of the semiconductor device according to an embodiment of the inventive concept.

Gate contacts GC may be provided to penetrate the second interlayer insulating layer 120 and the gate capping pattern GP and to be electrically connected to the gate electrodes GE, respectively. When viewed in a plan view, the gate contacts GC on the first single height cell SHC1 may be disposed to be overlapped with the first PMOSFET region PR1. For example, the gate contacts GC on the first single height cell SHC1 may be provided on the first active pattern AP1 (e.g., see FIG. 5A).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the trench TR (e.g., see FIG. 4).

Figure 5D:
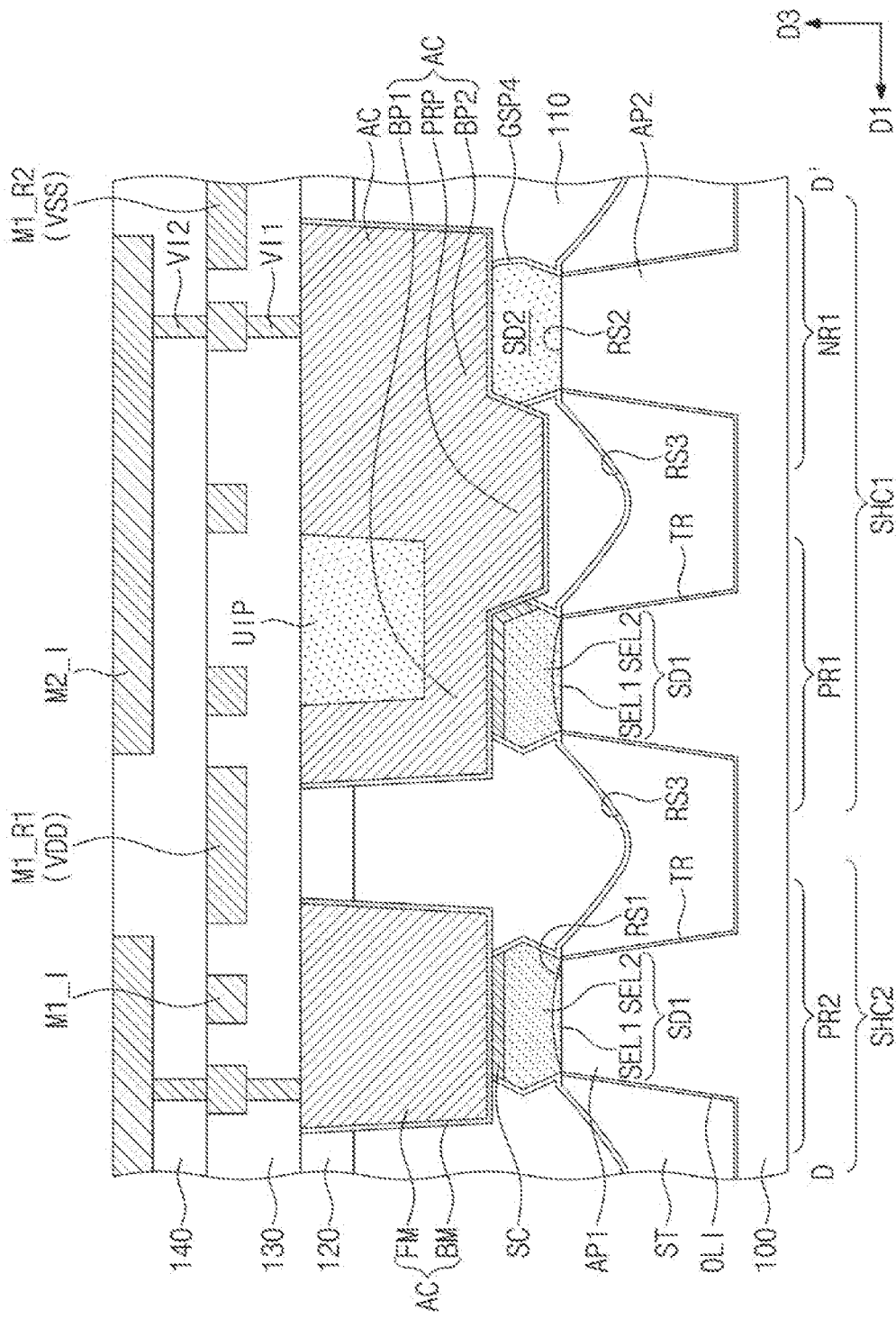
Figure 5E:
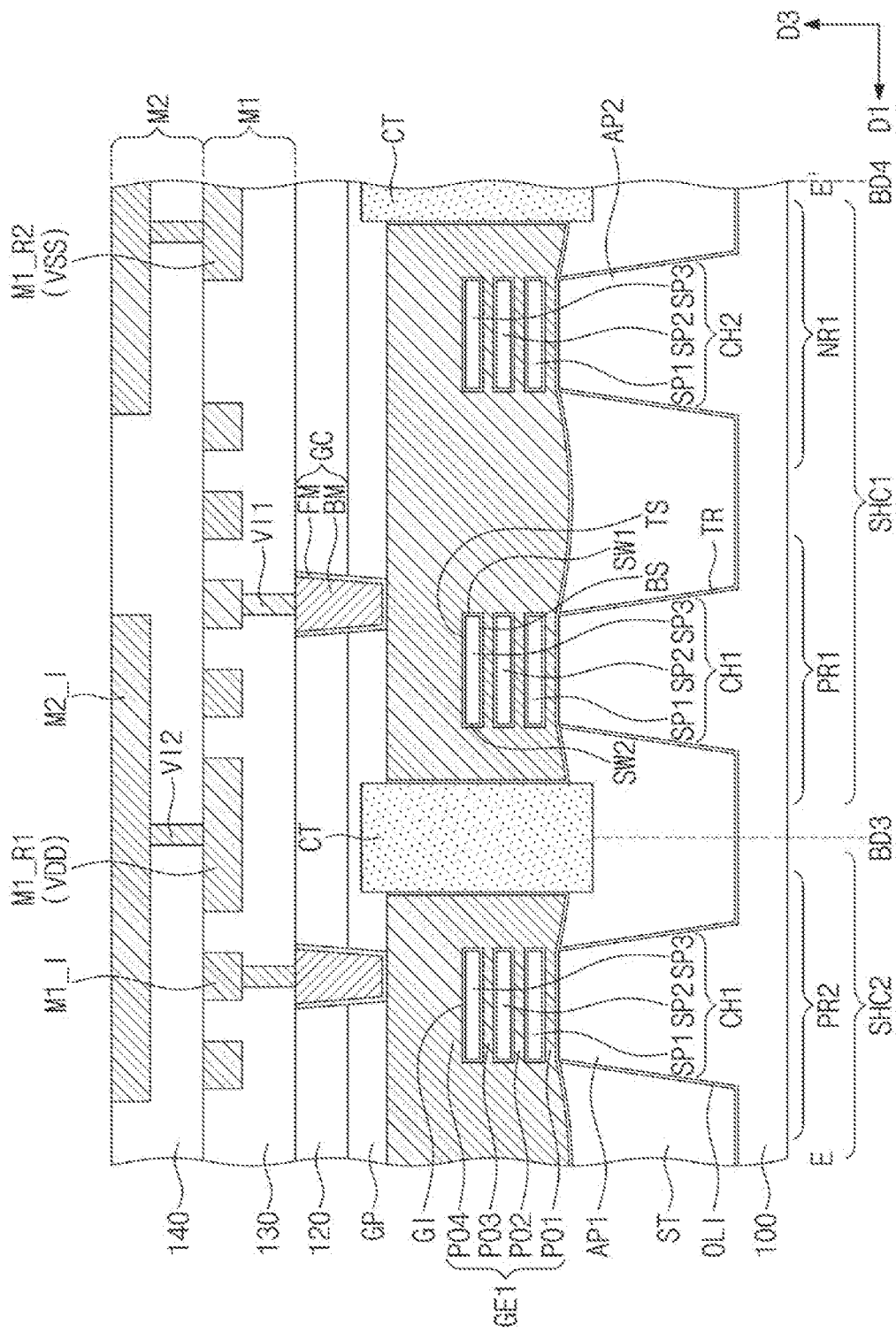
Figure 6A:
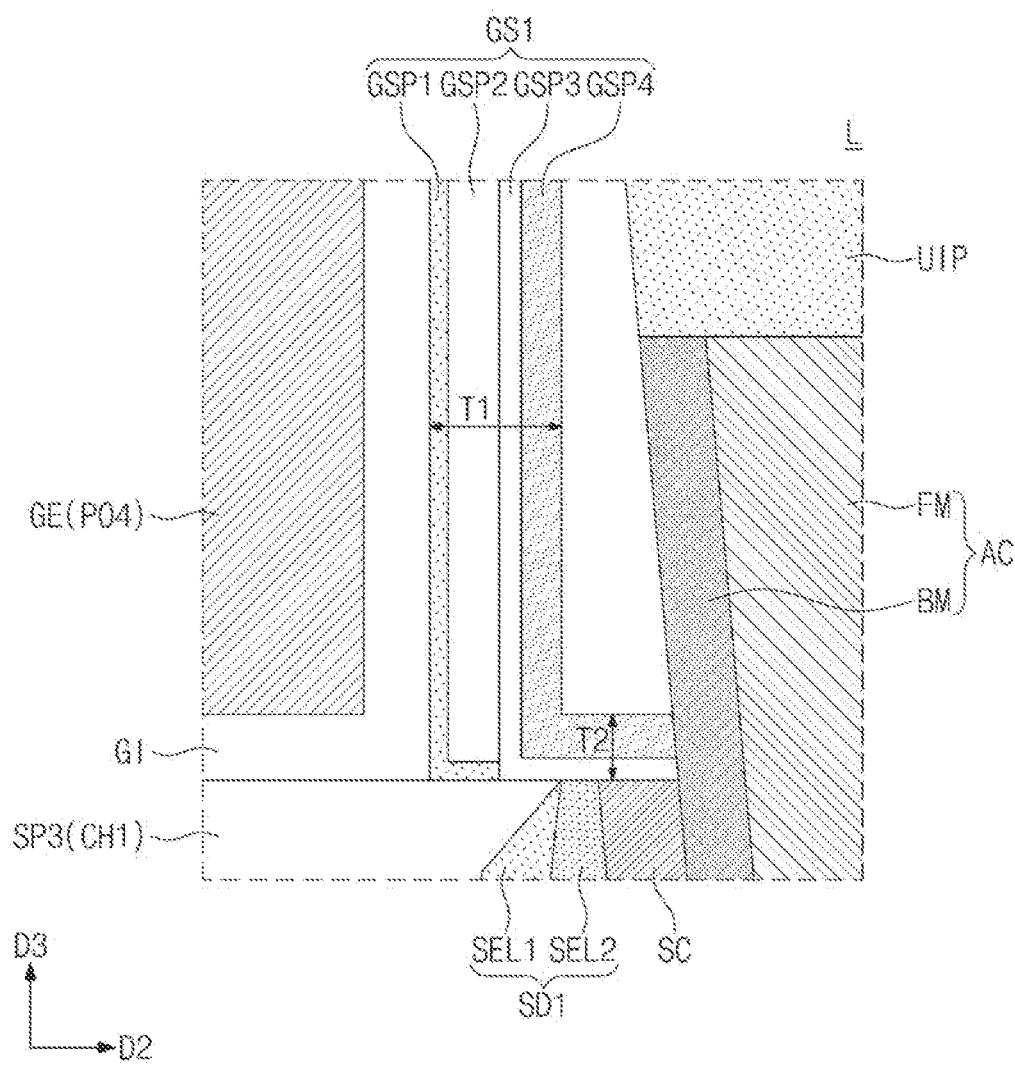
FIG. 6A is an enlarged sectional view illustrating a portion of FIG. 5A.
Figure 6B:
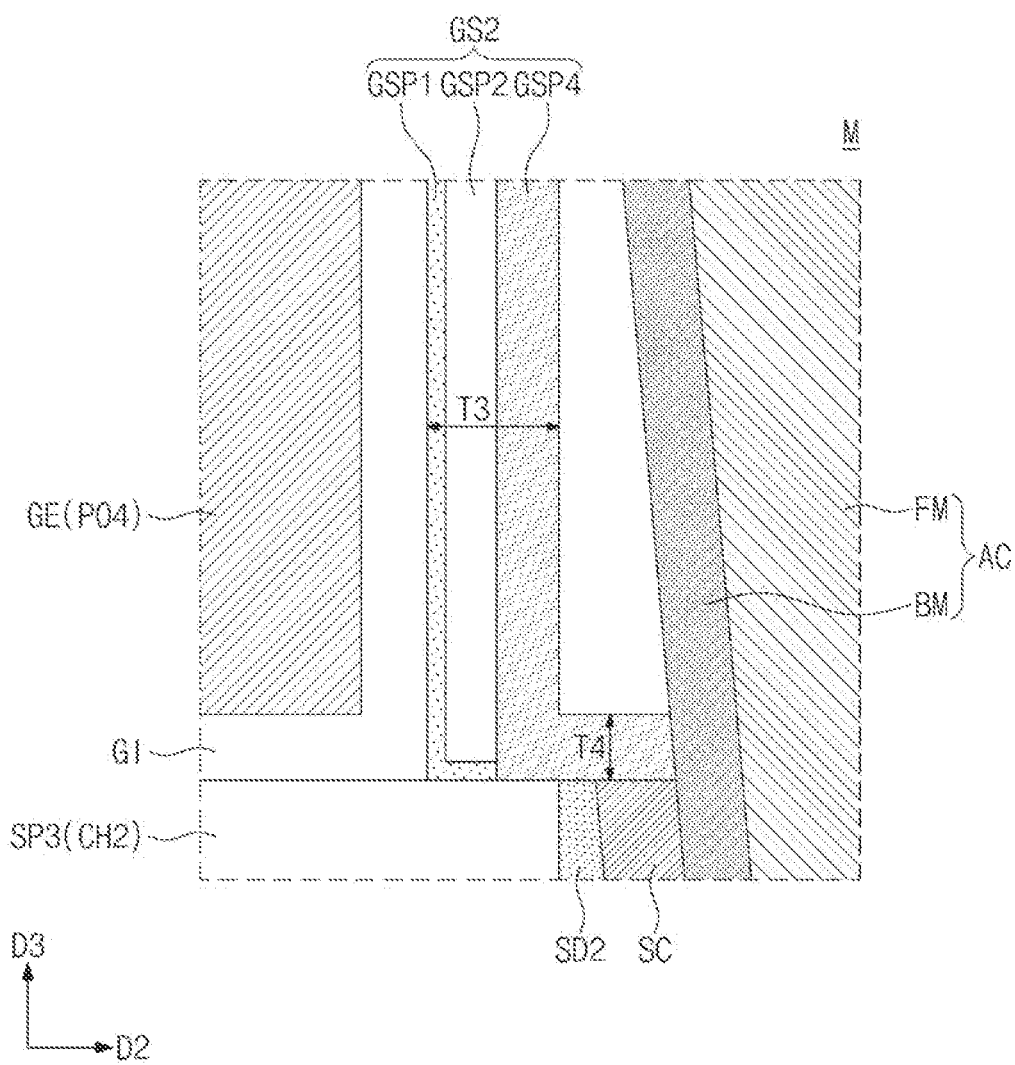
FIG. 6B is an enlarged sectional view illustrating a portion 'M' of FIG. 5B.
Figure 6C:
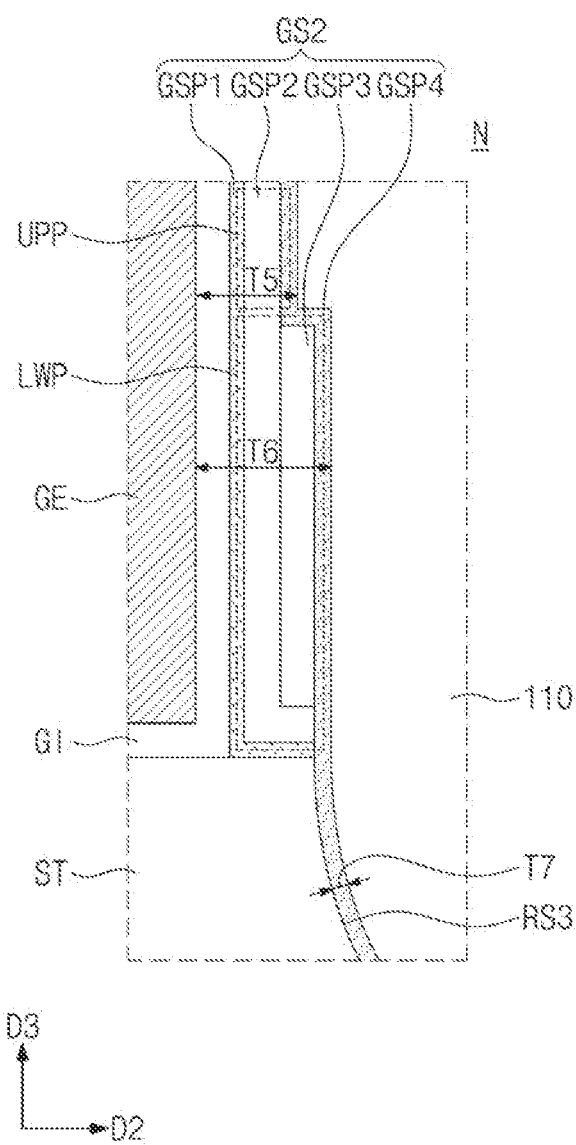
FIG. 6C is an enlarged sectional view illustrating a portion 'N' of FIG. 5C.

In an embodiment, referring to FIGS. 5A and 5D, an upper portion of the active contact AC adjacent to the gate contact GC may be filled with an upper insulating pattern UIP. A bottom surface of the upper insulating pattern UIP may be lower than a bottom surface of the gate contact GC. For example, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or may include at least one of metallic materials (e.g., aluminum, copper, tungsten, molybdenum, and cobalt). The barrier pattern BM may be provided to cover and contact side and bottom surfaces of the conductive pattern FM. In an embodiment, the barrier pattern BM may include a metal layer and a metal nitride layer. The metal layer may be formed of or may include at least one of titanium, tantalum, tungsten, nickel, cobalt, or platinum. The metal nitride layer may be formed of or may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended lengthwise in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch. A line width in the first direction D1 of each of the first interconnection lines M1_I may be smaller than a line width in the first direction D1 of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contacts AC and the first interconnection lines M1_I of the first metal layer M1 may be electrically connected to each other through the first via VI1. The gate contact GC and the first interconnection lines M1_I of the first metal layer M1 may be electrically connected to each other through the first via VI1.

The interconnection lines M1_R1, M1_R2, M1_R3, and M1_I of the first metal layer M1 and the first via VI1 thereunder may be formed by separate processes. For example, the interconnection lines M1_R1, M1_R2, M1_R3, and M1_I and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending in the first direction D1. For example, the second interconnection lines M2_I may be extended lengthwise in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines M1_R1, M1_R2, M1_R3, and M1_I of the first metal layer M1 may be formed of or may include a conductive material that is the same as or different from those of the second metal layer M2. For example, the interconnection lines of the first and second metal layers M1 and M2 may be formed of or may include at least one of metallic materials (e.g., aluminum, copper, tungsten, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

The first gate spacer GS1 and the second gate spacer GS2 will be described in more detail with reference to FIGS. 6A to 6C. First, referring to FIG. 6A, the first gate spacer GS1 on the first PMOSFET region PR1 may include first to fourth insulating layers GSP1 to GSP4, which are sequentially stacked on the gate insulating layer GI. Each of the first to fourth insulating layers GSP1 to GSP4 may be formed of or may include a silicon-containing insulating material.

In detail, the first insulating layer GSP1 may be formed of or may include carbon-containing silicon nitride (e.g., SiCN). The first insulating layer GSP1 may have a thickness of about 1 nm to about 3 nm. The first insulating layer GSP1 may directly cover a side surface of the gate insulating layer GI. The first insulating layer GSP1 may include an extending portion that extends horizontally and covers an upper surface of the third semiconductor pattern SP3. For example, the first insulating layer GSP1 may contact the side surface of the gate insulating layer GI and a top surface of the third semiconductor pattern SP3.

The second insulating layer GSP2 may be formed of or may include a silicon-containing low-k dielectric material (e.g., SiCON). The second insulating layer GSP2 may have a thickness of about 4 nm to about 8 nm. The second insulating layer GSP2 may have the largest thickness, among the first to fourth insulating layers GSP1 to GSP4. The second insulating layer GSP2 may contact a side surface of the first insulating layer GSP1 and an upper surface of the extending portion of the first insulating layer GSP1.

The third insulating layer GSP3 may be formed of or may include a silicon-containing low-k dielectric material. In an embodiment, the third insulating layer GSP3 may be formed of or may include a material that is the same as or similar to the second insulating layer GSP2. For example, the third insulating layer GSP3 may be formed of or may include SiCON but may differ from the second insulating layer GSP2 in a content of each of Si, C, O, and N. Since the third insulating layer GSP3 includes a material that is the same as or similar to the second insulating layer GSP2, there may be no observable interface between the third insulating layer GSP3 and the second insulating layer GSP2. The third insulating layer GSP3 may be horizontally extended to directly cover the top surface of the first source/drain pattern SD1 and/or the top surface of the silicide pattern SC, contacting the top surface of the first source/drain pattern SD1 and/or the top surface of the silicide pattern SC. The third insulating layer GSP3 may contact a side surface of the second insulating layer GSP2 and a side surface of the extending portion of the first insulating layer GSP1. Bottom surfaces of the first and third insulating layer GSP1 and GSP3 may be coplanar with one another. The third insulating layer GSP3 may have a thickness of about 1 nm to about 4 nm. In some embodiments, a bottom surface of the third insulating layer GSP3 may be at a higher vertical level than an upper surface of the extending portion of the first insulating layer GSP1.

A dielectric constant of each of the second and third insulating layers GSP2 and GSP3 may be lower than a dielectric constant of the first insulating layer GSP1. The dielectric constant of each of the second and third insulating layers GSP2 and GSP3 may be lower than a dielectric constant of the fourth insulating layer GSP4.

The fourth insulating layer GSP4 may be formed of or may include a silicon-containing insulating material (e.g., SiN) having a good etch resistant property. The fourth insulating layer GSP4 may have a thickness of about 3 nm to 6 nm. The fourth insulating layer GSP4 may include a portion that is horizontally extended to cover the top surface of the first source/drain pattern SD1 and/or the top surface of the silicide pattern SC. For example, the fourth insulating layer GSP4 may include a portion that vertically overlaps the first source/drain pattern SD1 and/or the silicide pattern SC.

The first gate spacer GS1 on the gate insulating layer GI may have a first thickness T1 in the second direction D2. The first gate spacer GS1 on the first source/drain pattern SD1 may have a second thickness T2 in the third direction D3. The first thickness T1 may be larger than the second thickness T2. This is because the first and second insulating layers GSP1 and GSP2 are not extended to a region on the first source/drain pattern SD1.

Referring to FIG. 6B, the second gate spacer GS2 on the third semiconductor pattern SP3 of the first NMOSFET region NR1 may include the first, second, and fourth insulating layers GSP1, GSP2, and GSP4, which are sequentially stacked on the gate insulating layer GI. Unlike the first gate spacer GS1 described above, the third insulating layer GSP3 may be omitted from the second gate spacer GS2 on the third semiconductor pattern SP3. The fourth insulating layer GSP4 of the second gate spacer GS2 may be horizontally extended to directly cover the top surface of the second source/drain pattern SD2 and/or the top surface of the silicide pattern SC. For example, the fourth insulating layer GSP4 of the second gate spacer GS2 may contact the top surface of the second source/drain pattern SD2 and/or the top surface of the silicide pattern SC.

The first, second, and fourth insulating layers GSP1, GSP2, and GSP4 of the second gate spacer GS2 may be substantially the same as the first, second, and fourth insulating layers GSP1, GSP2, and GSP4 of the first gate spacer GS1 described above.

The second gate spacer GS2 on the gate insulating layer GI may have a third thickness T3 in the second direction D2. The second gate spacer GS2 on the second source/drain pattern SD2 may have a fourth thickness T4 in the third direction D3. The third thickness T3 may be larger than the fourth thickness T4. The first thickness T1 of FIG. 6A may be larger than the third thickness T3. The second thickness T2 of FIG. 6A may be larger than the fourth thickness T4.

Referring to FIG. 6C, the second gate spacer GS2 on the device isolation layer ST of the first NMOSFET region NR1 may include the first to fourth insulating layers GSP1 to GSP4. More specifically, the lower portion LWP of the second gate spacer GS2 may include the first to fourth insulating layers GSP1 to GSP4, and the upper portion UPP of the second gate spacer GS2 may include the first, second, and fourth insulating layers GSP1, GSP2, and GSP4. For example, the third insulating layer GSP3 may be omitted from the upper portion UPP of the second gate spacer GS2 that is adjacent to the upper portion of the gate electrode GE.

The lower portion LWP of the second gate spacer GS2 may be located at a level lower than the third semiconductor pattern SP3. Thus, a top surface of the third insulating layer GSP3 of the second gate spacer GS2 may be lower than the third semiconductor pattern SP3. Since the top surface of the third insulating layer GSP3 is lower than a top surface of each of the first, second, and fourth insulating layers GSP1, GSP2, and GSP4, the second gate spacer GS2 may have a decreasing thickness in a direction from its lower portion LWP toward its upper portion UPP.

For example, the upper portion UPP of the second gate spacer GS2, which is adjacent to the upper portion of the gate electrode GE, may have a fifth thickness T5 in the second direction D2. The fifth thickness T5 may be substantially equal to the third thickness T3 of FIG. 6B. The lower portion LWP of the second gate spacer GS2, which is adjacent to the lower portion of the gate electrode GE, may have a sixth thickness T6 in the second direction D2. The sixth thickness T6 may be substantially equal to the first thickness T1 of FIG. 6A. The sixth thickness T6 may be larger than the fifth thickness T5. For example, the sixth thickness T6 may be in the range of 1 nm to 4 nm larger than the fifth thickness T5.

The fourth insulating layer GSP4 of the upper portion UPP of the second gate spacer GS2 may directly cover the second insulating layer GSP2. For example, the fourth insulating layer GSP4 may contact the second insulating layer GSP2. The fourth insulating layer GSP4 of the lower portion LWP of the second gate spacer GS2 may directly cover the third insulating layer GSP3. For example, the fourth insulating layer GSP4 may contact the third insulating layer GSP3. The fourth insulating layer GSP4 of the lower portion LWP may be downward extended to directly cover an inner surface of the third recess RS3 of the device isolation layer ST. The second gate spacer GS2 on the third recess RS3 (i.e., the fourth insulating layer GSP4) may have a seventh thickness T7. The seventh thickness T7 may be smaller than the fifth thickness T5.

In the present embodiment, the upper portion of the gate electrode GE may mean a portion of the gate electrode GE corresponding to the fourth portion PO4. The lower portion of the gate electrode GE may mean a portion of the gate electrode GE corresponding to the first to third portions PO1, PO2, and PO3. For example, the lower portion of the gate electrode GE may be located at a level lower than the uppermost semiconductor pattern (i.e., the third semiconductor pattern SP3). The upper portion UPP of the second gate spacer GS2 may be located at the same level as the upper portion of the gate electrode GE, and the lower portion LWP of the second gate spacer GS2 may be located at the same level as the lower portion of the gate electrode GE.

According to an embodiment of the inventive concept, the upper portion UPP of the second gate spacer GS2 may have a relatively small thickness (e.g., T3 or T5). Thus, it may be possible to prevent an unetch defect of the second recess RS2, which is filled with the second source/drain pattern SD2. The unetch defect of the second recess RS2 may result in a contact failure between adjacent ones of the gate electrodes GE, but according to an embodiment of the inventive concept, it may be possible to prevent this defect and thereby to improve reliability of a semiconductor device.

According to an embodiment of the inventive concept, the lower portion LWP of the second gate spacer GS2 may have a relatively large thickness T6. Thus, it may be possible to prevent a pitting failure, in which the lower portion of the gate electrode GE penetrates the lower portion LWP of the second gate spacer GS2 and protrudes outwardly, and thereby to improve the reliability of the semiconductor device.

FIGS. 7A to 16E are sectional views illustrating a method of fabricating a semiconductor device according to an example embodiment of the inventive concept. In detail, FIGS. 7A, 8A, 9A, 10A, 11A, 12A, 13A, 14A, 15A, and 16A are sectional views corresponding to the line A-A' of FIG. 4. FIGS. 9B, 10B, 11B, 12B, 13B, 14B, 15B, and 16B are sectional views corresponding to the line B-B' of FIG. 4. FIGS. 8B, 9C, 10C, 11C, 12C, 13C, 14C, 15C and 16C are sectional views corresponding to the line C-C' of FIG. 4. FIGS. 7B, 8C, 9D, 10D, 11D, 12D, 13D, 14D, 15D, and 16D are sectional views corresponding to the line D-D' of FIG. 4. FIGS. 8D, 9E, 10E, 11E, 12E, 13E, 14E, 15E, and 16E are sectional views corresponding to the line E-E' of FIG. 4.

Figure 7A:
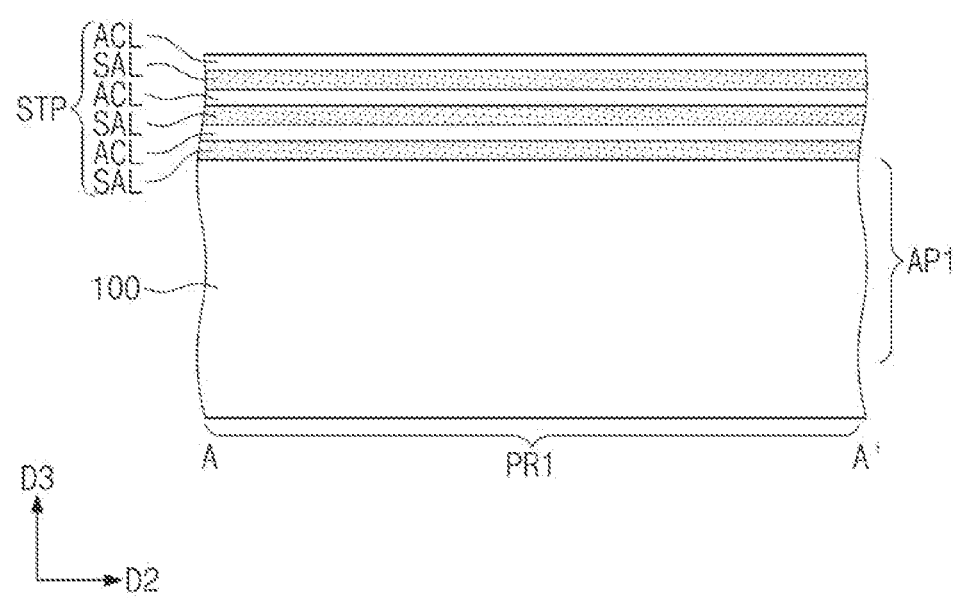
FIGS. 7A-7B, 8A-8D, 9A-9E, 10A-10E, 11A-11E, 12A-12E, 13A-13E, 14A-14E, 15A-15E, and 16A-16E are sectional views illustrating a method of fabricating a semiconductor device, according to an example embodiment of the inventive concept.
Figure 7B:
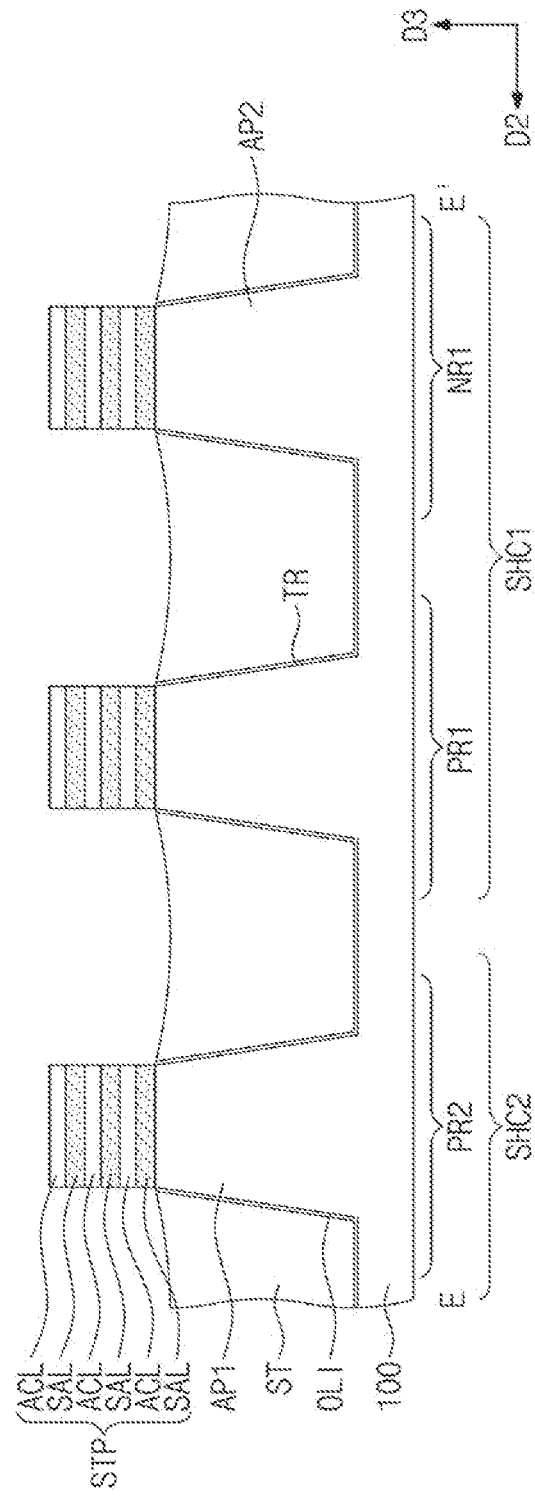
Figure 8A:
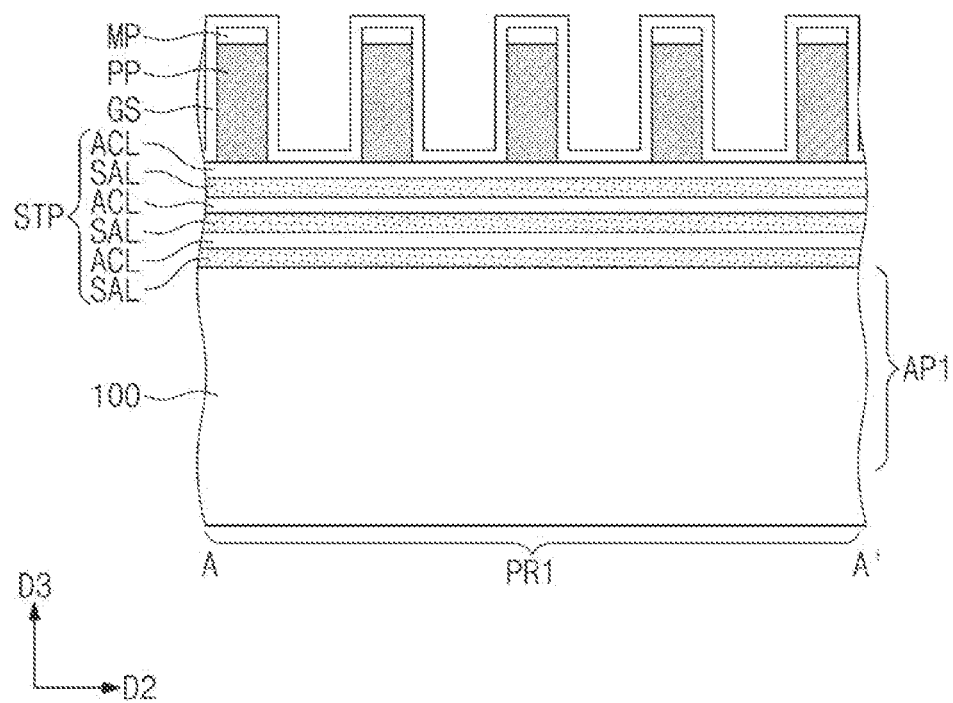
Figure 8B:
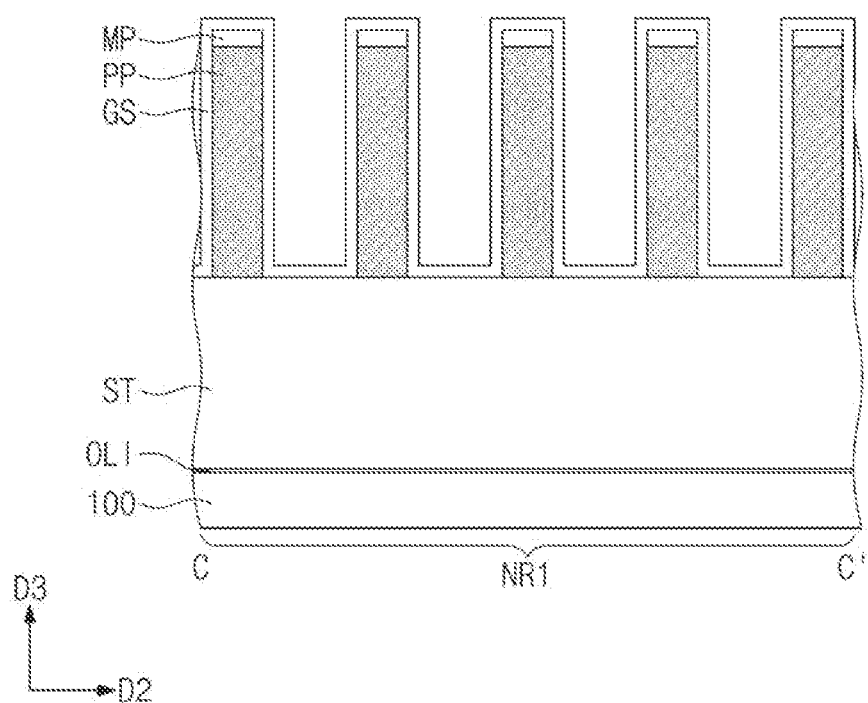
Figure 8C:
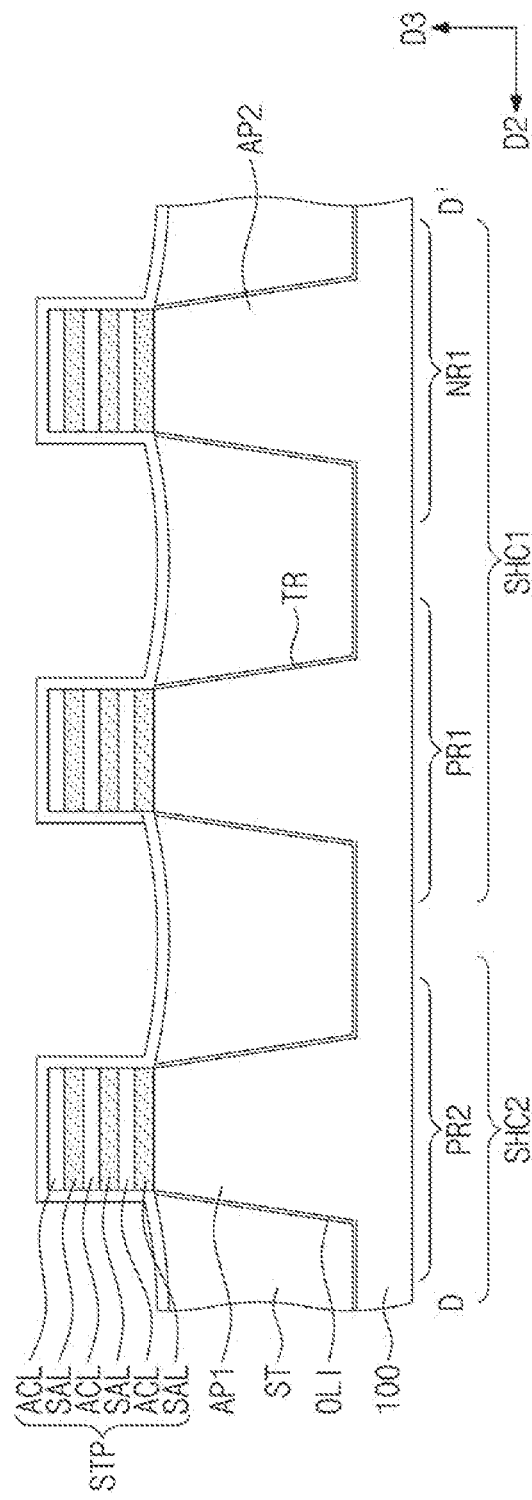
Figure 8D:
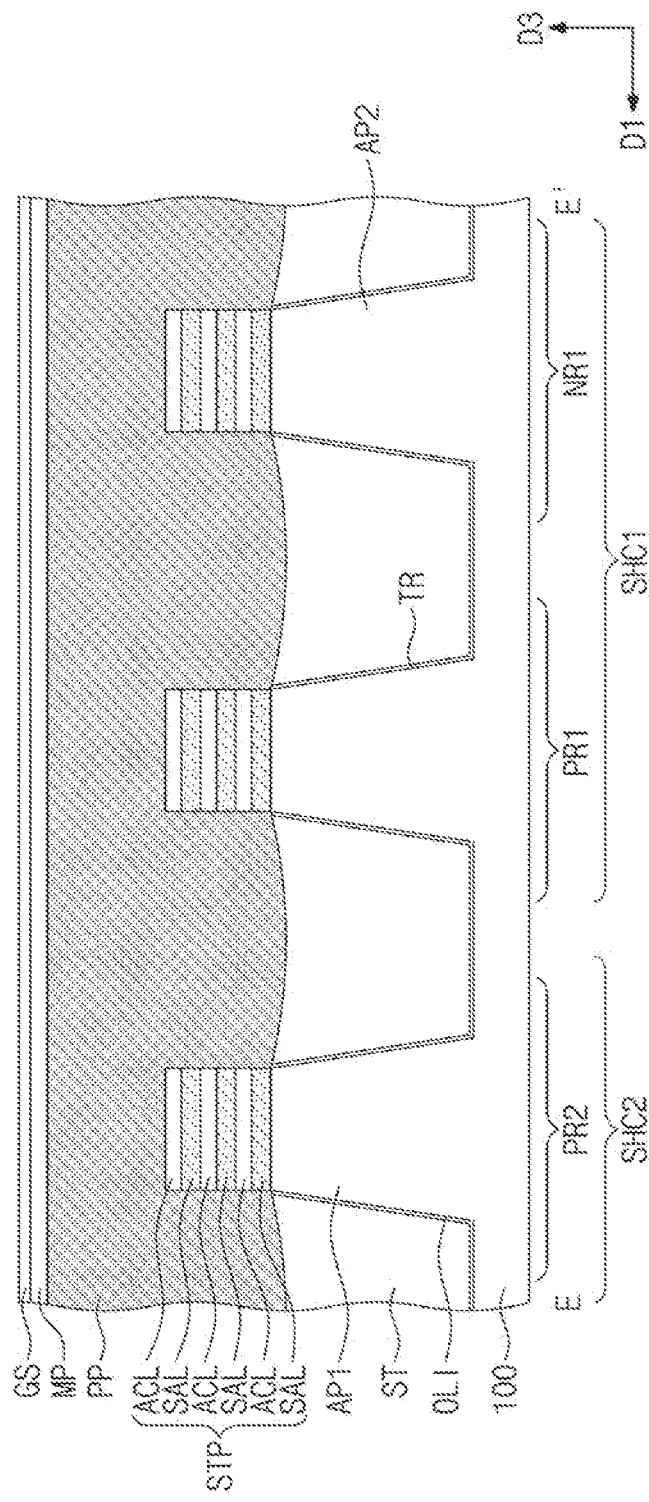
Figure 9A:
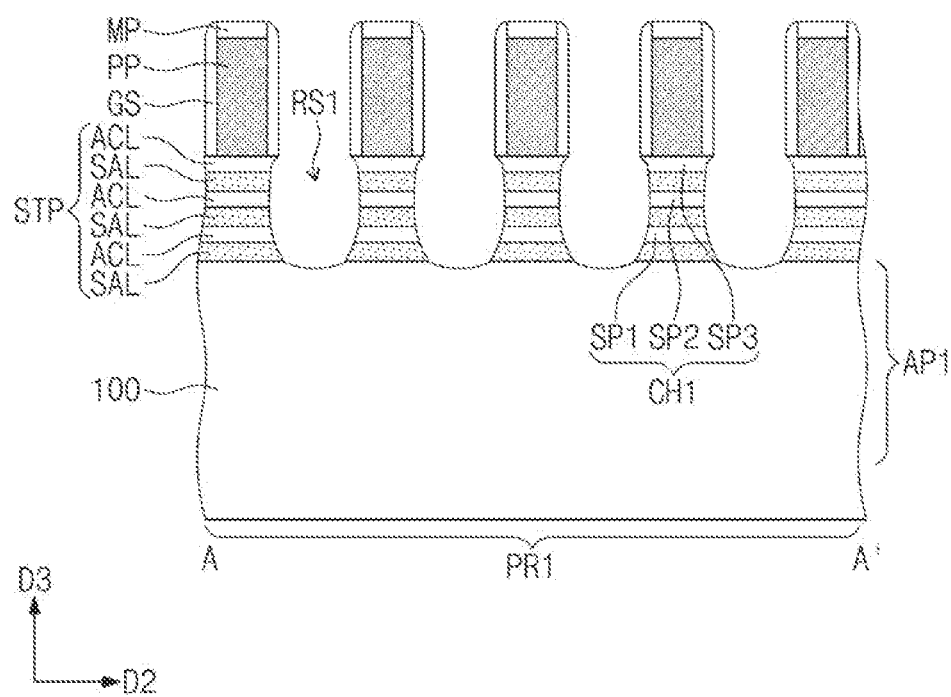
Figure 9B:
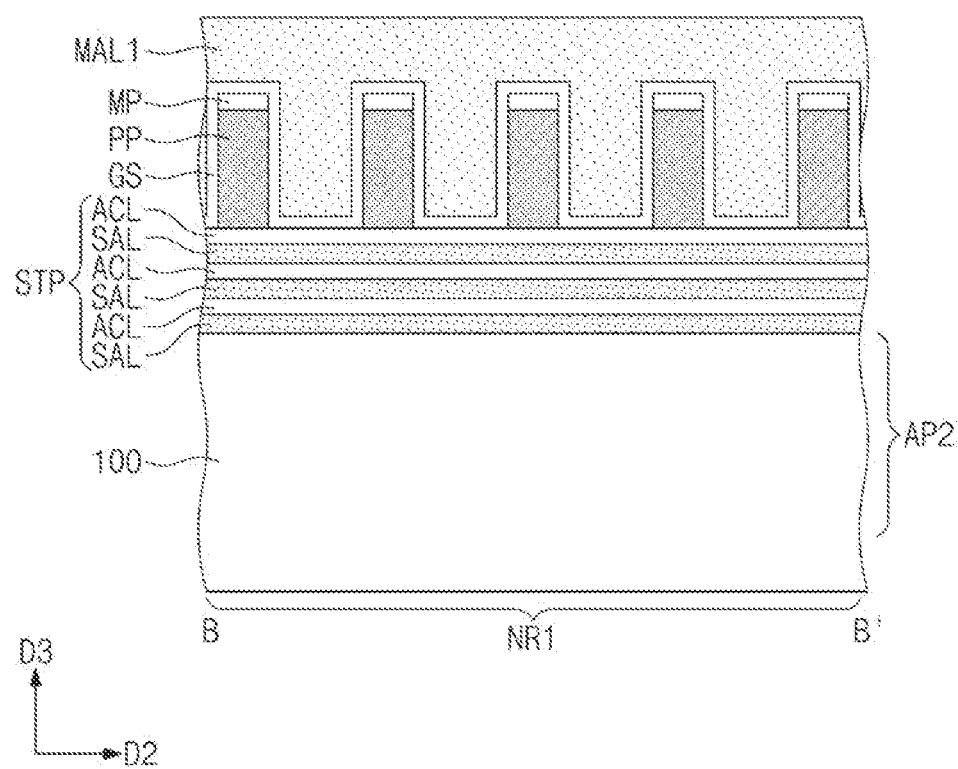
Figure 9C:
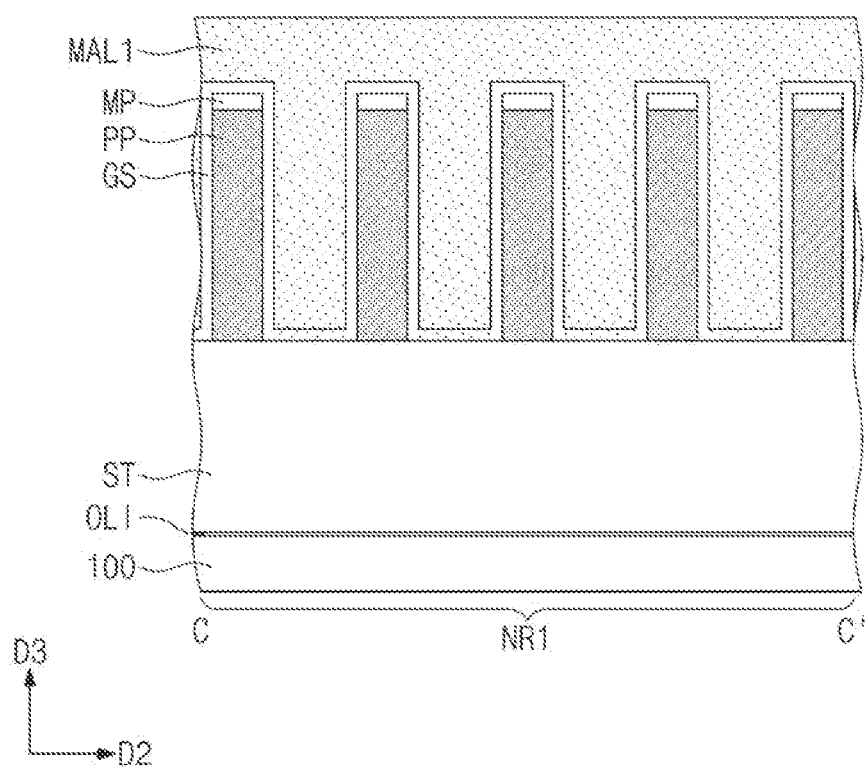
Figure 9D:
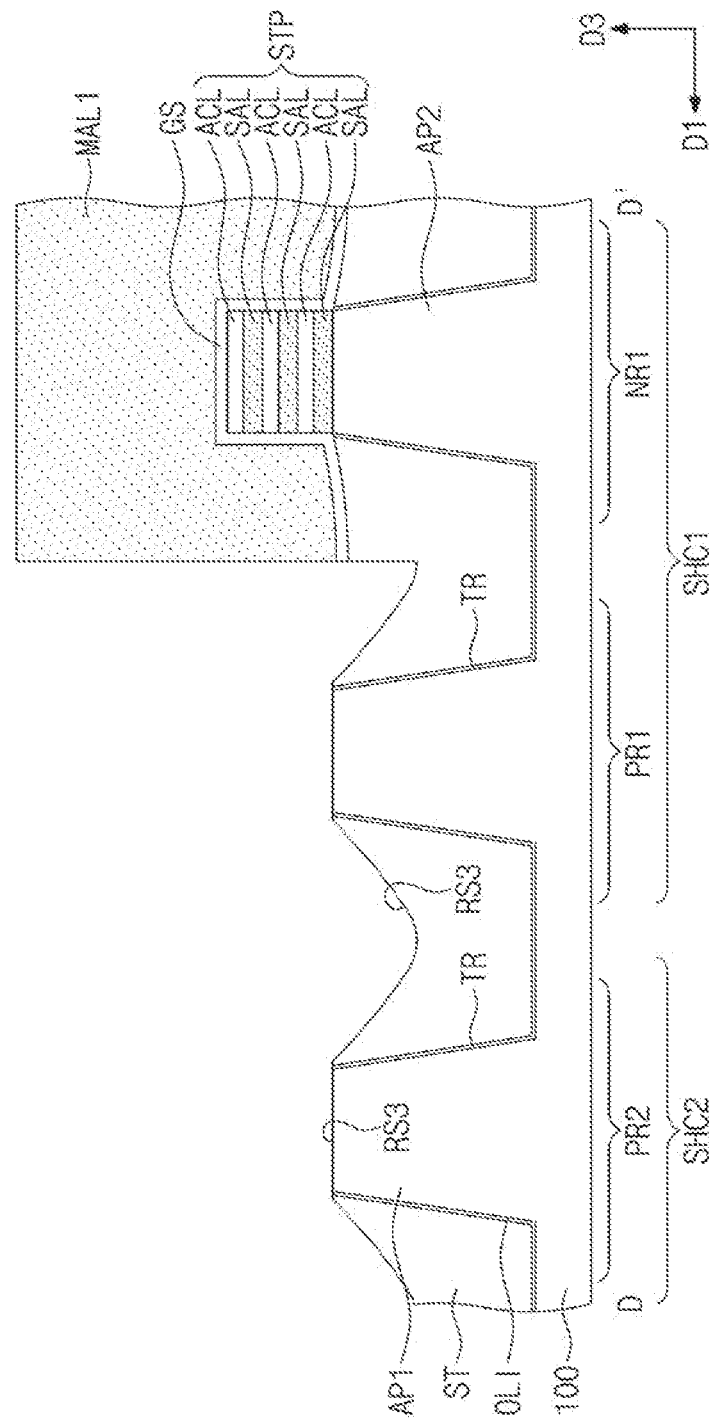
Figure 9E:
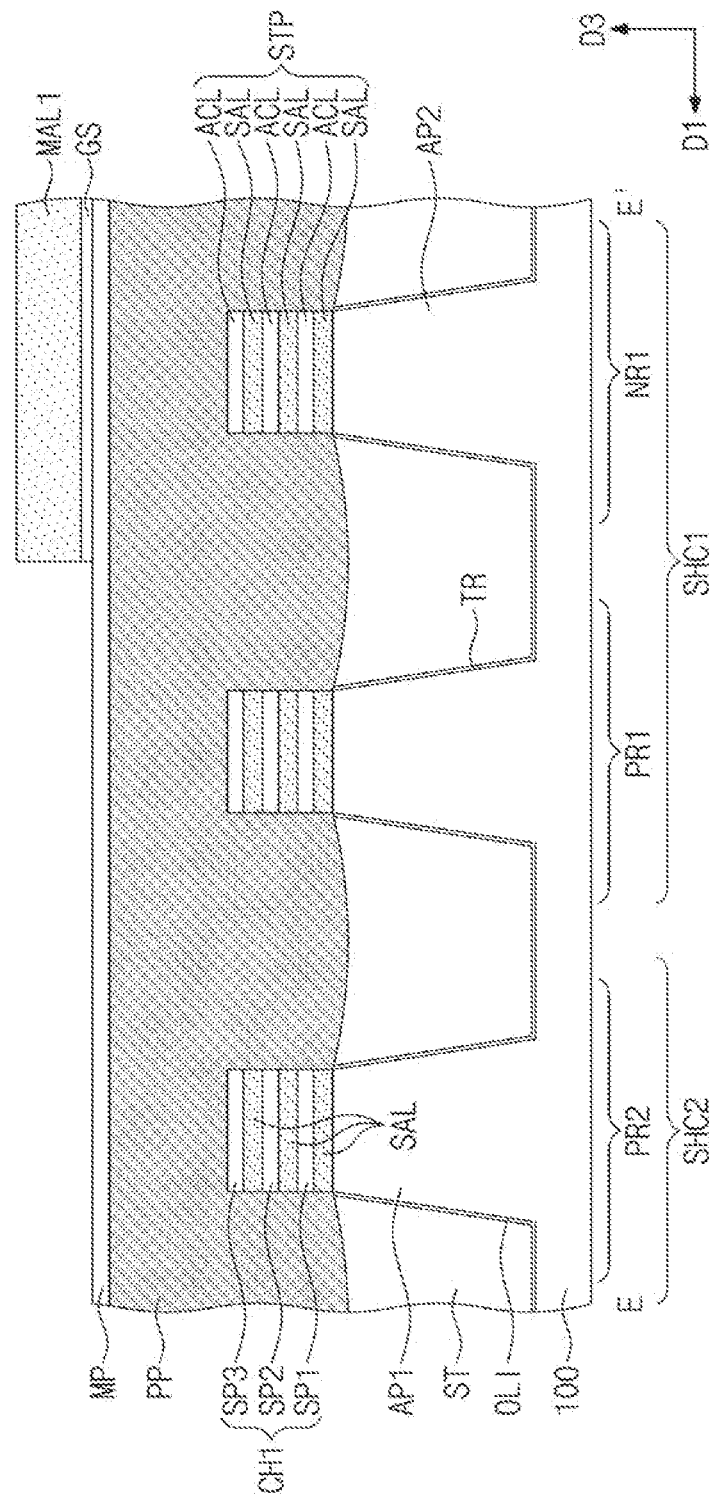
Figure 10A:
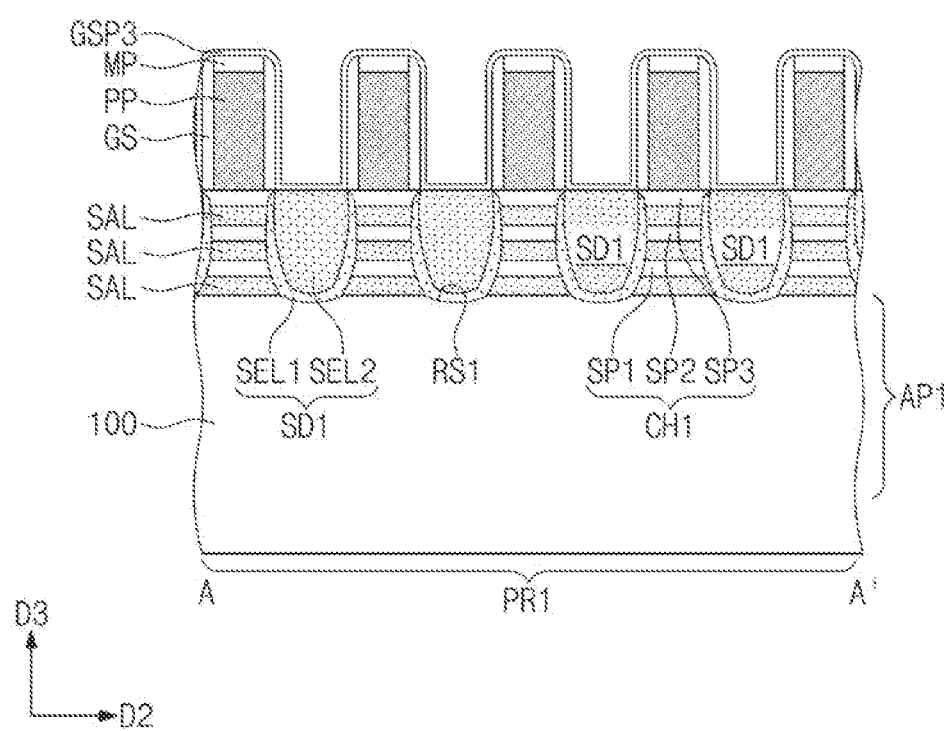
Figure 10B:
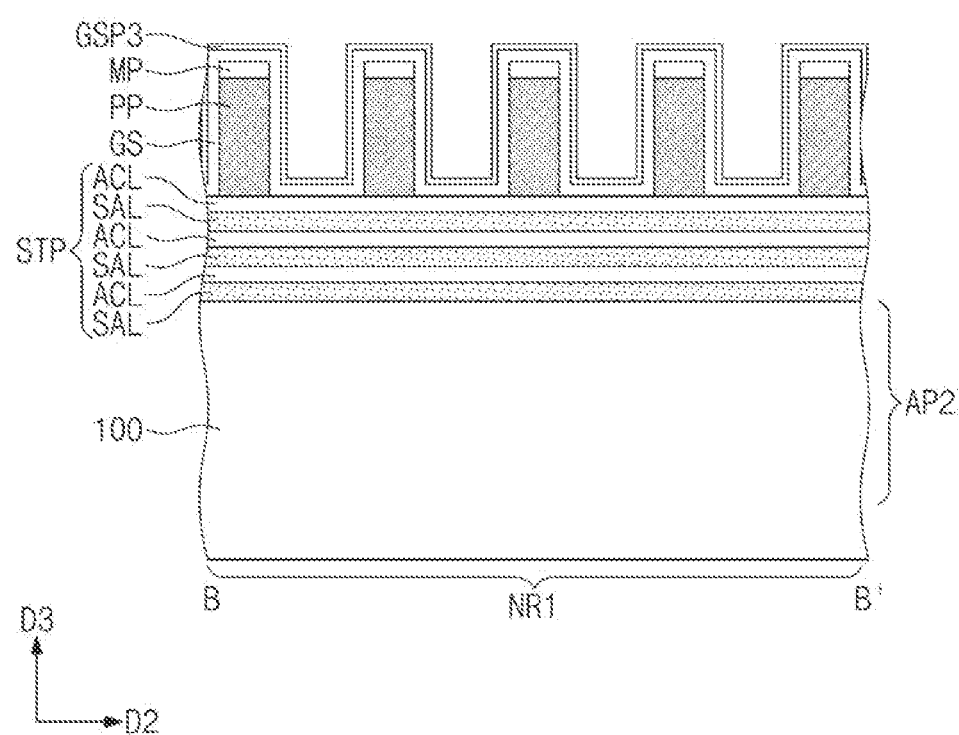
Figure 10C:
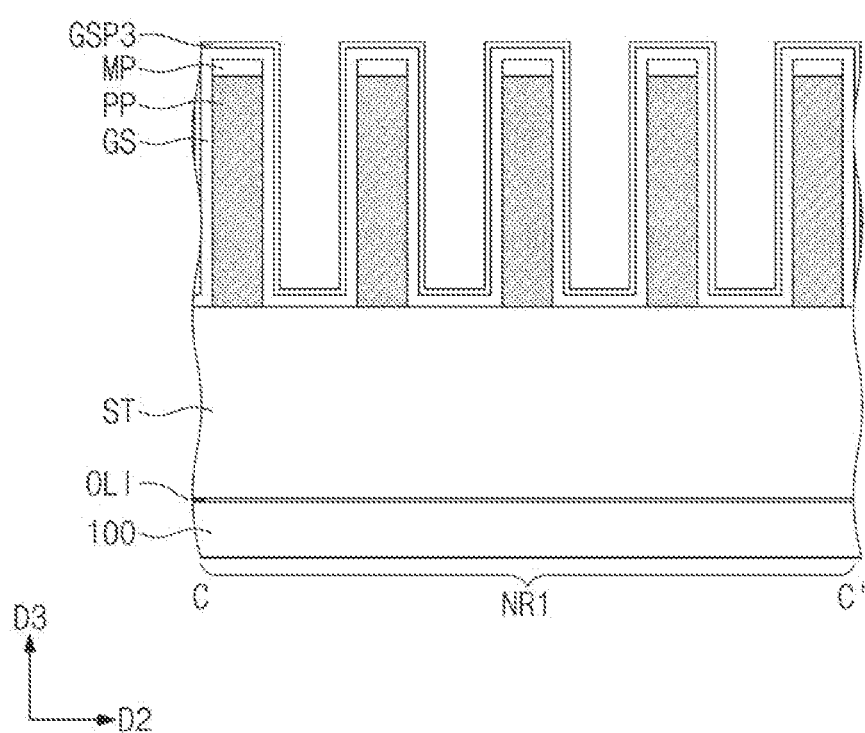
Figure 10D:
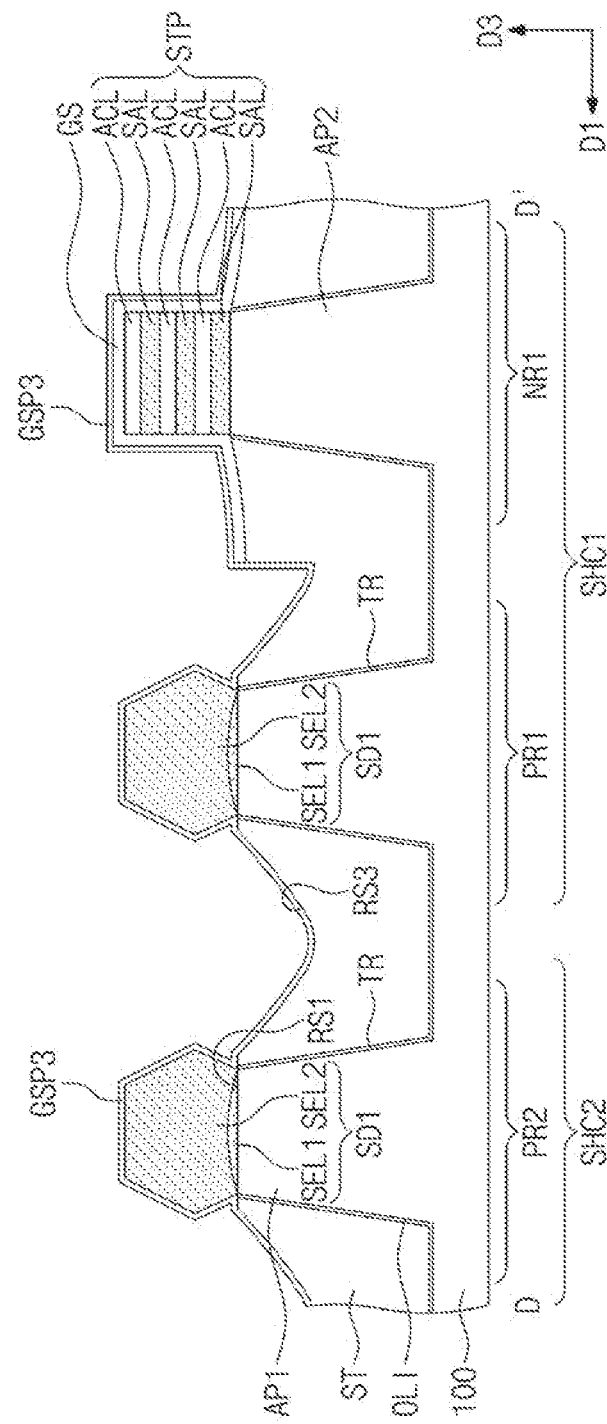
Figure 10E:
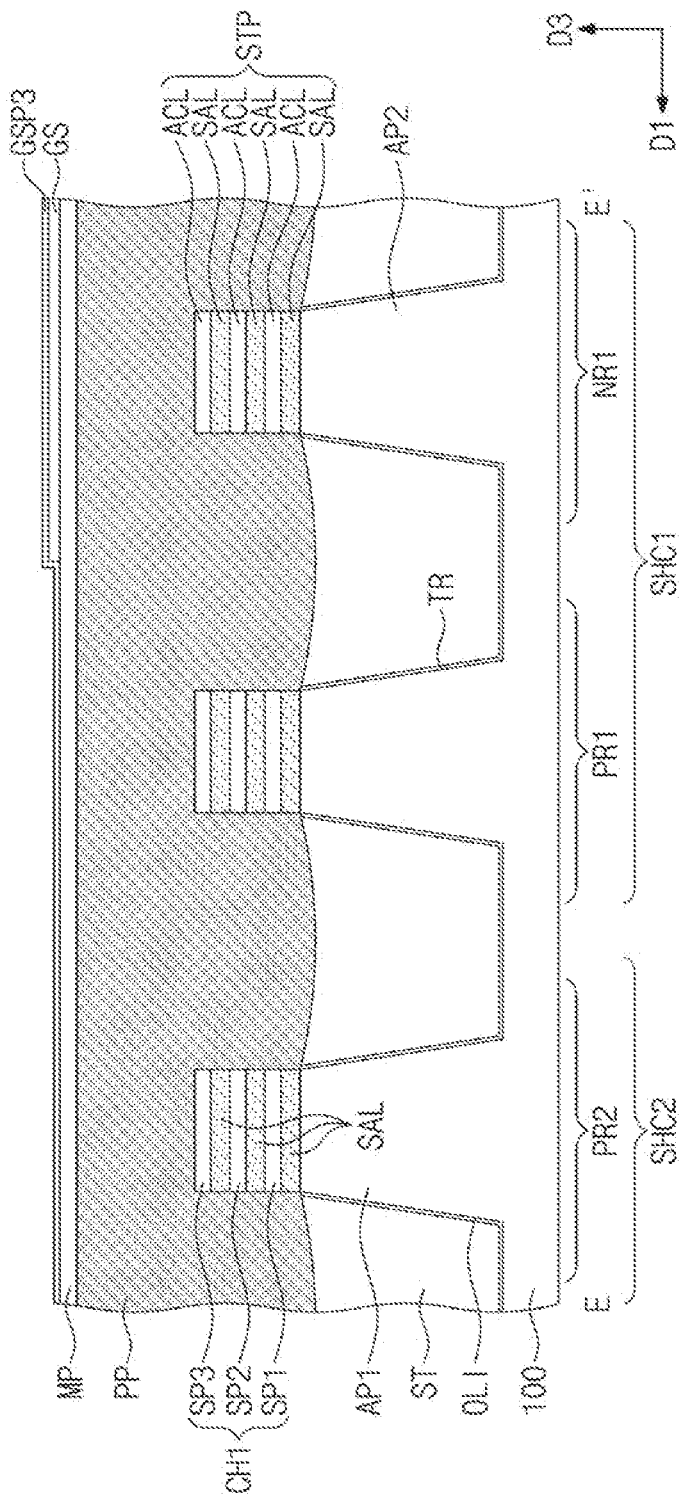

Referring to FIGS. 7A and 7B, the substrate 100 including the first and second PMOSFET regions PR1 and PR2 and the first and second NMOSFET regions NR1 and NR2 may be provided. The sacrificial layers SAL and active layers ACL may be formed to be alternately stacked on the substrate 100. The sacrificial layers SAL may be formed of or may include one of silicon (Si), germanium (Ge), and silicon-germanium (SiGe), and the active layers ACL may be formed of or may include another one of silicon (Si), germanium (Ge) and silicon-germanium (SiGe).

For example, the sacrificial layers SAL may be formed of or may include silicon-germanium (SiGe), and the active layers ACL may be formed of or may include silicon (Si). A germanium concentration of each of the sacrificial layers SAL may range from 10 at % to 30 at %.

Mask patterns may be respectively formed on the first and second PMOSFET regions PR1 and PR2 and the first and second NMOSFET regions NR1 and NR2 of the substrate 100. The mask pattern may be a line- or bar-shaped pattern extending in the second direction D2.

A patterning process, in which the mask patterns are used as an etch mask, may be performed to form the trench TR defining the first active pattern AP1 and the second active pattern AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the sacrificial layers SAL and the active layers ACL, which are alternatingly stacked. The stacking pattern STP may be formed along with the first and second active patterns AP1 and AP2, during the patterning process.

A liner layer OLI may be formed in the trench TR. The liner layer OLI may directly cover side surfaces of the first and second active patterns AP1 and AP2. For example, the liner layer OLI may directly cover a side surface of the trench TR. The liner layer OLI may directly cover a bottom of the trench TR. The liner layer OLI may include at least one of, for example, a silicon oxide layer, a silicon nitride layer, or a combination thereof.

The device isolation layer ST may be formed to fill the trench TR. In detail, an insulating layer may be formed on the liner layer OLI to cover the first and second active patterns AP1 and AP2 and the stacking patterns STP. The device isolation layer ST may be formed by recessing the insulating layer to expose the stacking patterns STP.

The device isolation layer ST may be formed of or may include at least one of insulating materials (e.g., silicon oxide). The stacking patterns STP may be placed above the device isolation layer ST and may be exposed to the outside of the device isolation layer ST. For example, the stacking patterns STP may protrude vertically above the device isolation layer ST.

Referring to FIGS. 8A to 8D, sacrificial patterns PP may be formed on the substrate 100 to cross the stacking patterns STP. Each of the sacrificial patterns PP may be a line- or bar-shaped pattern extending in the first direction D1. The sacrificial patterns PP may be arranged, at a specific pitch, in the second direction D2.

In detail, the formation of the sacrificial patterns PP may include forming a sacrificial film on the substrate 100, forming hard mask patterns MP on the sacrificial film, and patterning the sacrificial film using the hard mask patterns MP as an etch mask. The sacrificial film may be formed of or may include poly silicon.

The gate spacer GS may be formed on the sacrificial patterns PP. The gate spacer GS may include the first insulating layer GSP1 and the second insulating layer GSP2 on the first insulating layer GSP1, described with reference to FIGS. 6A to 6C. In detail, the formation of the gate spacer GS may include conformally forming the first insulating layer GSP1 on the substrate 100 and conformally forming the second insulating layer GSP2 on the first insulating layer GSP1.

Referring to FIGS. 9A to 9E, a first mask layer MAL1 may be formed on the first and second NMOSFET regions NR1 and NR2 of the substrate 100. The first mask layer MAL1 may be formed to expose the first and second PMOSFET regions PR1 and PR2.

An anisotropic etching process may be performed to etch the gate spacer GS on the first and second PMOSFET regions PR1 and PR2 exposed by the first mask layer MAL1. Accordingly, the stacking pattern STP between adjacent ones of the sacrificial patterns PP may be exposed. The first recesses RS1 may be formed by etching the exposed stacking pattern STP.

The formation of the first recesses RS1 may include etching the stacking pattern STP on the first active pattern AP1 using hard mask patterns MA and the gate spacers GS as an etch mask. The first recess RS1 may be formed between a pair of the sacrificial patterns PP. During the formation of the first recesses RS1, an exposed portion of the device isolation layer ST may be recessed to form the third recess RS3 (e.g., see FIG. 9D).

The first to third semiconductor patterns SP1, SP2, and SP3, which are sequentially stacked between adjacent ones of the first recesses RS1, may be formed from the active layers ACL. The first to third semiconductor patterns SP1, SP2, and SP3 between adjacent ones of the first recesses RS1 may constitute the first channel pattern CH1.

Referring to FIGS. 10A to 10E, the first mask layer MAL1 may be selectively removed. Next, the first source/drain patterns SD1 may be formed in the first recesses RS1, respectively. In detail, the first semiconductor layer SEL1 may be formed by performing a first SEG process using an inner surface of the first recess RS1 as a seed layer. The first semiconductor layer SEL1 may be grown using first to third semiconductor patterns SP1, SP2, and SP3 and the substrate 100, which are exposed through the first recesses RS1, as a seed. As an example, the first SEG process may include a chemical vapor deposition (CVD) process or a molecular beam epitaxy (MBE) process.

The first semiconductor layer SEL1 may be formed of or may include a semiconductor material (e.g., SiGe) having a lattice constant greater than that of the substrate 100. The first semiconductor layer SEL1 may be formed to have a relatively low germanium concentration. In another embodiment, the first semiconductor layer SEL1 may be formed to contain only silicon (Si) and not germanium (Ge). The germanium concentration of the first semiconductor layer SEL1 may range from 0 at % to 10 at %.

The second semiconductor layer SEL2 may be formed by performing a second SEG process on the first semiconductor layer SEL1. The second semiconductor layer SEL2 may be formed to completely fill the first recess RS1. The second semiconductor layer SEL2 may be formed to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have a first conductivity type (e.g., p-type).

During the first and second SEG process, any semiconductor layer may not be grown on the first and second NMOSFET regions NR1 and NR2, because the first and second NMOSFET regions NR1 and NR2 are covered with the gate spacer GS.

After the formation of the first source/drain patterns SD1, the third insulating layer GSP3 may be conformally formed on the entire top surface of the substrate 100. On the first and second PMOSFET regions PR1 and PR2, the third insulating layer GSP3 may fully cover the first source/drain patterns SD1. On the first and second NMOSFET regions NR1 and NR2, the third insulating layer GSP3 may cover the gate spacer GS.

Referring to FIGS. 11A to 11E, a second mask layer MAL2 may be formed on the first and second PMOSFET regions PR1 and PR2 of the substrate 100. The second mask layer MAL2 may be formed to expose the first and second NMOSFET regions NR1 and NR2.

Figure 11A:
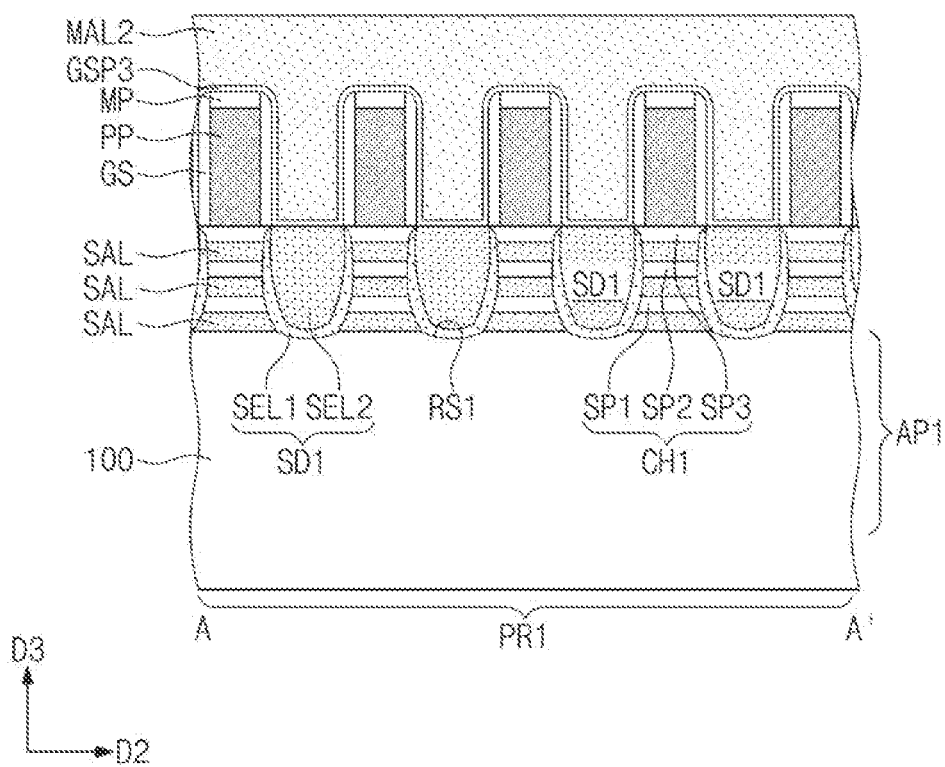
Figure 11B:
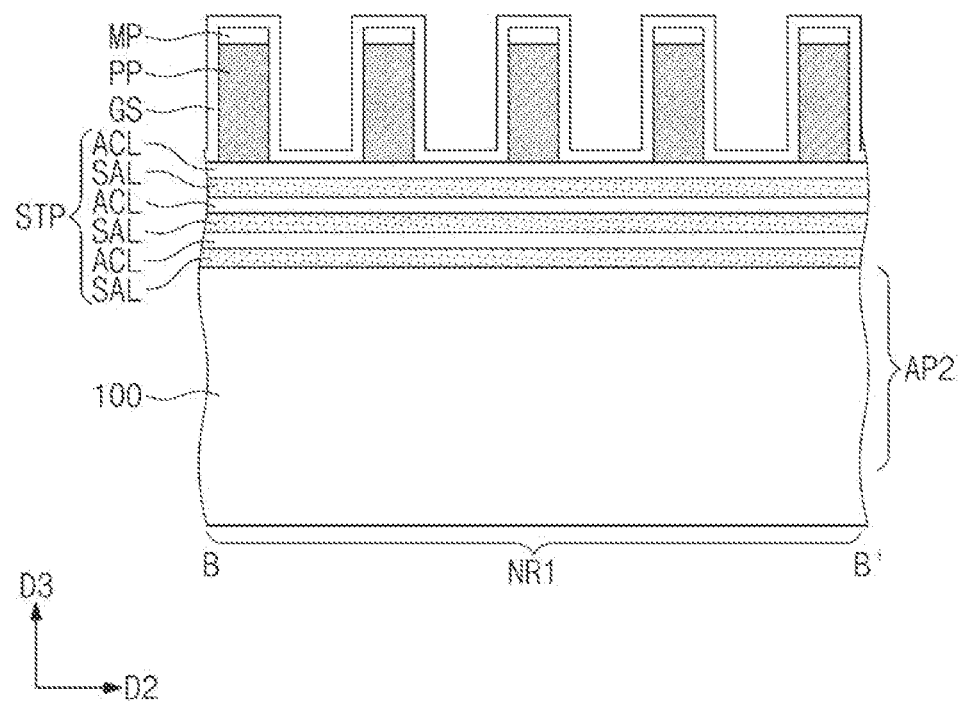
Figure 11C:
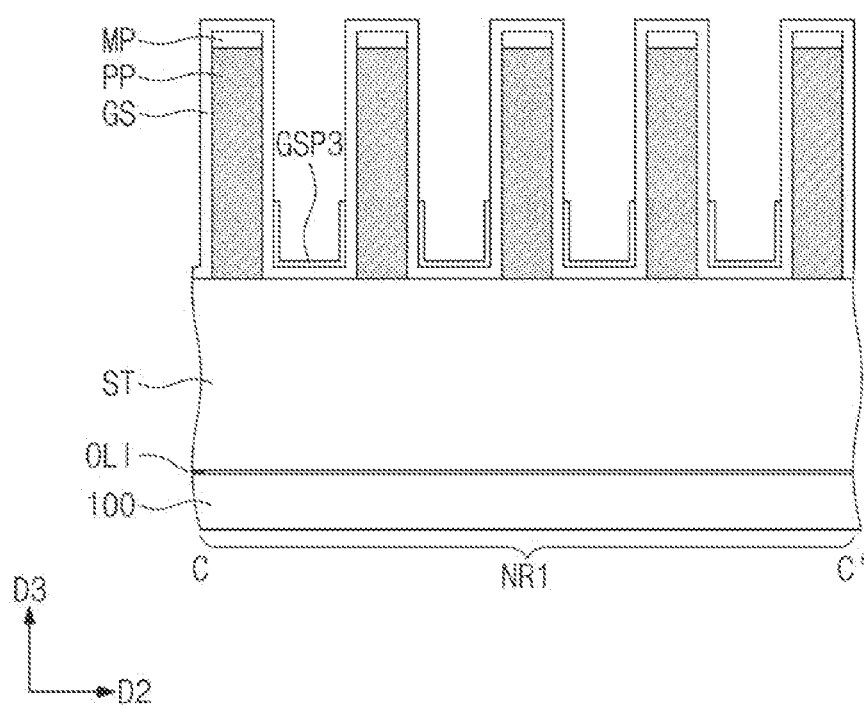
Figure 11D:
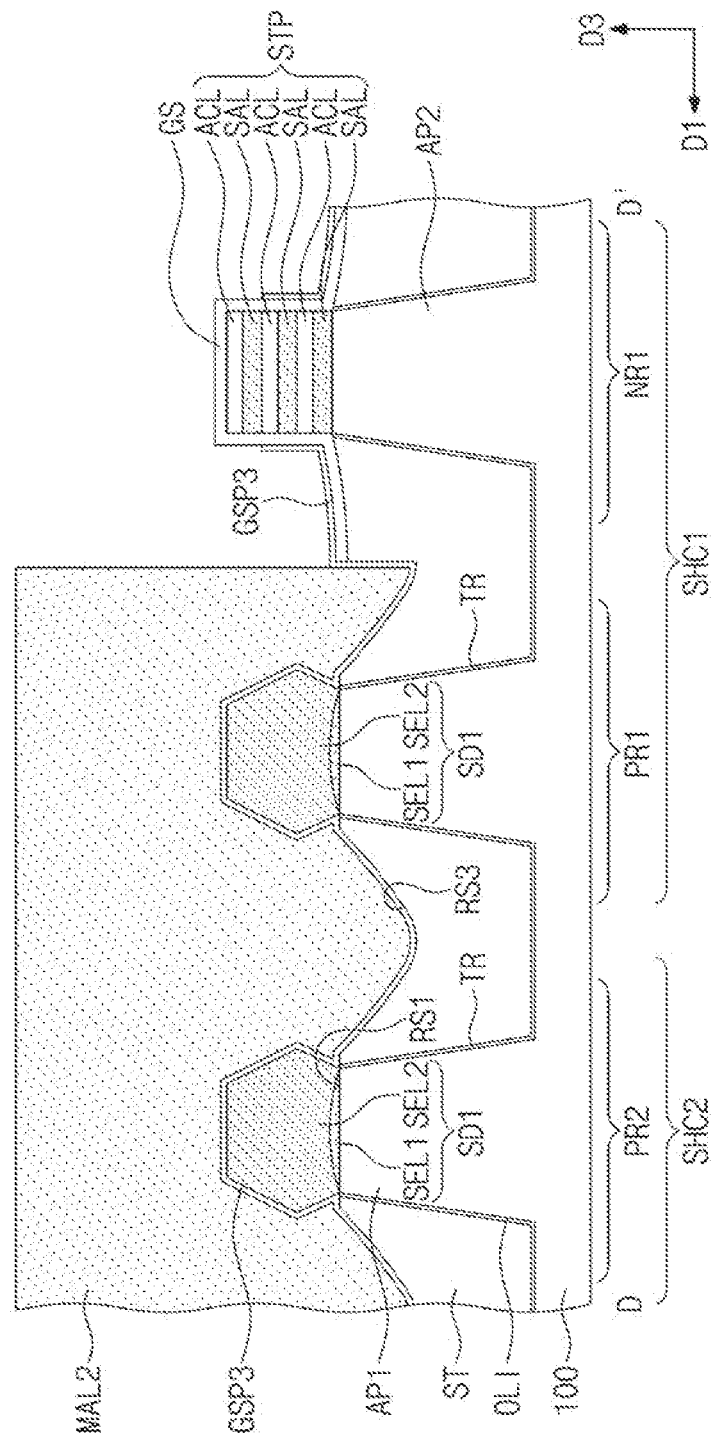
Figure 11E:
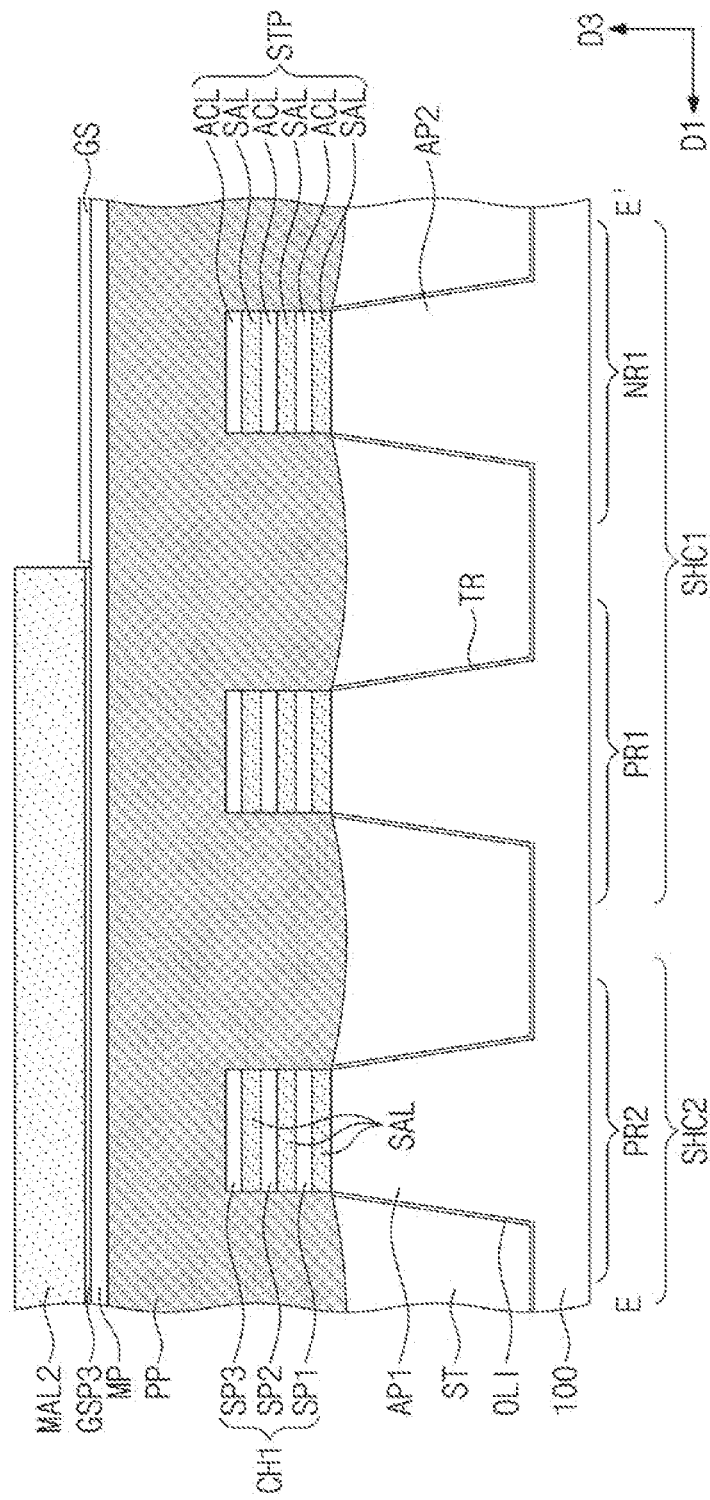

An upper portion of the third insulating layer GSP3 on the first and second NMOSFET regions NR1 and NR2 exposed by the second mask layer MAL2 may be recessed. In detail, the recessing of the third insulating layer GSP3 may include a lateral etching process. Thus, an upper portion of the third insulating layer GSP3 may be removed, and only a lower portion of the third insulating layer GSP3 may be left. For example, as illustrated in FIGS. 11C and 11D, the third insulating layer GSP3 adjacent to an upper portion of the sacrificial pattern PP may be removed, and the third insulating layer GSP3 adjacent to a lower portion of the sacrificial pattern PP may be left. The third insulating layer GSP3 on the uppermost active layer ACL may be removed, and only the third insulating layer GSP3 adjacent to a lower portion of the stacking pattern STP may be left.

As a result of the horizontal etching process performed on the third insulating layer GSP3, the gate spacer GS, which includes only the first and second insulating layers GSP1 and GSP2, may be left on a top surface of the stacking pattern STP. By contrast, the gate spacer GS on the lower portion of the sacrificial pattern PP (i.e., the device isolation layer ST) may further include the third insulating layer GSP3 that remains after the horizontal etching process. As a result, the lower portion LWP of the second gate spacer GS2 on the device isolation layer ST may be formed to have a thickness that is larger than a thickness of the upper portion UPP, as previously described with reference to FIG. 6C.

Referring to FIGS. 12A to 12E, an anisotropic etching process may be performed on the gate spacer GS on the first and second NMOSFET regions NR1 and NR2 exposed by the second mask layer MAL2. Accordingly, the stacking pattern STP between adjacent ones of the sacrificial patterns PP may be exposed. The second recesses RS2 may be formed by etching the exposed stacking pattern STP. The second recesses RS2 may be formed by the same method as that for the first recesses RS1 described above.

The first to third semiconductor patterns SP1, SP2, and SP3, which are sequentially stacked between adjacent ones of the second recesses RS2, may be formed from the active layers ACL. The first to third semiconductor patterns SP1, SP2, and SP3 between the adjacent ones of the second recesses RS2 may constitute the second channel pattern CH2.

Figure 12A:
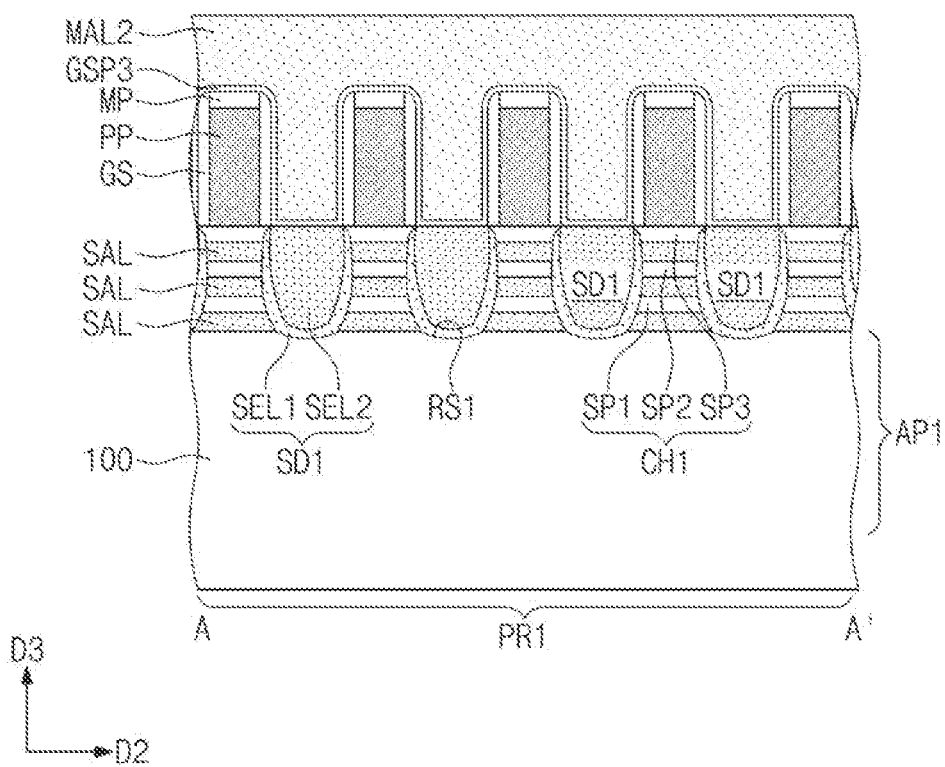
Figure 12B:
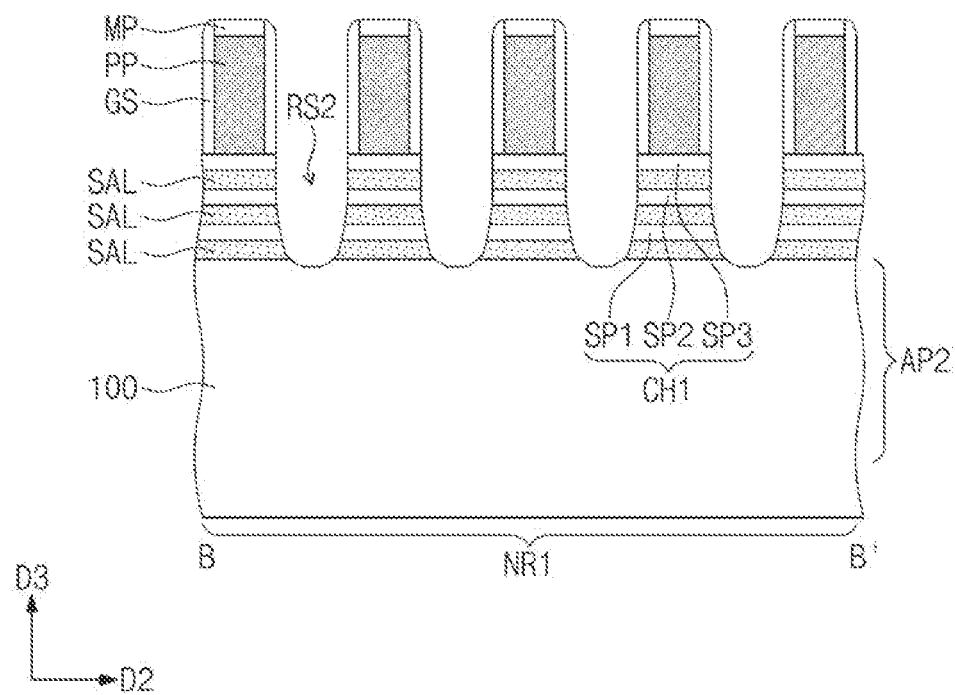
Figure 12C:
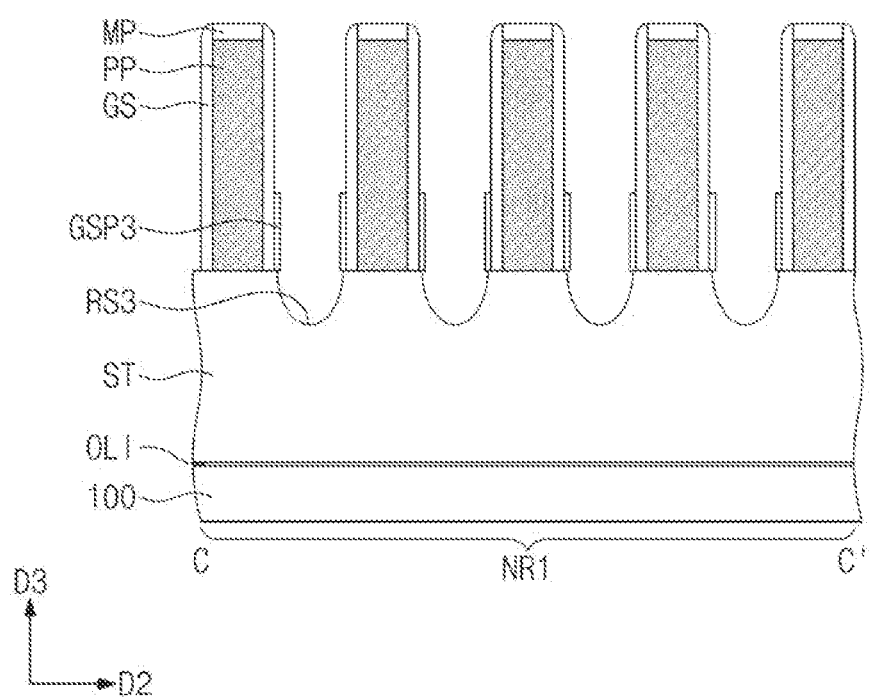
Figure 12D:
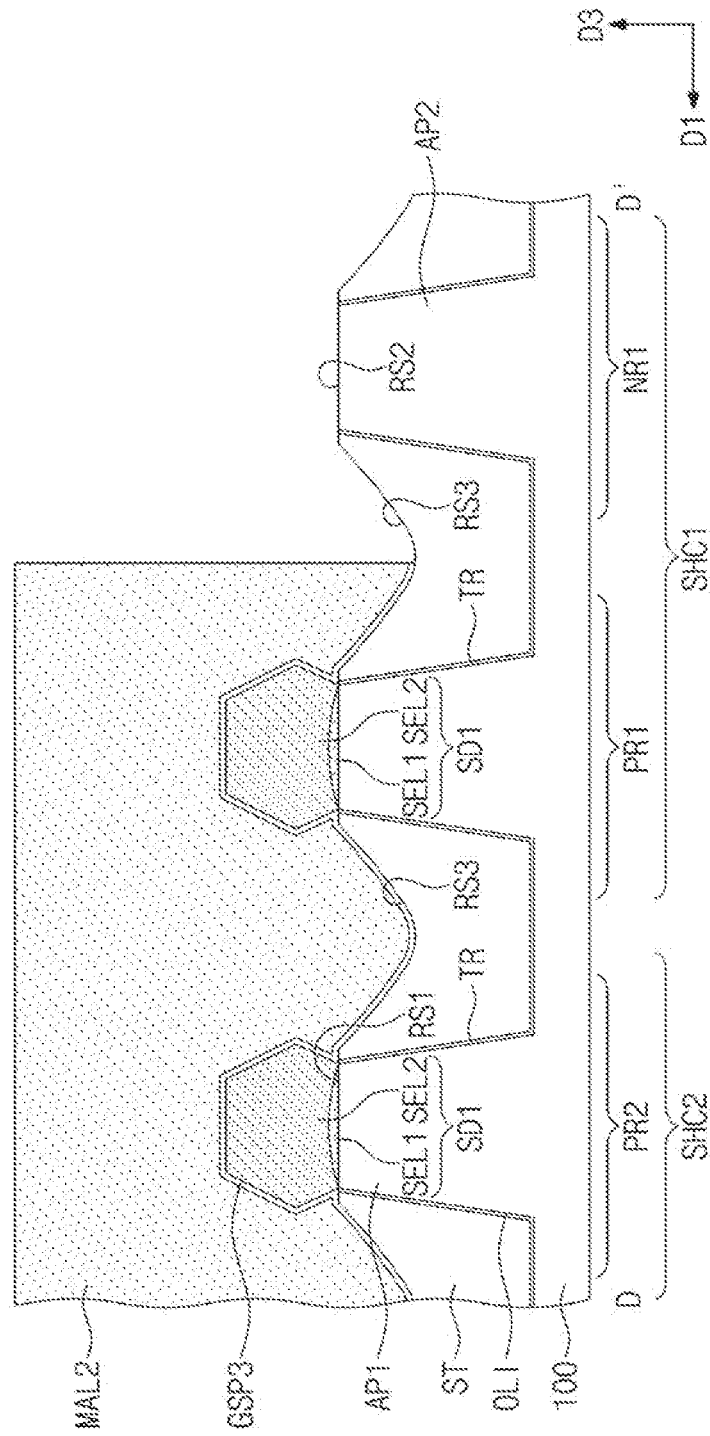
Figure 12E:
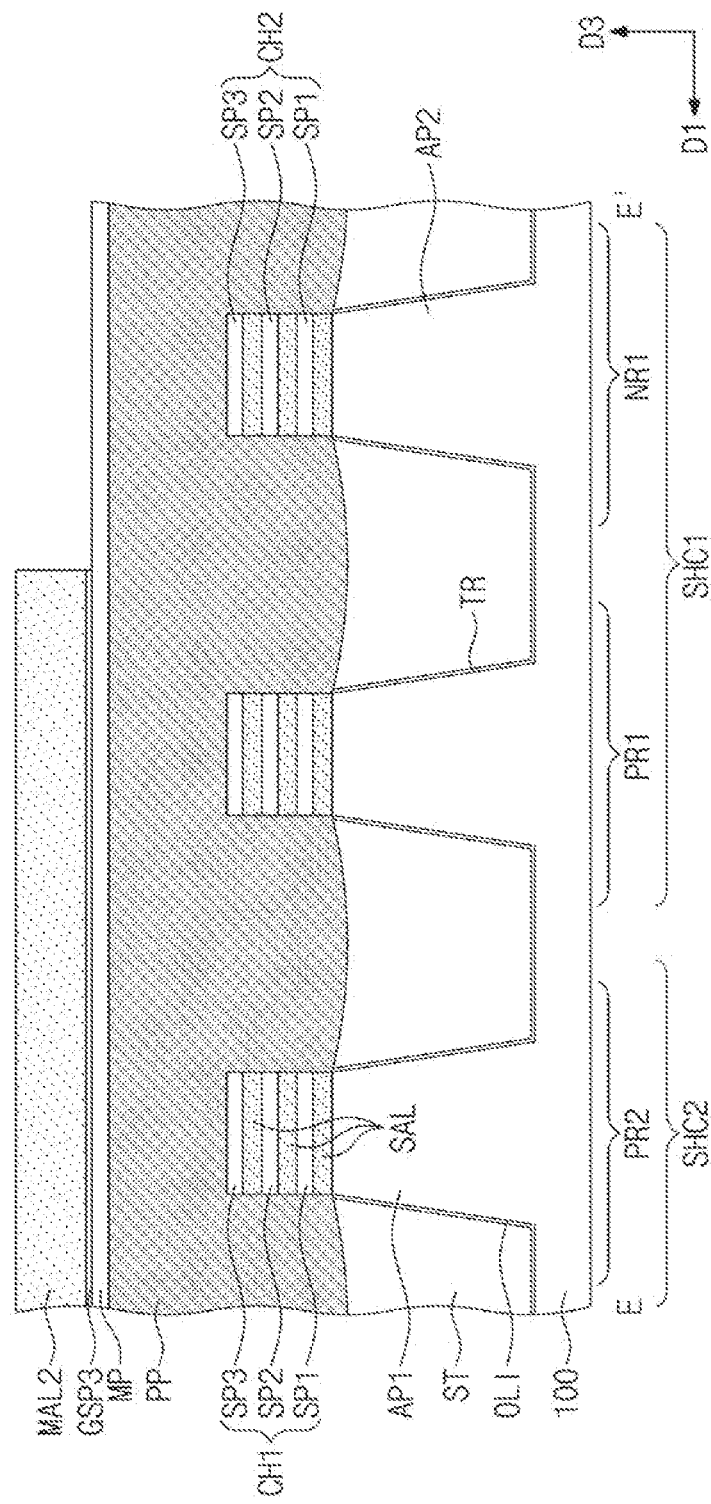
Figure 13A:
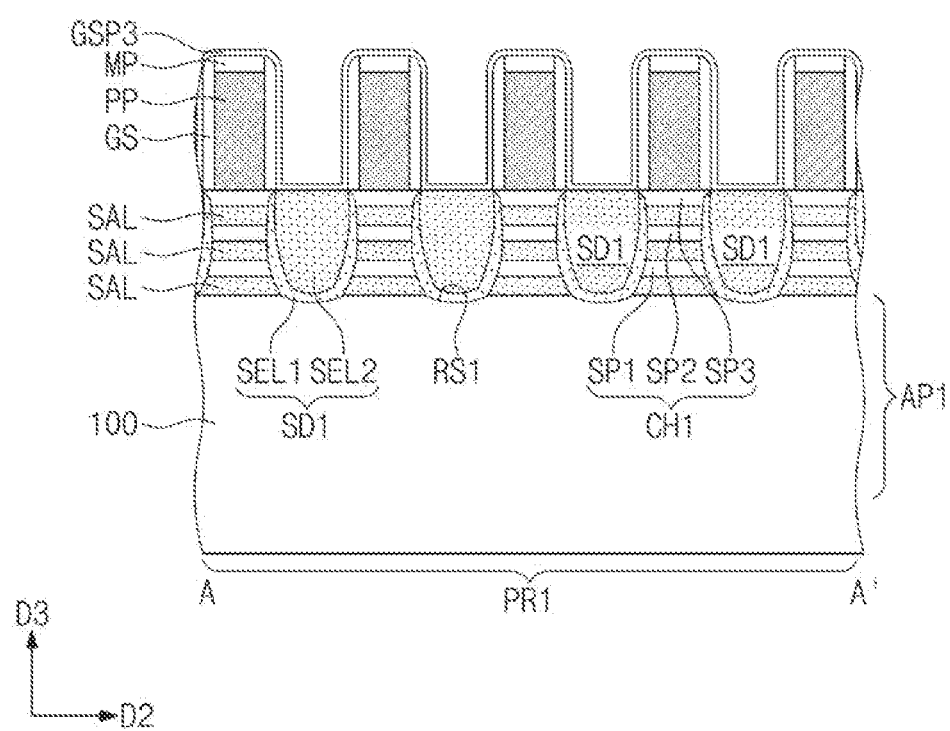
Figure 13B:
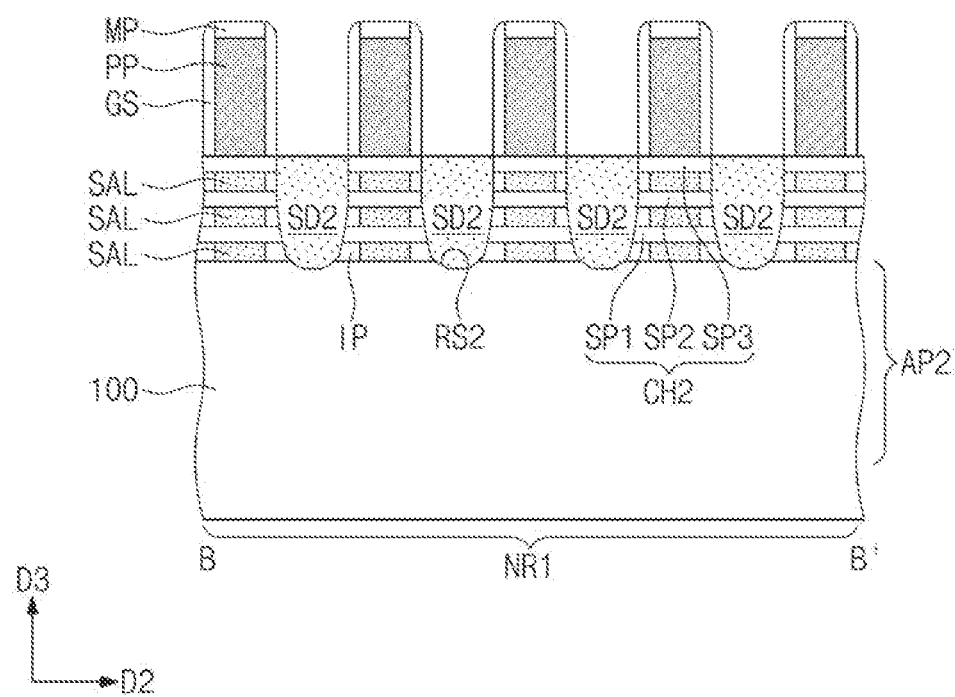
Figure 13C:
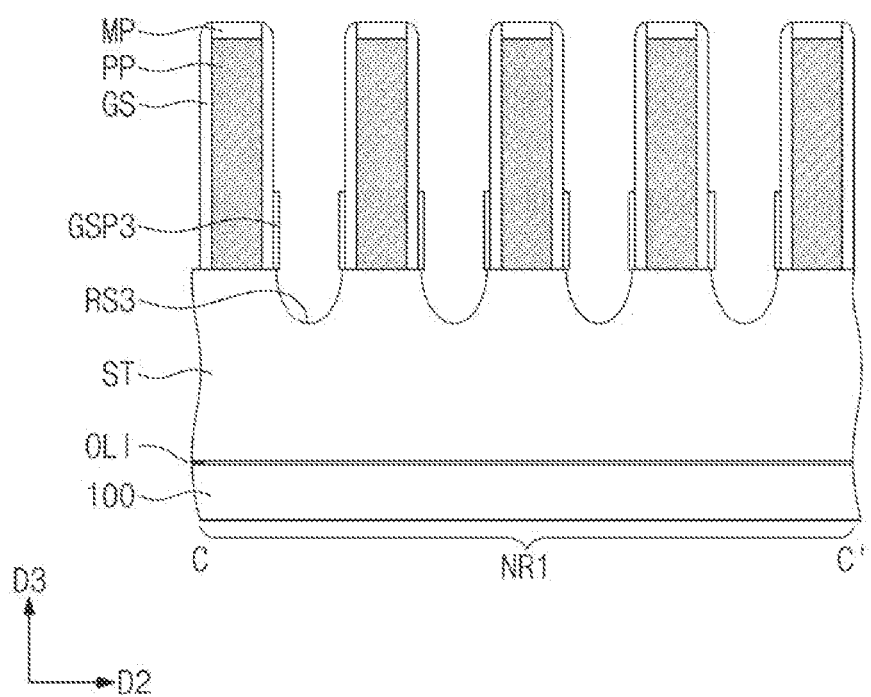
Figure 13D:
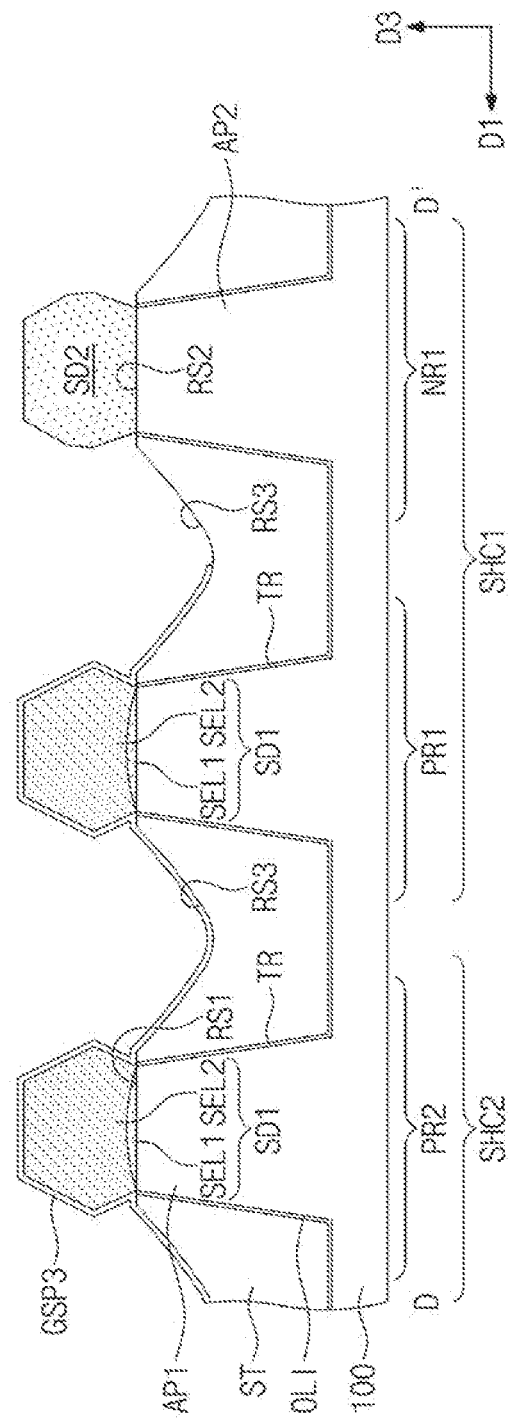
Figure 13E:
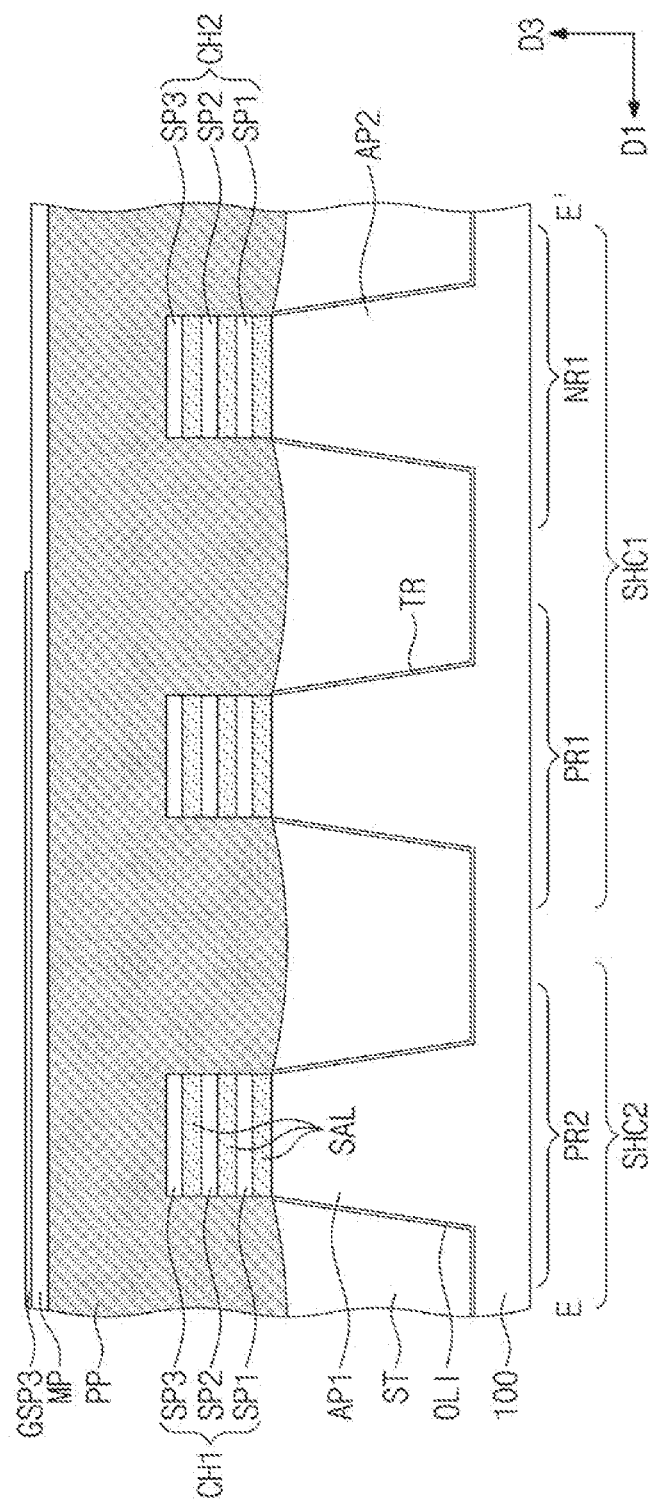
Figure 14A:
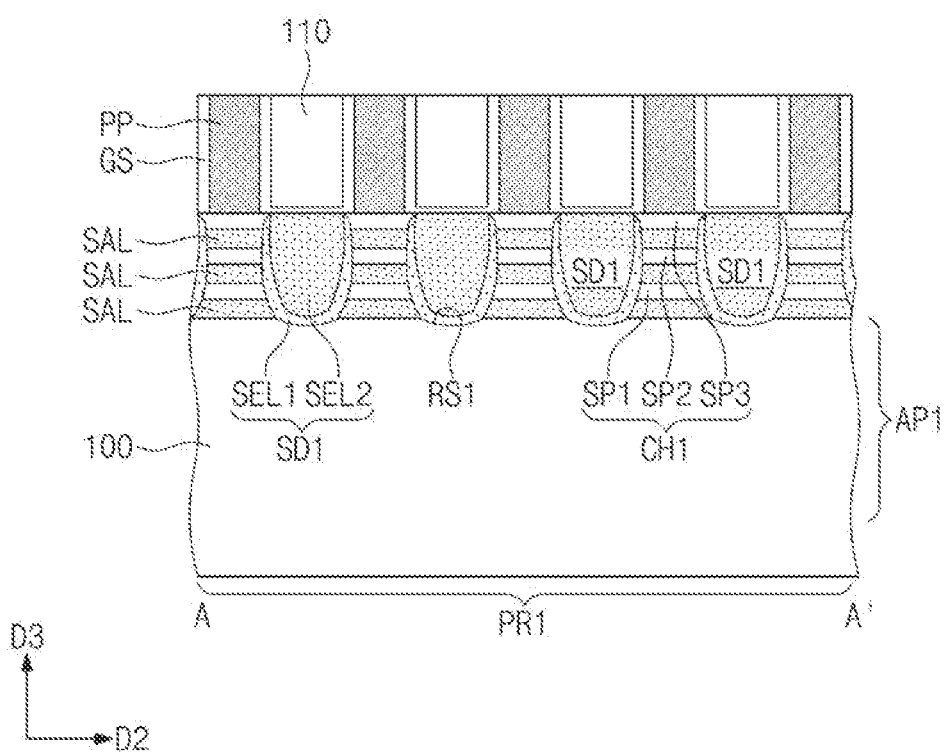
Figure 14B:
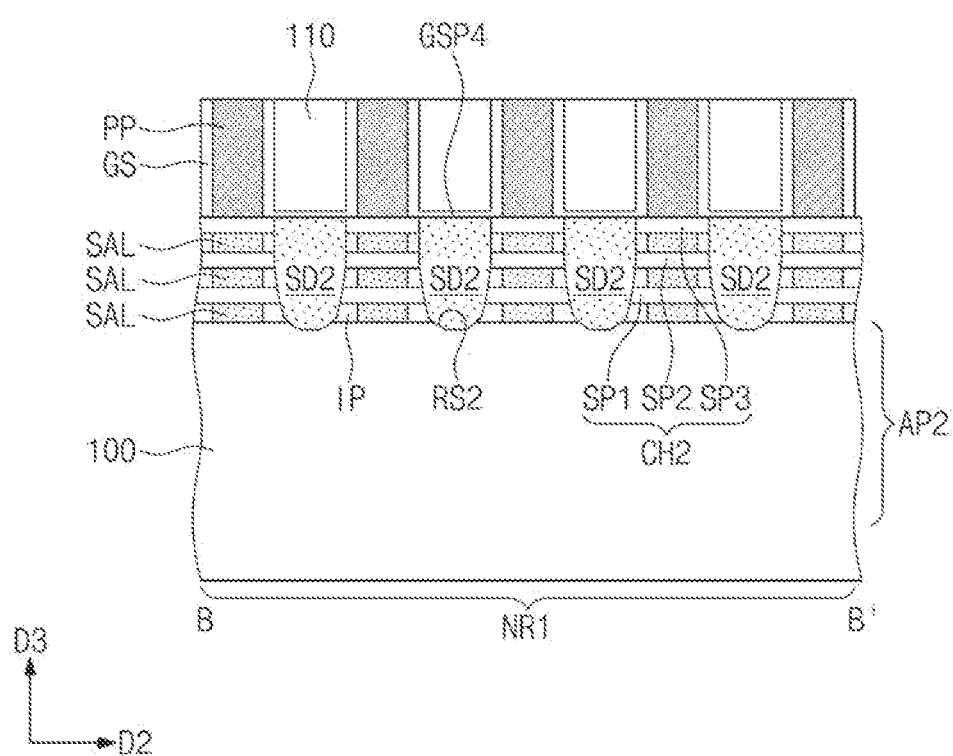
Figure 14C:
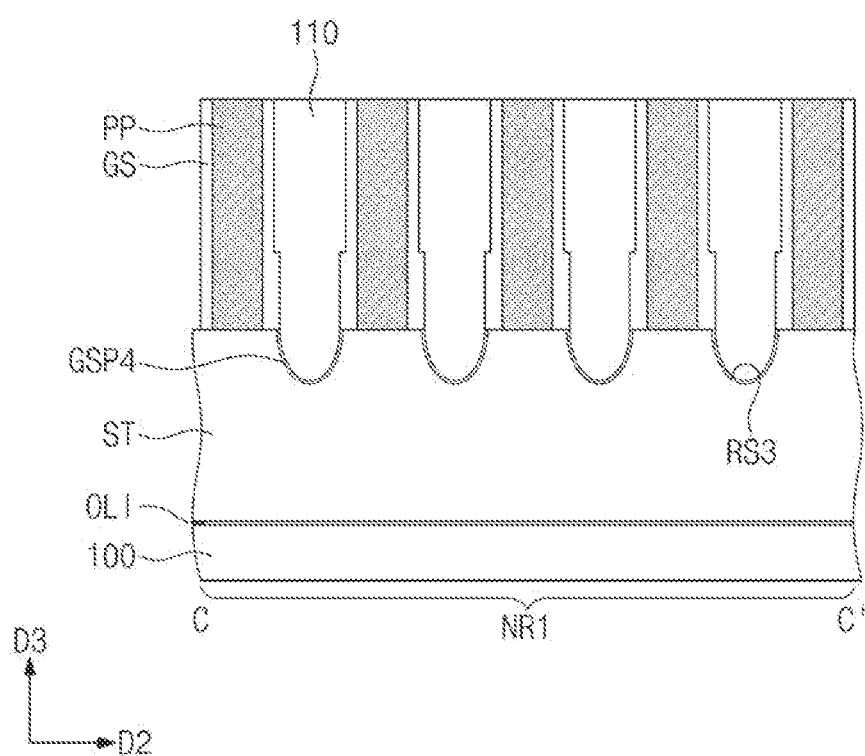
Figure 14D:
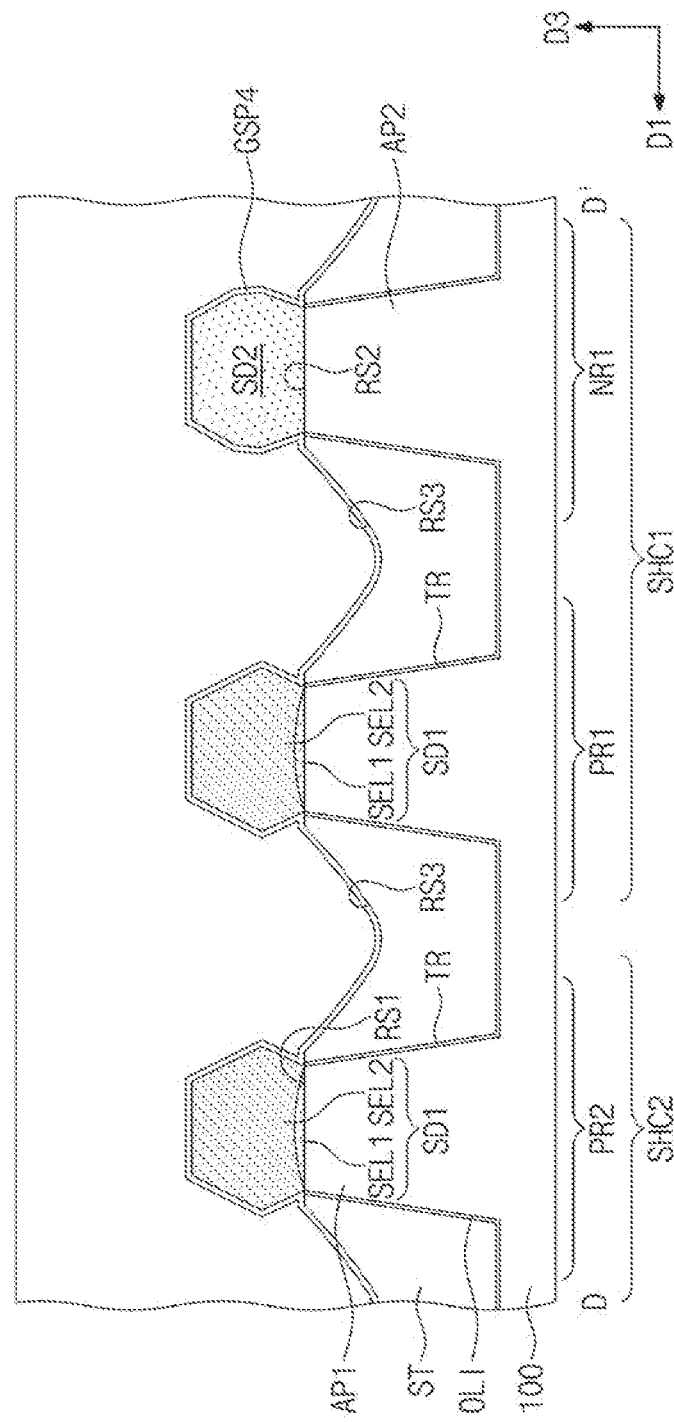
Figure 14E:
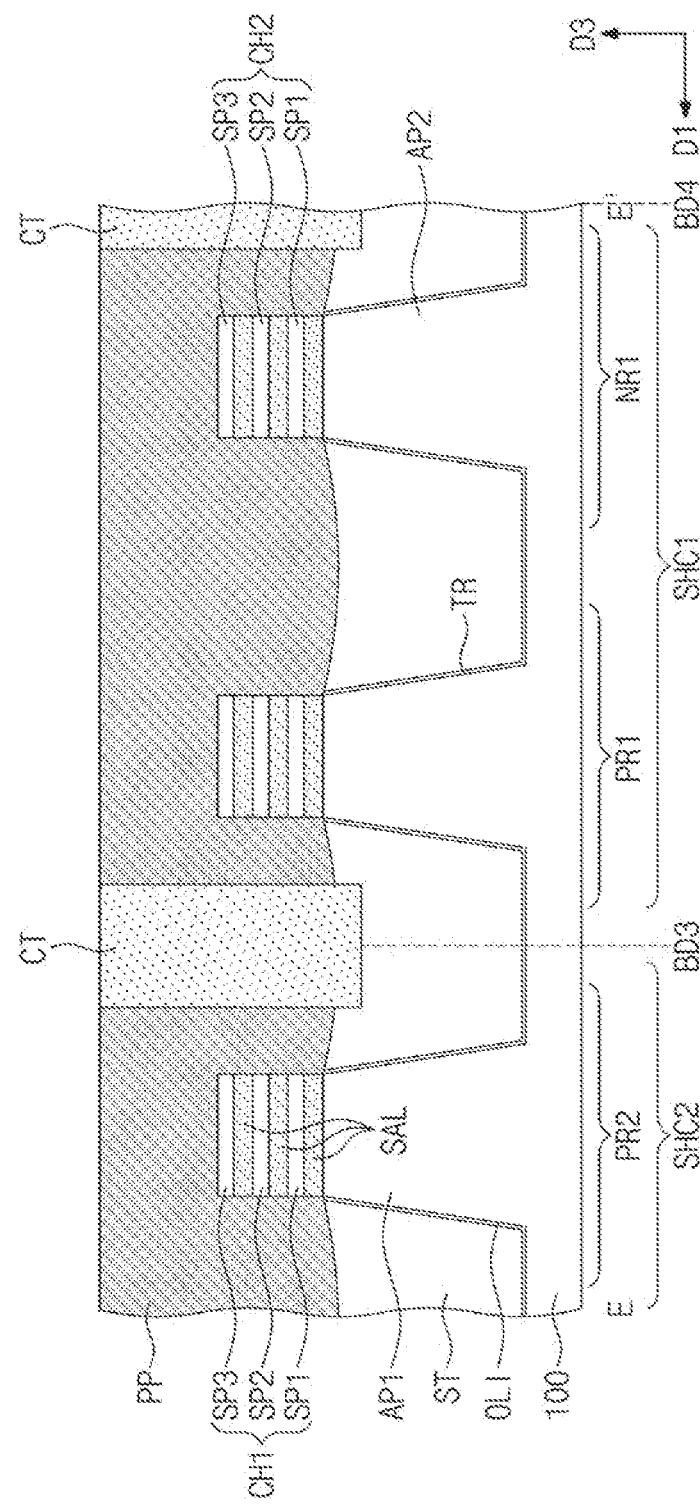
Figure 17:
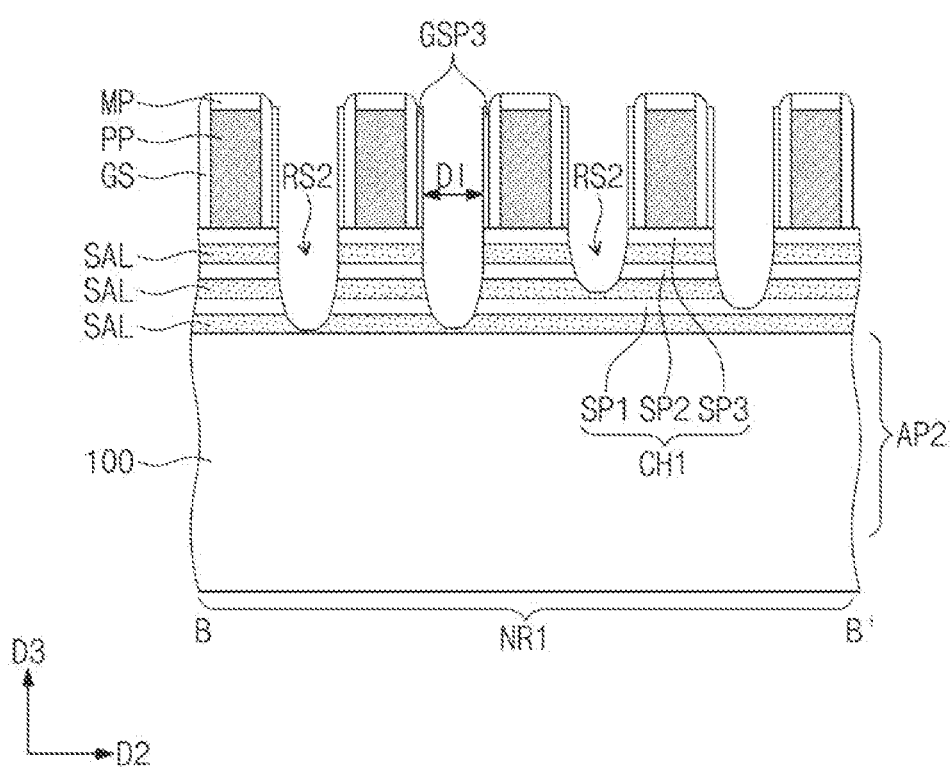
FIG. 17 is a sectional view illustrating a semiconductor device, according to a comparative example and corresponding to FIG. 12B.

FIG. 17 is a sectional view illustrating a semiconductor device according to a comparative example and corresponding to FIG. 12B. Referring to FIG. 17, if the third insulating layer GSP3 is not recessed or is left as it is, the gate spacer GS may have an increased thickness, due to the third insulating layer GSP3 adjacent to the upper portion of the sacrificial pattern PP. For example, a thickness of the upper portion UPP of the second gate spacer GS2 of FIG. 6C may be increased. Thus, an exposure distance DI between adjacent ones of the sacrificial patterns PP may be reduced.

In the case where the exposure distance DI is reduced, an etching margin for forming the second recess RS2 may be reduced. Accordingly, the second recess RS2 may have a bottom that is higher than the lowermost one of the sacrificial layers SAL. For example, an unetch defect, in which the second recess RS2 does not completely penetrate the stacking pattern STP, may occur. If the second recess RS2 does not penetrate the lowermost one of the sacrificial layers SAL, a contact failure may occur between adjacent ones of the gate electrodes GE when the lowermost one of the sacrificial layers SAL is replaced with the gate electrode GE.

Meanwhile, according to an embodiment of the inventive concept, as illustrated in FIG. 12B, it may be possible to fully remove the third insulating layer GSP3, which is adjacent to the upper portion of the sacrificial pattern PP, through the recessing of the third insulating layer GSP3. Accordingly, the thickness of the upper portion of the gate spacer GS may be reduced. This may make it possible to secure an etching margin for forming the second recess RS2 and to prevent an unetch defect of the second recess RS2. As a result, the semiconductor device according to an embodiment of the inventive concept may have high reliability.

Referring to FIGS. 13A to 13E, the second source/drain patterns SD2 may be formed in the second recesses RS2, respectively. In detail, the second source/drain pattern SD2 may be formed by performing a third SEG process, in which an inner surface of the second recess RS2 is used as a seed layer. In an embodiment, the second source/drain pattern SD2 may be formed of or may include the same semiconductor material (e.g., Si) as the substrate 100. The second source/drain pattern SD2 may be doped to have a second conductivity type (e.g., n-type). The inner spacers IP may be respectively formed between the second source/drain pattern SD2 and the sacrificial layers SAL.

Referring to FIGS. 14A to 14E, the fourth insulating layer GSP4 may be conformally formed on the entire top surface of the substrate 100. Thus, the third and fourth insulating layers GSP3 and GSP4 may be provided on the first source/drain pattern SD1 (e.g., see FIG. 6A). The fourth insulating layer GSP4 may be provided on the second source/drain pattern SD2 (e.g., see FIG. 6B). The first to fourth insulating layers GSP1 to GSP4 may constitute the gate spacer GS.

The first interlayer insulating layer 110 may be formed to cover the hard mask patterns MP and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by filling a space, which is formed by removing the sacrificial pattern PP, with an insulating material.

Referring to FIGS. 15A to 15D, the exposed sacrificial patterns PP may be selectively removed. As a result of the removal of the sacrificial patterns PP, an outer region ORG exposing the first and second channel patterns CH1 and CH2 may be formed (e.g., see FIG. 15E). The removal of the sacrificial patterns PP may include a wet etching process which is performed using an etching solution capable of selectively etching polysilicon.

Figure 15A:
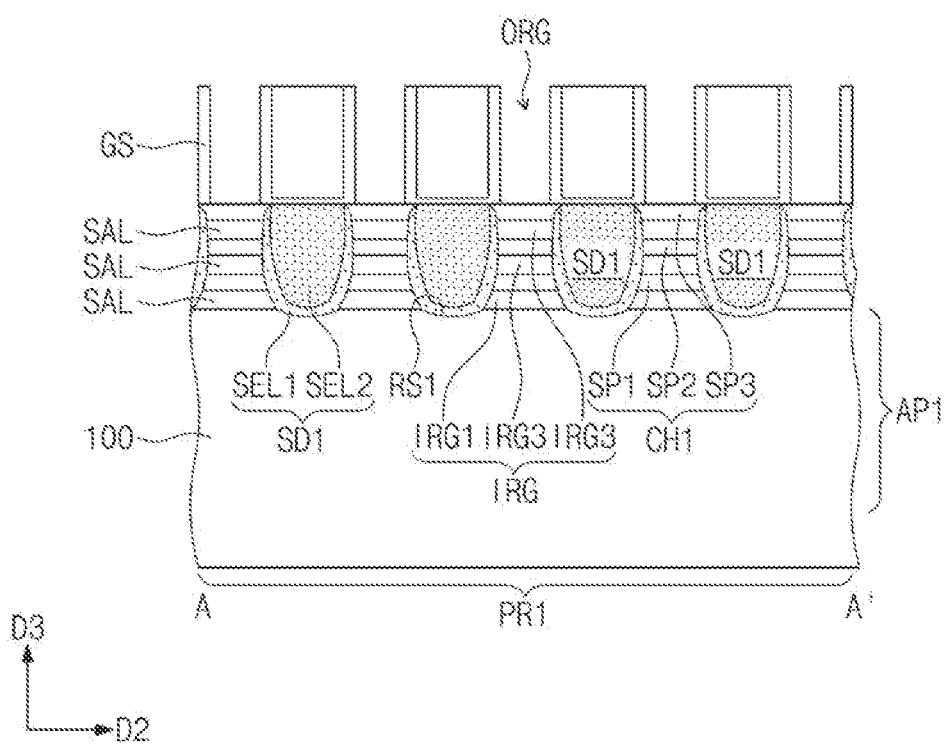
Figure 15B:
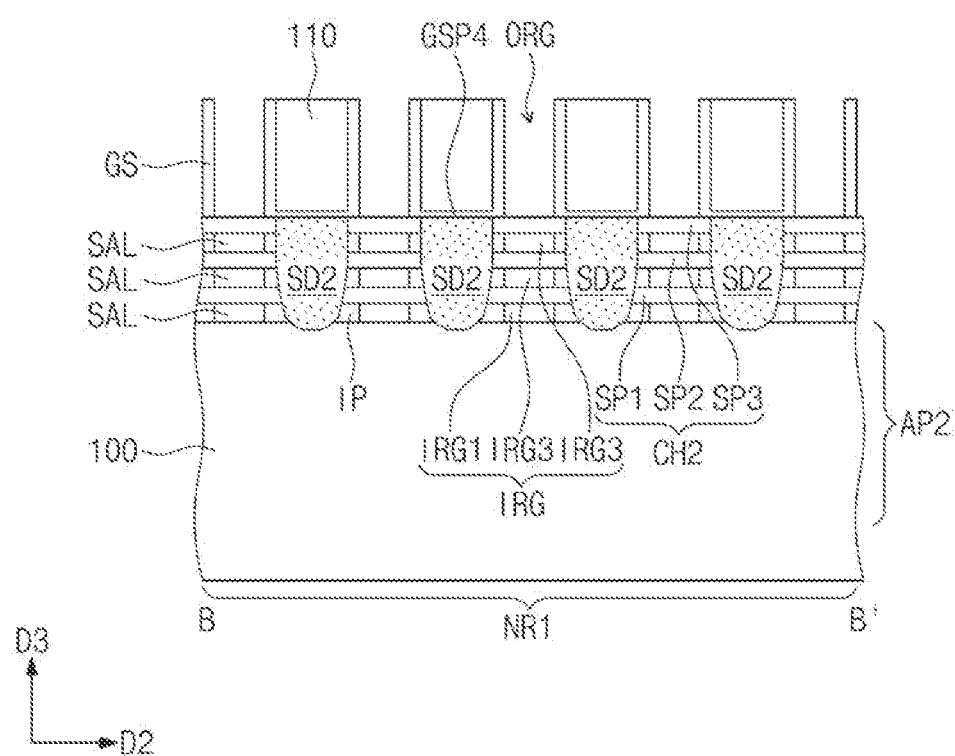
Figure 15C:
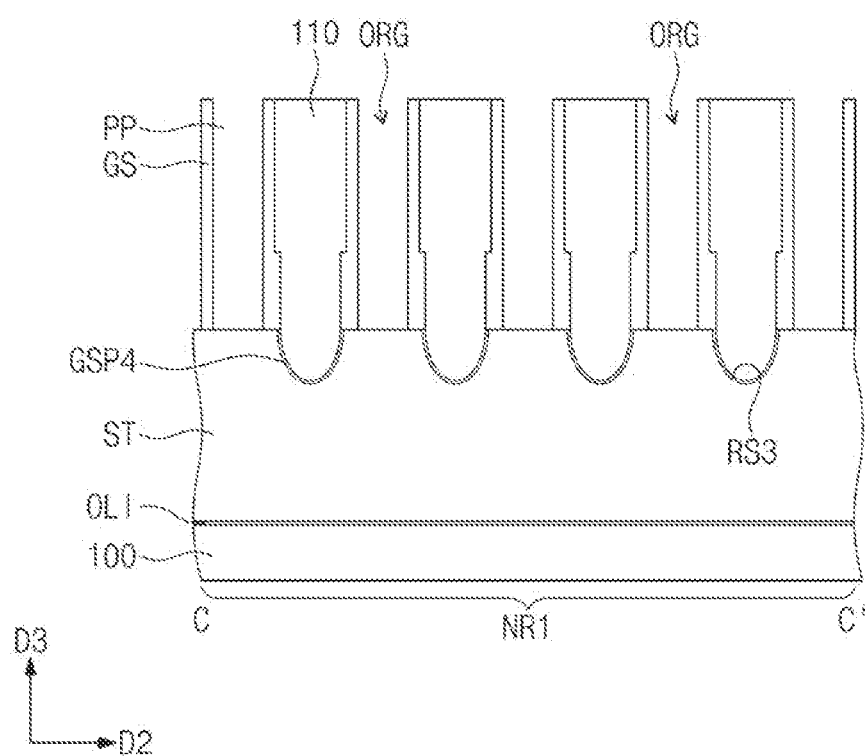
Figure 15D:
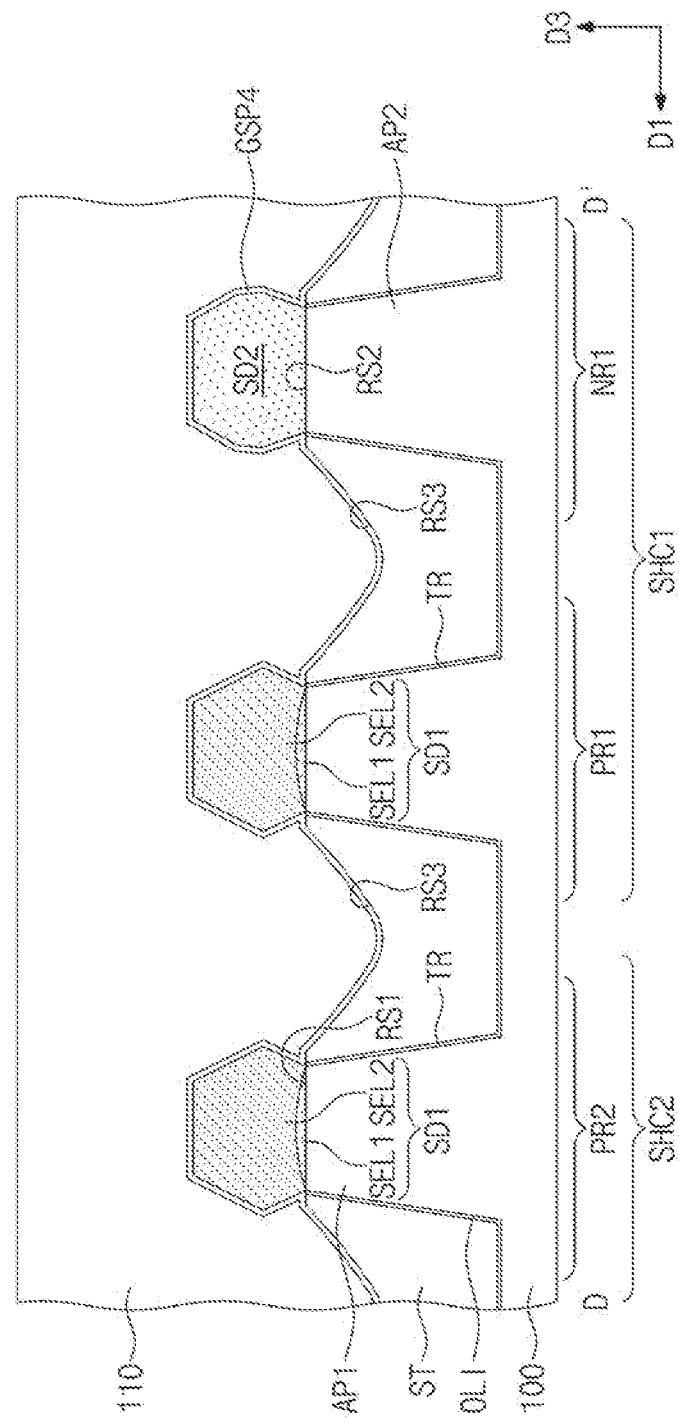
Figure 15E:
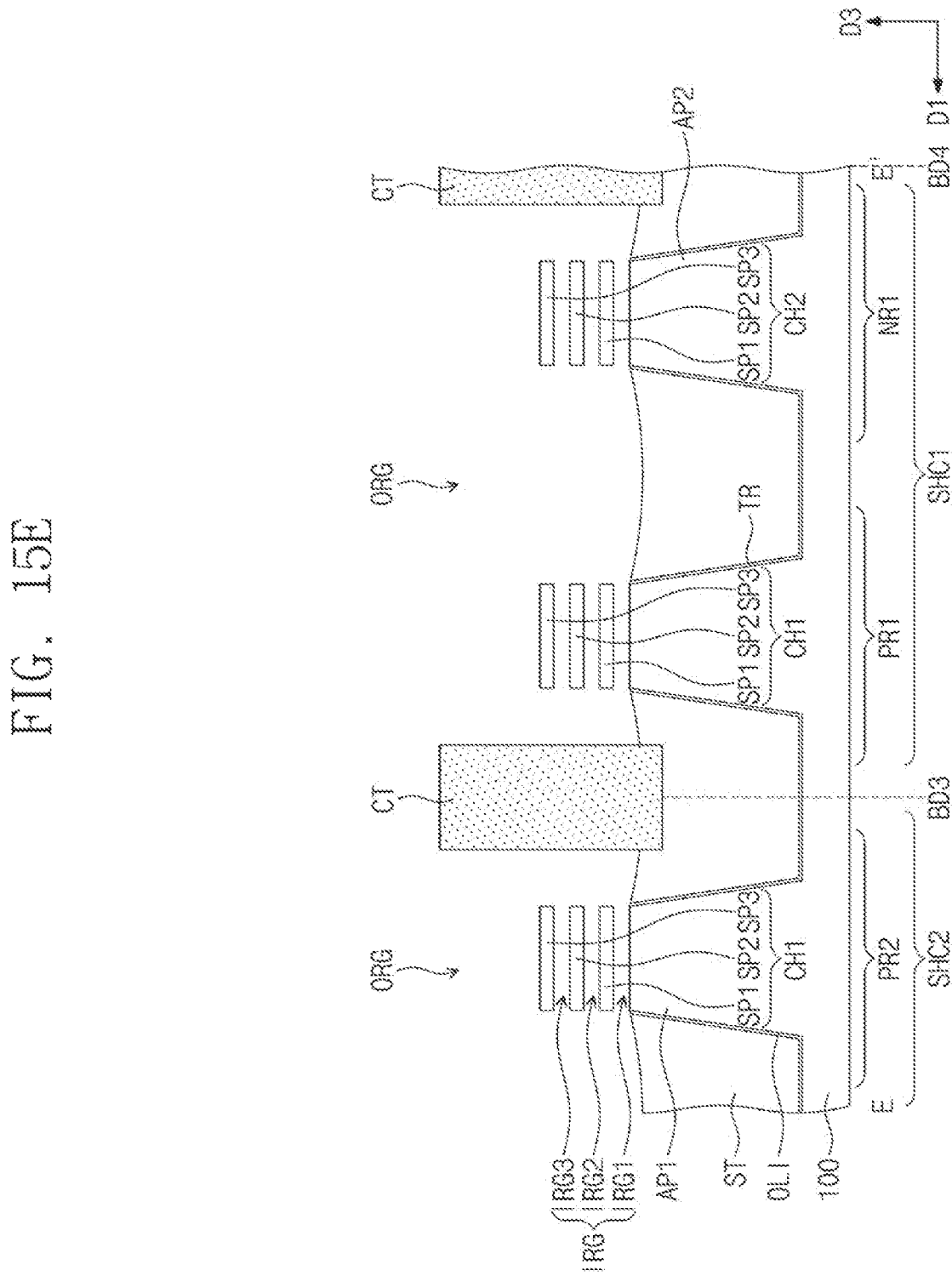
Figure 16A:
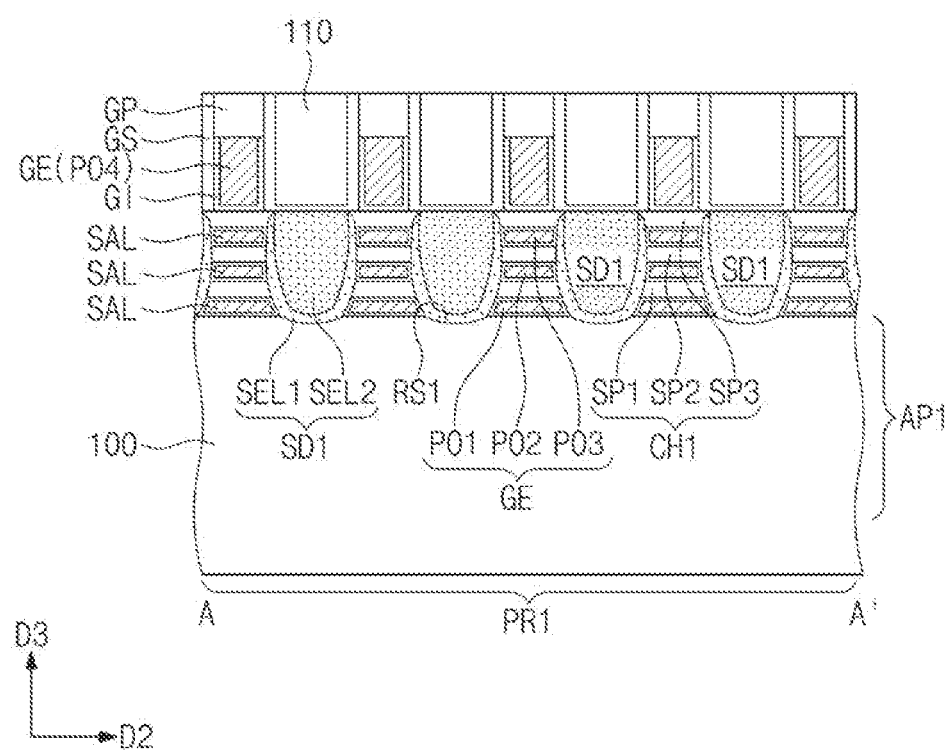
Figure 16B:
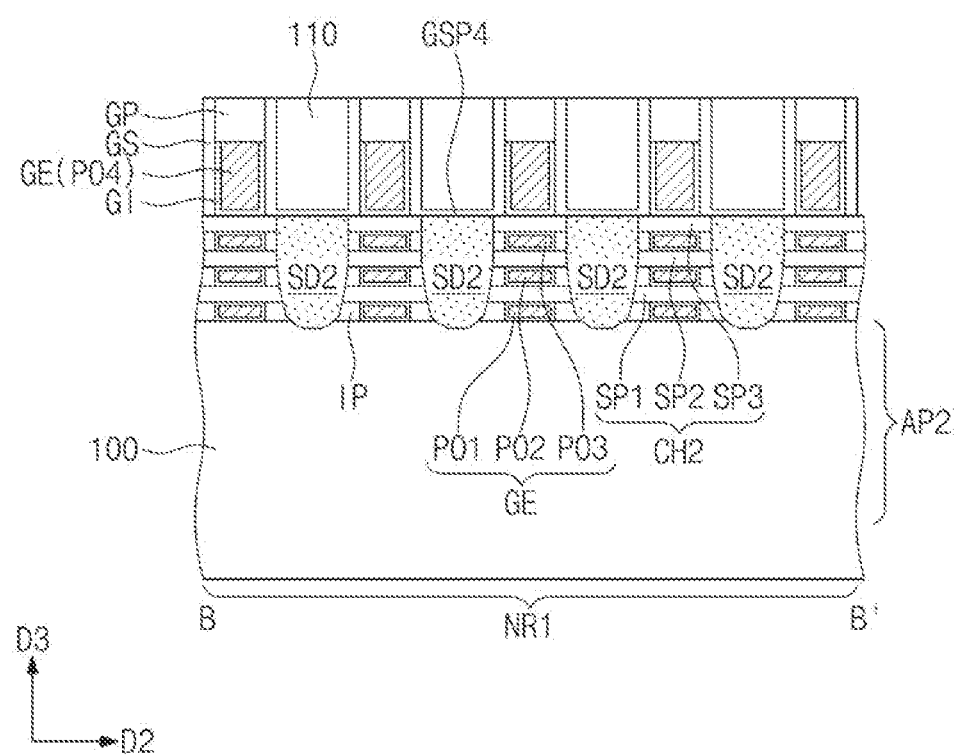
Figure 16C:
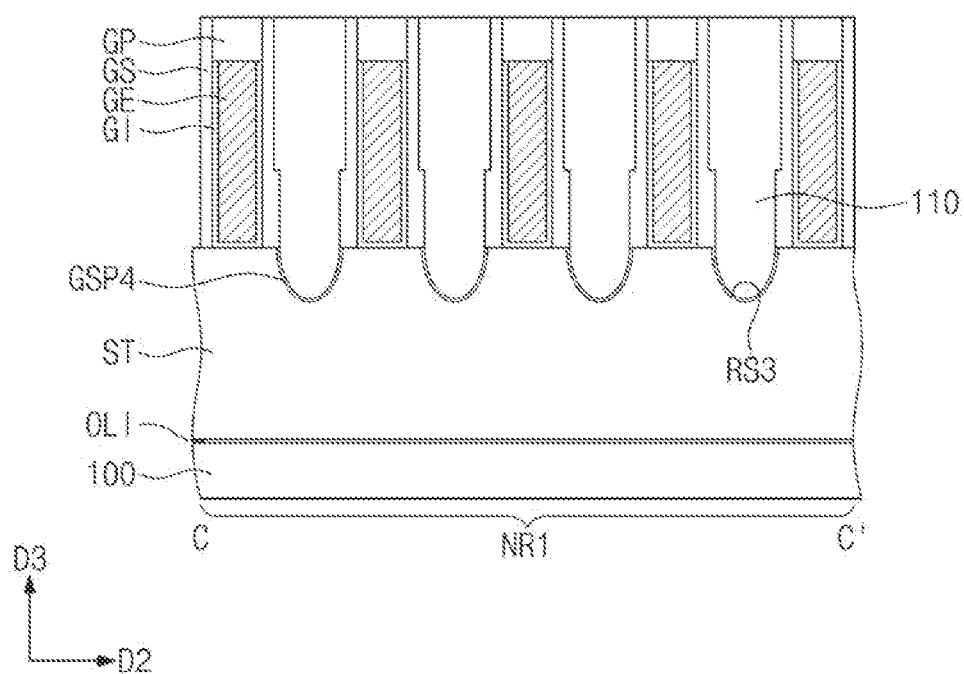
Figure 16D:
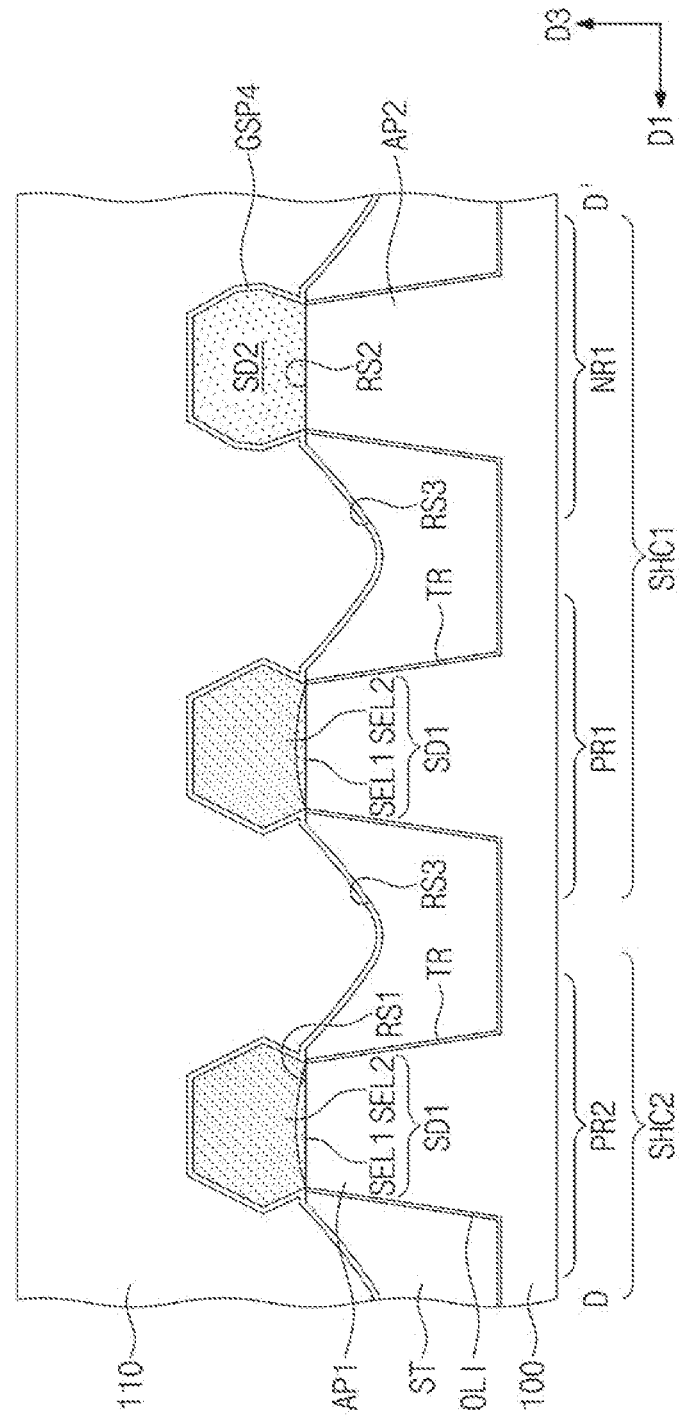
Figure 16E:
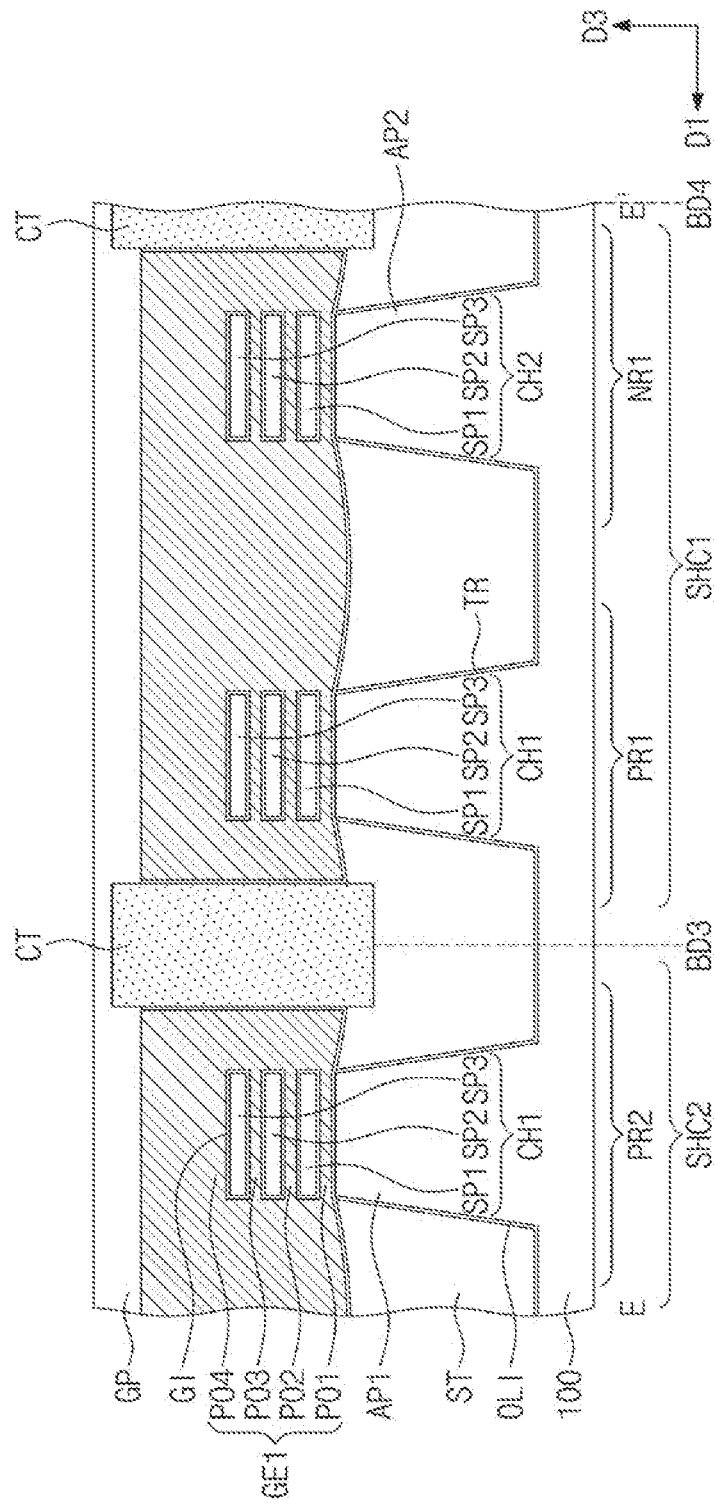

The sacrificial layers SAL exposed through the outer region ORG may be selectively removed to from inner regions IRG (e.g., see FIG. 15E). In detail, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may have a high etch rate for silicon-germanium whose germanium concentration is higher than 10 at %.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be chosen to quickly remove the sacrificial layer SAL having a relatively high germanium concentration. Meanwhile, the first source/drain pattern SD1 on the first and second PMOSFET regions PR1 and PR2 may be protected from the etching process by the first semiconductor layer SEL1 having a relatively low germanium concentration.

Since the sacrificial layers SAL are selectively removed, only the stacked first to third semiconductor patterns SP1, SP2, and SP3 may be left on each of the first and second active patterns AP1 and AP2. Empty regions, which are formed by removing the sacrificial layers SAL, may form first to third inner regions IRG1, IRG2, and IRG3, respectively. In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Figure 18:
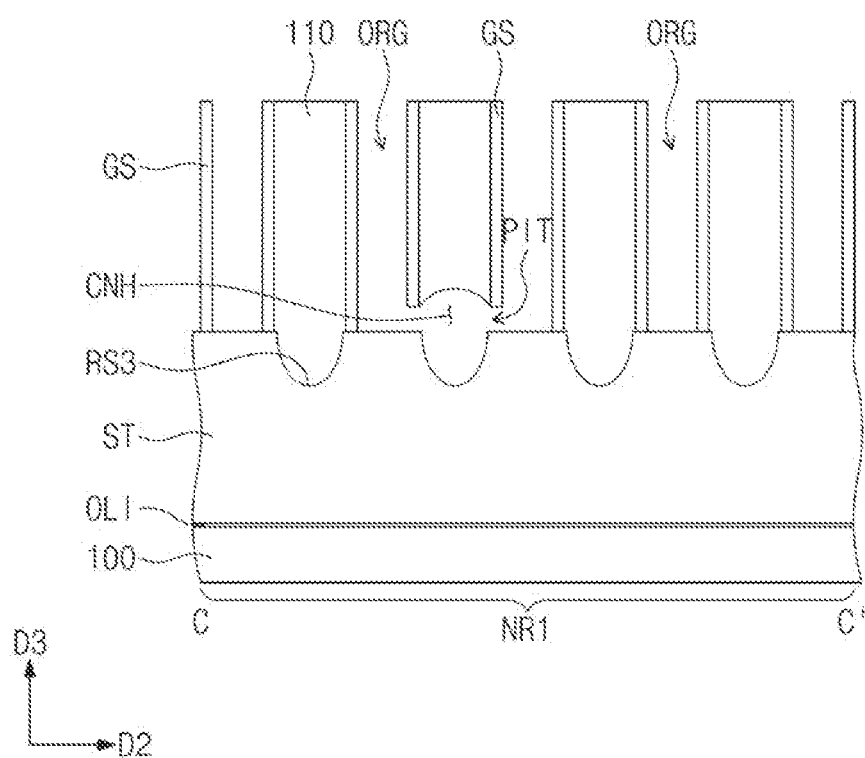
FIG. 18 is a sectional view illustrating a semiconductor device, according to a comparative example and corresponding to FIG. 15C.
Figure 19A:
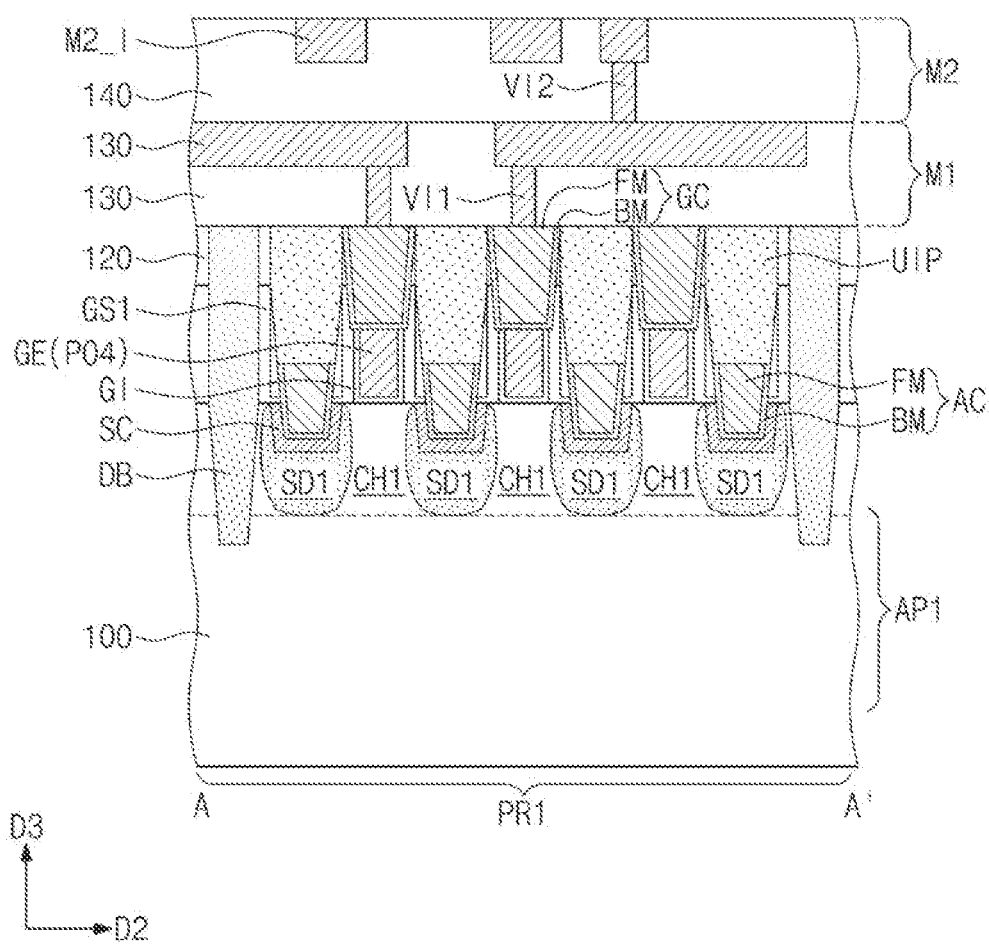
FIGS. 19A to 19E are sectional views which are respectively taken along the lines A-A', B-B', C-C', D-D', and E-E' of FIG. 4 to illustrate a semiconductor device, according to an example embodiment of the inventive concept.
Figure 19B:
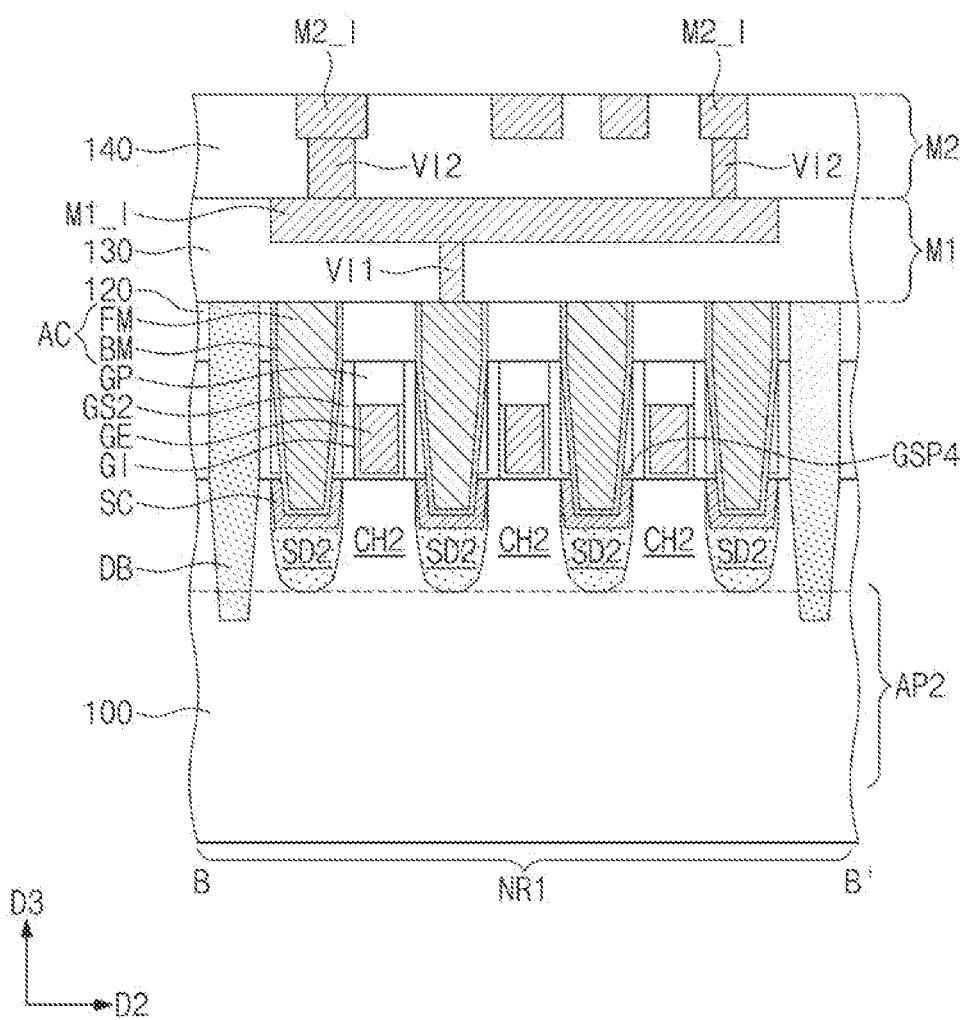
Figure 19C:
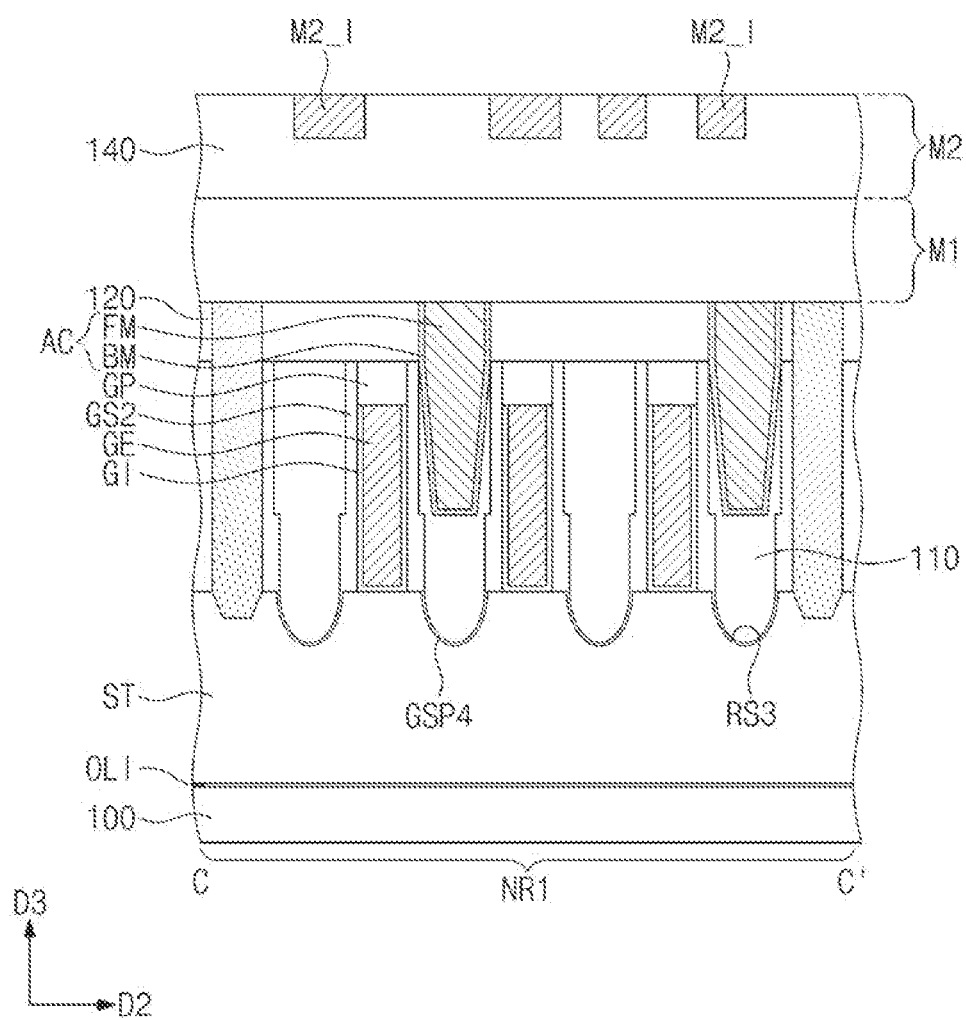
Figure 19D:
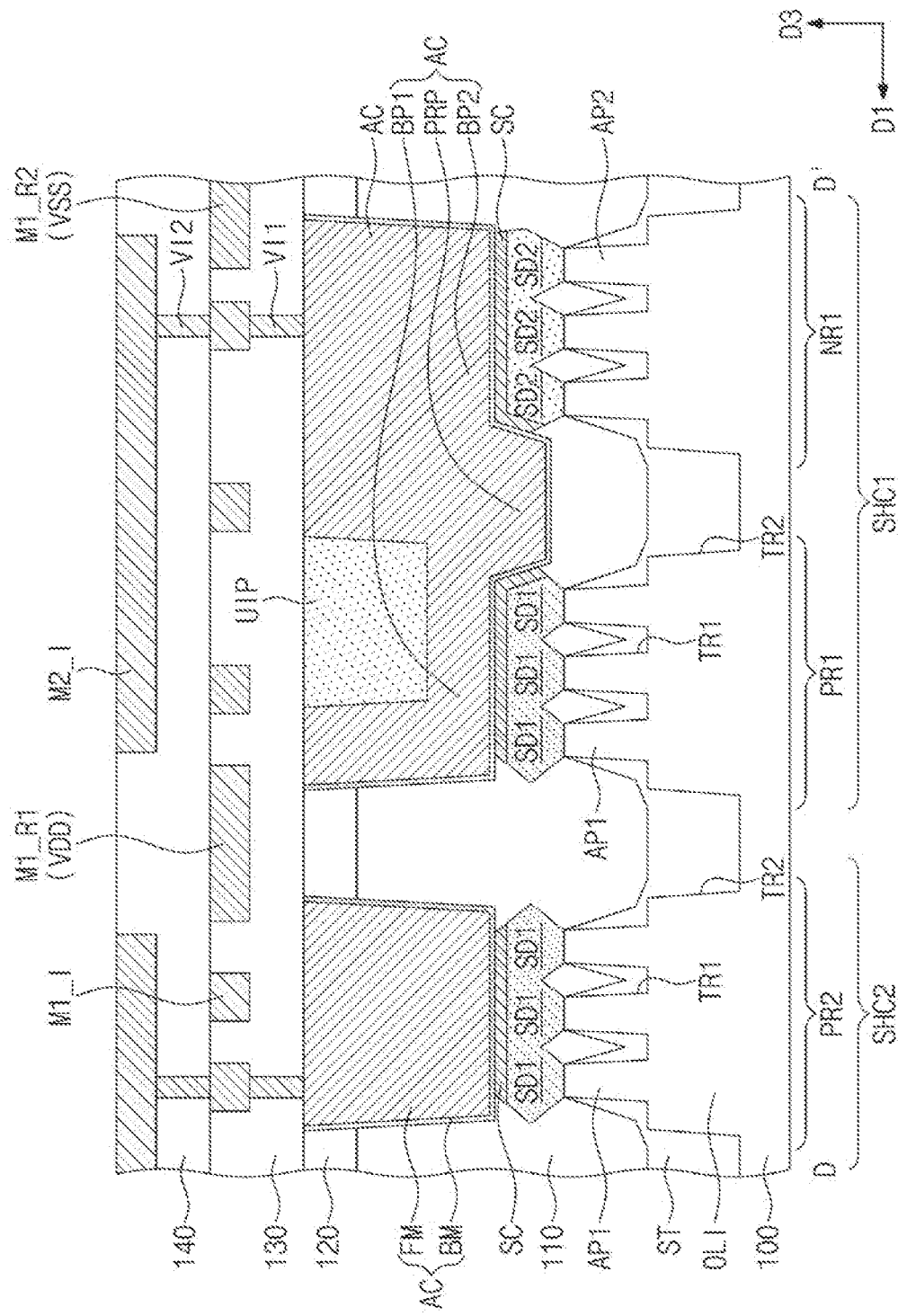
Figure 19E:
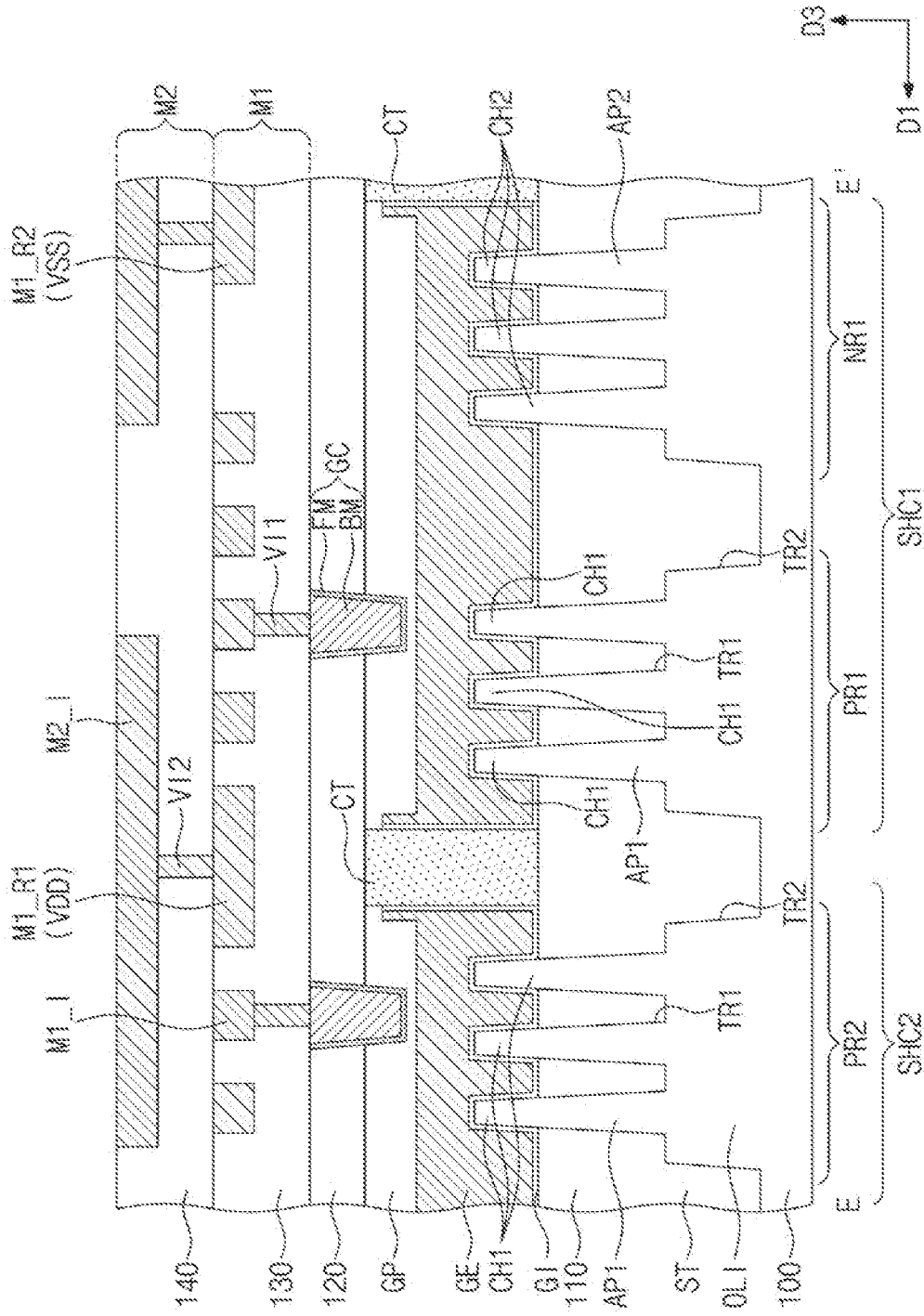

FIG. 18 is a sectional view illustrating a semiconductor device according to a comparative example and corresponding to FIG. 15C. Referring to FIG. 18, if the third insulating layer GSP3 is not formed, a lower portion of the gate spacer GS adjacent to the lower portion of the sacrificial pattern PP may have a relatively small thickness and the consequent weak property. Accordingly, during the removal process of the sacrificial pattern PP, a hole (i.e., pitting) PIT may be formed in the lower portion of the gate spacer GS. The first interlayer insulating layer 110 may be partially etched by an etching solution supplied through the pitting PIT of the gate spacer GS, and in this case, a connection hole CNH may be formed to connect adjacent ones of the outer regions ORG to each other. The pitting PIT and the connection hole CNH may lead to a process failure, in which the gate electrodes GE to be described below are in contact with each other or are in contact with the source/drain pattern SD1 or SD2. This may cause a big problem in reliability of the semiconductor device.

Meanwhile, according to an embodiment of the inventive concept, the lower portion of the gate spacer GS on the device isolation layer ST may be thicker than its upper portion, as illustrated in FIG. 15C. Accordingly, it may be possible to prevent a process failure, in which the pitting PIT is formed in the lower portion of the gate spacer GS as shown in FIG. 18, from occurring during the process of etching the sacrificial pattern PP. As a result, the semiconductor device according to an embodiment of the inventive concept may have high reliability.

Referring to FIGS. 16A to 16E, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed to have a reduced height. During the recessing of the gate electrode GE, an upper portion of the gate cutting pattern CT may be slightly recessed. The gate capping pattern GP may be formed on the recessed gate electrode GE.

Referring back to FIGS. 4 and 5A to 5E, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed at both sides of each of the first and second single height cells SHC1 and SHC2. The division structure DB may penetrate the second interlayer insulating layer 120 and the gate electrode GE and may be extended into the active pattern AP1 or AP2. The division structure DB may be formed of or may include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

FIGS. 19A to 19E are sectional views which are respectively taken along the lines A-A', B-B', C-C', D-D', and E-E' of FIG. 4 to illustrate a semiconductor device according to another embodiment of the inventive concept. In the following description, an element previously described with reference to FIGS. 4 and 5A to 5F may be identified by the same reference number without repeating an overlapping description thereof, for concise description.

Referring to FIGS. 4 and 19A to 19E, the device isolation layer ST may define the first active pattern AP1 and the second active pattern AP2 in an upper portion of the substrate 100. The first active pattern AP1 may be defined on each of the first and second PMOSFET regions PR1 and PR2, and the second active pattern AP2 may be defined on each of the first NMOSFET region NR1 and the second NMOSFET region NR2.

The device isolation layer ST may cover a side surface of a lower portion of each of the first and second active patterns AP1 and AP2. An upper portion of each of the first and second active patterns AP1 and AP2 may protrude above the device isolation layer ST (e.g., see FIG. 19E).

The first active pattern AP1 may include the first source/drain patterns SD1, which are provided in an upper portion thereof, and the first channel pattern CH1, which is provided between the first source/drain patterns SD1. The second active pattern AP2 may include the second source/drain patterns SD2, which are provided in an upper portion thereof, and the second channel pattern CH2, which is provided between the second source/drain patterns SD2.

Referring back to FIG. 19E, each of the first and second channel patterns CH1 and CH2 may not include the stacked first to third semiconductor patterns SP1, SP2, and SP3 previously described with reference to FIGS. 5A to 5E. Each of the first and second channel patterns CH1 and CH2 may be shaped like a single semiconductor pillar that protrudes above the device isolation layer ST.

The gate electrode GE may be provided on a top surface and opposite side surfaces of each of the first and second channel patterns CH1 and CH2. For example, the transistor according to the present embodiment may be a three-dimensional field-effect transistor (e.g., FinFET), in which the gate electrode GE is provided to three-dimensionally surround the channel patterns.

The first interlayer insulating layer 110 and the second interlayer insulating layer 120 may be provided on the substrate 100. The active contacts AC may be provided to penetrate the first and second interlayer insulating layers 110 and 120 and to be connected to the first and second source/drain patterns SD1 and SD2, respectively. The gate contact GC may be provided to penetrate the second interlayer insulating layer 120 and the gate capping pattern GP and to be connected to the gate electrode GE. The active contacts AC and gate contacts GC may be substantially the same as those in the previous embodiment described with reference to FIGS. 4 and 5A to 5E.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be substantially the same as those in the previous embodiment described with reference to FIGS. 4 and 5A to 5E.

In a semiconductor device according to an embodiment of the inventive concept, a thickness of a lower portion of a gate spacer on a device isolation layer may be larger than a thickness of its upper portion. Since the thickness of the upper portion of the gate spacer is relatively small, it may be possible to prevent an unetch defect of a recess filled with a source/drain pattern. Since the thickness of the lower portion of the gate spacer is relatively large, it may be possible to prevent a pitting failure, in which a lower portion of a gate electrode penetrates the lower portion of the gate spacer and protrudes outward. As a result, the semiconductor device according to an embodiment of the inventive concept may have high reliability.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate;
an active pattern on the substrate, wherein the active pattern extends in a first direction;
a device isolation layer provided on the substrate to define the active pattern;
a pair of source/drain patterns on the active pattern and a channel pattern therebetween, the channel pattern comprising semiconductor patterns which are stacked and are spaced apart from each other;
a gate electrode crossing the channel pattern, wherein the gate electrode extends in a second direction crossing the first direction; and
a gate spacer on a side surface of the gate electrode,
wherein the gate spacer located on the device isolation layer comprises an upper portion with a first thickness in the first direction and a lower portion with a second thickness in the first direction,
wherein the second thickness is larger than the first thickness,
wherein the lower portion of the gate spacer comprises a first insulating layer, a second insulating layer, and a third insulating layer which overlap each other in the first direction, the second insulating layer being between the first insulating layer and the third insulating layer,
wherein the upper portion of the gate spacer comprises the first insulating layer and the third insulating layer which overlap each other in the first direction, and
wherein the lower portion of the gate spacer is located at a level lower than an uppermost one of the semiconductor patterns.

2. The semiconductor device of claim 1, wherein the lower portion of the gate spacer is located at a level lower than a top surface of each of the pair of source/drain patterns.

3. The semiconductor device of claim 1,
wherein the lower portion of the gate spacer is adjacent to a lower portion of the gate electrode located on the device isolation layer, and
wherein the lower portion of the gate electrode is located at a level lower than the uppermost one of the semiconductor patterns.

4. The semiconductor device of claim 1,
wherein each of the first to third insulating layers comprises a silicon-containing insulating material, and
wherein the second insulating layer is omitted from the upper portion of the gate spacer.

5. The semiconductor device of claim 1, wherein a top surface of the second insulating layer is located at a level lower than the uppermost one of the semiconductor patterns.

6. The semiconductor device of claim 1, wherein the third insulating layer is extended to a region on a top surface of at least one of the pair of source/drain patterns.

7. The semiconductor device of claim 1,
wherein the device isolation layer comprises a recess, which is formed in an upper portion thereof and is adjacent to the gate spacer, and
wherein the third insulating layer covers the recess.

8. The semiconductor device of claim 1,
wherein the third insulating layer comprises a silicon nitride layer,
wherein a dielectric constant of each of the first and second insulating layers is lower than a dielectric constant of the third insulating layer, and
wherein a thickness of the first insulating layer is larger than a thickness of each of the second and third insulating layers.

9. The semiconductor device of claim 1, wherein the second thickness is 1-4 nm larger than the first thickness.

10. The semiconductor device of claim 1,
wherein the active pattern is an active pattern of an NMOSFET, and
wherein the NMOSFET comprises an MBCFET or GAAFET, in which the gate electrode is provided to surround each of the semiconductor patterns.

11. A semiconductor device, comprising:
a substrate including a PMOSFET region and an NMOSFET region, wherein each of the PMOSFET region and the NMOSFET region extends in a first direction;
a first source/drain pattern provided on the PMOSFET region and a first channel pattern connected to the first source/drain pattern;
a second source/drain pattern provided on the NMOSFET region and a second channel pattern connected to the second source/drain pattern, each of the first and second channel patterns comprising semiconductor patterns which are stacked and are spaced apart from each other;
a gate electrode crossing the first and second channel patterns, wherein the gate electrode extends in a second direction crossing the first direction; and
a gate spacer on a side surface of the gate electrode,
wherein the gate spacer comprises a first gate spacer on the PMOSFET region and a second gate spacer on the NMOSFET region,
wherein a thickness in the first direction of the first gate spacer on the first source/drain pattern is larger than a thickness in the first direction of the second gate spacer on the second source/drain pattern,
wherein a thickness in the first direction of the second gate spacer on a device insulation layer decreases in a vertical direction from a lower portion of the second gate spacer toward an upper portion of the second gate spacer,
wherein the lower portion of the gate spacer comprises a first insulating layer, a second insulating layer, and a third insulating layer which overlap each other in the first direction, the second insulating layer being between the first insulating layer and the third insulating layer, and
wherein the upper portion of the gate spacer comprises the first insulating layer and the third insulating layer which overlap each other in the first direction.

12. The semiconductor device of claim 11, wherein the lower portion of the second gate spacer is located at a level lower than an uppermost one of the semiconductor patterns of the second channel pattern.

13. The semiconductor device of claim 11,
wherein the first gate spacer on the first source/drain pattern comprises a low-k dielectric layer and a silicon nitride layer on the low-k dielectric layer, and
wherein the second gate spacer on the second source/drain pattern comprises a silicon nitride layer, from which the low-k dielectric layer is omitted.

14. The semiconductor device of claim 11,
wherein each of the first to third insulating layers comprises a silicon-containing insulating material, and wherein the second insulating layer is omitted from the upper portion of the second gate spacer.

15. The semiconductor device of claim 11, wherein a top surface of the second insulating layer is located at a level lower than an uppermost one of the semiconductor patterns of the second channel pattern.

16. A semiconductor device, comprising:
an active pattern on a substrate;
a device isolation layer provided on the substrate to define the active pattern;
a pair of source/drain patterns on the active pattern and a channel pattern therebetween, the channel pattern comprising semiconductor patterns which are stacked and are spaced apart from each other;
a gate electrode crossing the channel pattern; and
a gate spacer on a side surface of the gate electrode,
wherein the gate spacer located on the device isolation layer comprises an upper portion with a first thickness in a horizontal direction and a lower portion with a second thickness in the horizontal direction,
wherein the second thickness is larger than the first thickness,
wherein the lower portion of the gate spacer comprises a first insulating layer, a second insulating layer, a third insulating layer, and a fourth insulating layer which overlap each other in the horizontal direction,
wherein the upper portion of the gate spacer comprises the first insulating layer, the second insulating layer, and the fourth insulating layer which overlap each other in the horizontal direction,
wherein a first portion of a side surface of the fourth insulating layer contacts a side surface of the second insulating layer in the upper portion of the gate spacer,
wherein the third insulating layer is located between the second insulating layer and the fourth insulating layer in the horizontal direction in the lower portion of the gate spacer,
wherein a second portion of the side surface of the fourth insulating layer contacts a side surface of the third insulating layer in the lower portion of the gate spacer,
wherein uppermost surfaces of each of the first insulating layer, the second insulating layer, and the fourth insulating layer are coplanar with one another, and
wherein the lower portion of the gate spacer is located at a level lower than an uppermost one of the semiconductor patterns.

17. The semiconductor device of claim 16, wherein the lower portion of the gate spacer is located at a level lower than a top surface of each of the pair of source/drain patterns.

18. The semiconductor device of claim 16,
wherein the lower portion of the gate spacer is adjacent to a lower portion of the gate electrode located on the device isolation layer, and
wherein the lower portion of the gate electrode is located at a level lower than the uppermost one of the semiconductor patterns.

19. The semiconductor device of claim 16, wherein the fourth insulating layer is extended to a region on a top surface of at least one of the pair of source/drain patterns.

20. The semiconductor device of claim 16,
wherein the device isolation layer comprises a recess, which is formed in an upper portion thereof and is adjacent to the gate spacer, and
wherein the fourth insulating layer covers the recess.

\* \* \* \* \*